US010944214B2

(12) United States Patent
Gailus et al.

(10) Patent No.: US 10,944,214 B2
(45) Date of Patent: Mar. 9, 2021

(54) CABLE CONNECTOR FOR HIGH SPEED INTERCONNECTS

(71) Applicant: Amphenol Corporation, Wallingford, CT (US)

(72) Inventors: Mark W. Gailus, Concord, MA (US); Allan Astbury, Milford, NH (US); David Manter, Goffstown, NH (US); Marc B. Cartier, Jr., Dover, NH (US); Vysakh Sivarajan, Nashua, NH (US); John Robert Dunham, Windham, NH (US)

(73) Assignee: Amphenol Corporation, Wallingford, CT (US)

( * ) Notice: Subject to any disclaimer, the term of this patent is extended or adjusted under 35 U.S.C. 154(b) by 27 days.

(21) Appl. No.: 16/054,831

(22) Filed: Aug. 3, 2018

(65) Prior Publication Data
US 2019/0044285 A1    Feb. 7, 2019

Related U.S. Application Data

(60) Provisional application No. 62/541,017, filed on Aug. 3, 2017.

(51) Int. Cl.
*H01R 13/6471* (2011.01)
*H01R 12/72* (2011.01)
(Continued)

(52) U.S. Cl.
CPC ......... *H01R 13/6471* (2013.01); *H01R 4/023* (2013.01); *H01R 12/7082* (2013.01);
(Continued)

(58) Field of Classification Search
CPC ............ H01R 13/6471; H01R 13/6587; H01R 12/75; H01R 12/737; H01R 4/023; H01R 12/721
(Continued)

(56) References Cited

U.S. PATENT DOCUMENTS 4,397,516 A    8/1983   Koren et al.
5,190,473 A    3/1993   Mroczkowski et al.
(Continued)

FOREIGN PATENT DOCUMENTS

CN    1168547 A    12/1997
CN    2682599 Y    3/2005
(Continued)

OTHER PUBLICATIONS

Chinese Office Action for Chinese Application No. 201480017853.4 dated Feb. 4, 2017.
(Continued)

*Primary Examiner* — Abdullah A Riyami
*Assistant Examiner* — Marcus E Harcum
(74) *Attorney, Agent, or Firm* — Wolf, Greenfield & Sacks, P.C.

(57) ABSTRACT

A cable termination that provides low signal distortion even at high frequencies. Conductive elements of the cable are fused to edges of signal conductors in a cable connector or other component terminating the cable. For terminating a differential pair, the conductive elements of the cable may be terminated to opposing edges of a pair of signal conductors in the cable termination. The conductive elements may be shaped such that the spacing between signal paths passing through the conductive elements of the cable and into the signal conductors of the cable termination is uniform.

20 Claims, 30 Drawing Sheets

(51) Int. Cl.
*H01R 13/514* (2006.01)
*H01R 24/30* (2011.01)
*H01R 13/6477* (2011.01)
*H01R 4/02* (2006.01)
*H01R 12/70* (2011.01)
*H01R 12/71* (2011.01)
*H05K 1/02* (2006.01)
*H05K 3/32* (2006.01)
*H01R 13/6587* (2011.01)
*H01R 12/52* (2011.01)
*H01R 13/6474* (2011.01)

(52) U.S. Cl.
CPC ......... *H01R 12/716* (2013.01); *H01R 12/721* (2013.01); *H01R 12/728* (2013.01); *H01R 13/514* (2013.01); *H01R 13/6477* (2013.01); *H01R 24/30* (2013.01); *H05K 1/0245* (2013.01); *H05K 3/32* (2013.01); *H01R 12/52* (2013.01); *H01R 13/6474* (2013.01); *H01R 13/6587* (2013.01); *H05K 2201/1059* (2013.01); *H05K 2201/10189* (2013.01)

(58) Field of Classification Search
USPC .............. 439/607.41, 941, 624, 61, 65, 79
See application file for complete search history.

(56) References Cited

U.S. PATENT DOCUMENTS

| | | |
|---|---|---|
| 5,281,150 A | 1/1994 | Bundga et al. |
| 5,281,762 A | 1/1994 | Long et al. |
| 5,453,026 A | 9/1995 | Ikegami |
| 5,480,327 A | 1/1996 | Zola |
| 5,495,075 A | 2/1996 | Jonckheere et al. |
| 5,580,264 A | 12/1996 | Aoyama et al. |
| 5,961,348 A | 10/1999 | Murphy |
| 6,156,975 A | 12/2000 | Roose |
| 6,203,376 B1 | 3/2001 | Magajne et al. |
| 6,380,485 B1 | 4/2002 | Beaman et al. |
| 6,648,676 B1 | 11/2003 | Lee |
| 6,824,426 B1* | 11/2004 | Spink, Jr. ............... H01R 24/62 439/579 |
| 6,896,549 B2 | 5/2005 | Feuerreiter et al. |
| 6,896,556 B1 | 5/2005 | Wu |
| 7,025,634 B1 | 4/2006 | Swantner et al. |
| 7,331,830 B2 | 2/2008 | Minich |
| 7,354,274 B2 | 4/2008 | Minich |
| 7,510,439 B2 | 3/2009 | Gordon et al. |
| 7,906,730 B2 | 3/2011 | Atkinson et al. |
| 8,057,267 B2 | 11/2011 | Johnescu |
| 8,251,745 B2 | 8/2012 | Johnescu et al. |
| 8,253,021 B2 | 8/2012 | Adachi et al. |
| 8,449,330 B1* | 5/2013 | Schroll ............... H01R 13/6586 439/607.06 |
| 8,678,860 B2 | 3/2014 | Minich et al. |
| 8,696,378 B2 | 4/2014 | Behziz et al. |
| 8,772,636 B2 | 7/2014 | Yamaguchi et al. |
| 8,845,364 B2* | 9/2014 | Wanha ............... H01R 13/516 439/607.07 |
| 8,870,597 B2* | 10/2014 | Kawakami ......... H01R 13/6471 439/607.41 |
| D718,253 S | 11/2014 | Zerebilov et al. |
| D720,698 S | 1/2015 | Zerebilov et al. |
| 9,142,921 B2 | 9/2015 | Wanha et al. |
| D750,030 S | 2/2016 | Zerebilov et al. |
| 9,362,678 B2 | 6/2016 | Wanha et al. |
| 9,450,344 B2 | 9/2016 | Cartier, Jr. et al. |
| 9,509,101 B2 | 11/2016 | Cartier, Jr. et al. |
| 9,735,484 B2 | 8/2017 | Brubaker et al. |
| 9,735,495 B2 | 8/2017 | Gross |
| 9,741,465 B2 | 8/2017 | Gross et al. |
| D816,044 S | 4/2018 | Zerebilov et al. |
| 9,966,165 B2 | 5/2018 | Gross et al. |
| 10,109,937 B2 | 10/2018 | Zerebilov et al. |
| 2001/0031579 A1 | 10/2001 | Fujino et al. |
| 2002/0136519 A1 | 9/2002 | Tinucci et al. |
| 2003/0186580 A1 | 10/2003 | Dambach et al. |
| 2004/0002262 A1 | 1/2004 | Murayama et al. |
| 2004/0092164 A1* | 5/2004 | Lee .................... H01R 13/5845 439/606 |
| 2004/0127078 A1 | 7/2004 | Tondreault et al. |
| 2004/0185708 A1 | 9/2004 | Kuwahara |
| 2005/0153584 A1 | 7/2005 | Bartley et al. |
| 2007/0099486 A1* | 5/2007 | Kameyama ........ H01R 13/6477 439/498 |
| 2007/0287332 A1 | 12/2007 | Gordon et al. |
| 2009/0188716 A1 | 7/2009 | Nagase |
| 2011/0059643 A1 | 3/2011 | Kuwahara et al. |
| 2012/0064762 A1* | 3/2012 | Muroi ..................... H01R 9/038 439/578 |
| 2012/0064779 A1 | 3/2012 | Wu |
| 2013/0017712 A1* | 1/2013 | Liu ..................... H01R 12/675 439/391 |
| 2013/0034977 A1 | 2/2013 | Cina et al. |
| 2013/0130547 A1 | 5/2013 | Simpson et al. |
| 2013/0149899 A1 | 6/2013 | Schroll et al. |
| 2013/0188325 A1 | 7/2013 | Garman et al. |
| 2013/0270000 A1 | 10/2013 | Buck et al. |
| 2013/0273781 A1 | 10/2013 | Buck et al. |
| 2014/0017944 A1 | 1/2014 | Wu et al. |
| 2014/0030905 A1 | 1/2014 | Phillips et al. |
| 2014/0154927 A1 | 6/2014 | Nonen et al. |
| 2014/0182885 A1 | 7/2014 | Gross et al. |
| 2014/0182890 A1 | 7/2014 | Gross et al. |
| 2014/0206230 A1 | 7/2014 | Rost et al. |
| 2015/0200496 A1* | 7/2015 | Simpson ............ H01R 13/5841 439/607.08 |
| 2015/0214666 A1* | 7/2015 | Schumacher ...... H01R 13/6477 439/676 |
| 2016/0018606 A1 | 1/2016 | Xue et al. |
| 2016/0049746 A1 | 2/2016 | Gross |
| 2016/0056553 A1 | 2/2016 | Brubaker et al. |
| 2016/0104948 A1 | 4/2016 | Droesbeke et al. |
| 2016/0118745 A1 | 4/2016 | Droesbeke et al. |
| 2016/0268739 A1 | 9/2016 | Zerebilov et al. |
| 2017/0047692 A1 | 2/2017 | Cartier, Jr. et al. |
| 2017/0302030 A1* | 10/2017 | Chiang .................. H01R 24/62 |
| 2019/0337472 A1* | 11/2019 | Nakai ................. B60R 16/0207 |

FOREIGN PATENT DOCUMENTS

| | | |
|---|---|---|
| CN | 101395768 | 3/2009 |
| CN | 101841107 A | 9/2010 |
| CN | 201781115 U | 3/2011 |
| CN | 103178408 A | 6/2013 |
| EP | 0 997 756 A2 | 5/2000 |
| EP | 2 169 770 A2 | 3/2010 |
| JP | 2003-109708 A | 4/2003 |
| JP | 2004-031257 A | 1/2004 |
| JP | 2004-071404 A | 3/2004 |
| JP | 2006-260850 A | 9/2006 |
| JP | 2010-153191 A | 7/2010 |
| JP | 2010-211937 A | 9/2010 |
| JP | 2013-021600 A | 1/2013 |
| JP | 2014-229597 A | 12/2014 |
| TW | M441942 U1 | 11/2012 |
| TW | 201334318 A | 8/2013 |
| WO | WO 2011/073259 A1 | 6/2011 |

OTHER PUBLICATIONS

Extended European Search for European Application No. 14773438.8 dated Oct. 12, 2016.
Extended European Search Report for European Application No. 14855318.3 dated Apr. 21, 2017.
International Search Report and Written Opinion for International Application No. PCT/US2014/061681 dated Jan. 27, 2015.
International Preliminary Report on Patentability for International Application No. PCT/US2014/061681 dated May 6, 2016.

(56) References Cited

OTHER PUBLICATIONS

International Search Report and Written Opinion for International Application No. PCT/US2016/065271 dated Mar. 24, 2017.
International Preliminary Report on Patentability for International Application No. PCT/US2016/065271 dated Jun. 21, 2018.
International Search Report and Written Opinion for International Application No. PCT/US2014/031448 dated Jul. 10, 2014.
International Preliminary Report on Patentability for International Application No. PCT/US2014/031448 dated Oct. 8, 2015.
International Search Report and Written Opinion for International Application No. PCT/US2018/045201 dated Nov. 26, 2018.
Chinese Office Action for Chinese Application No. 201880064335.6, dated Oct. 20, 2020.
CN 201880064335.6, dated Oct. 20, 2020, Chinese Office Action.

\* cited by examiner

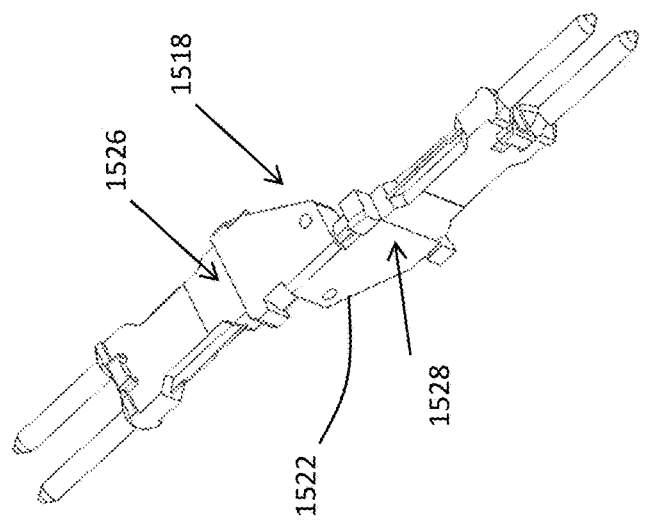
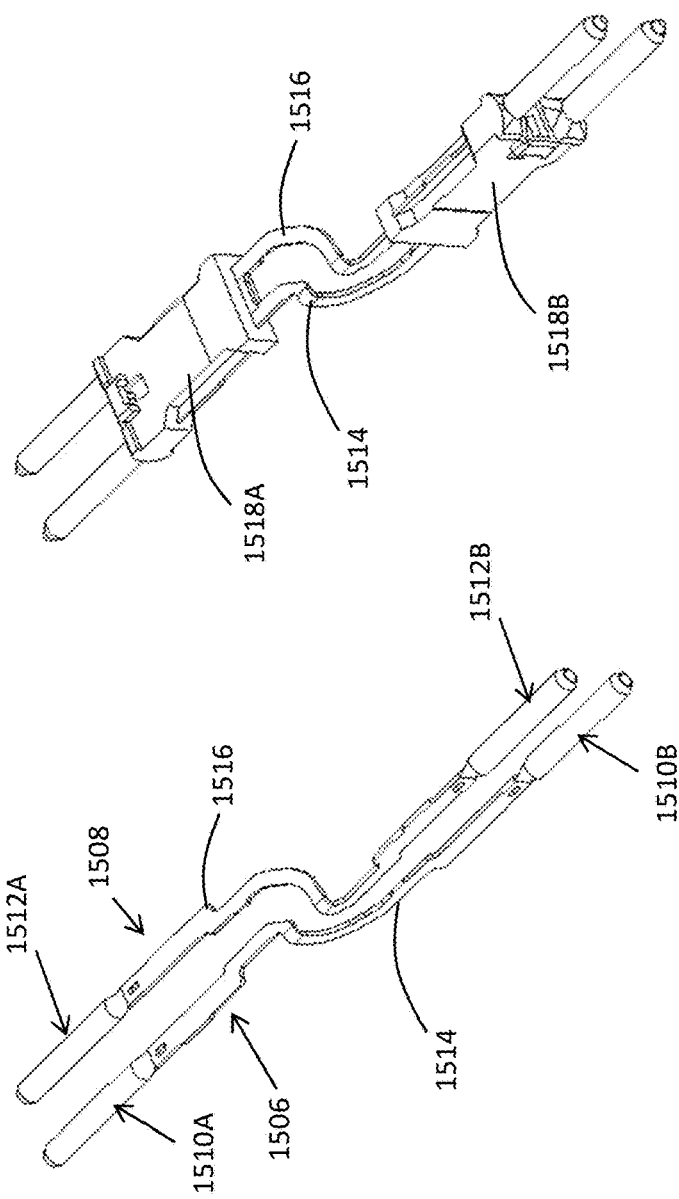
FIG. 12C
FIG. 12B
FIG. 12A

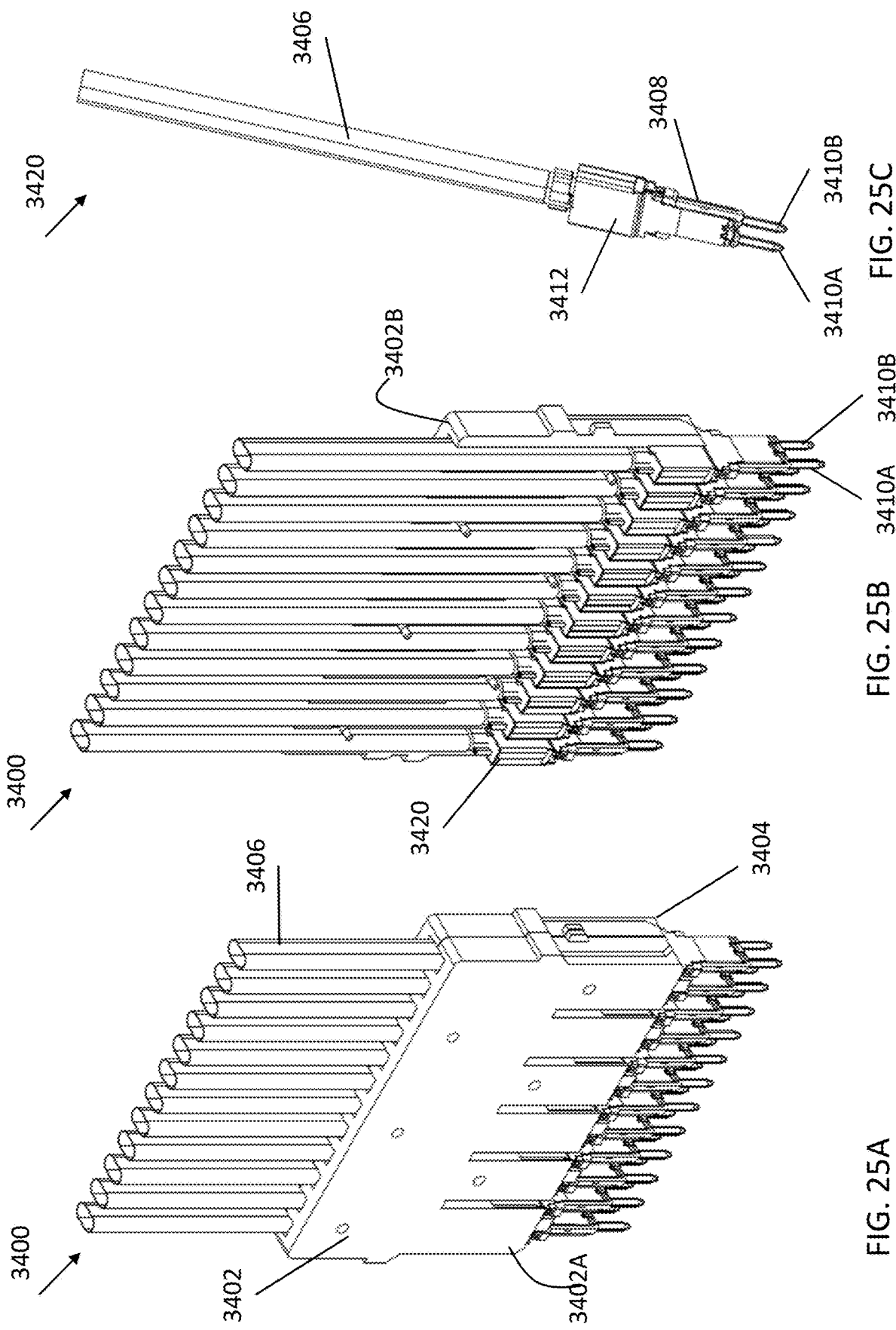

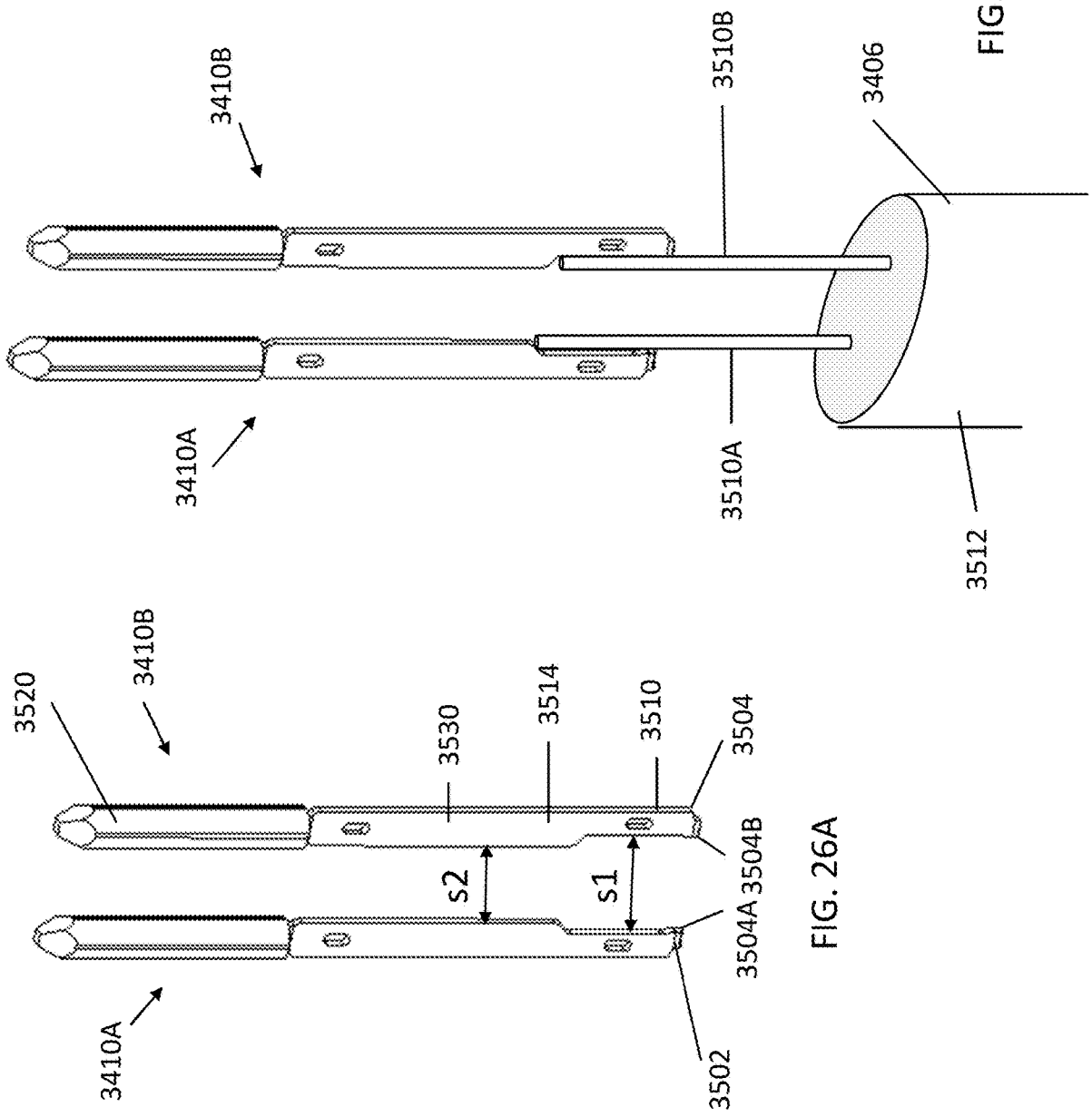

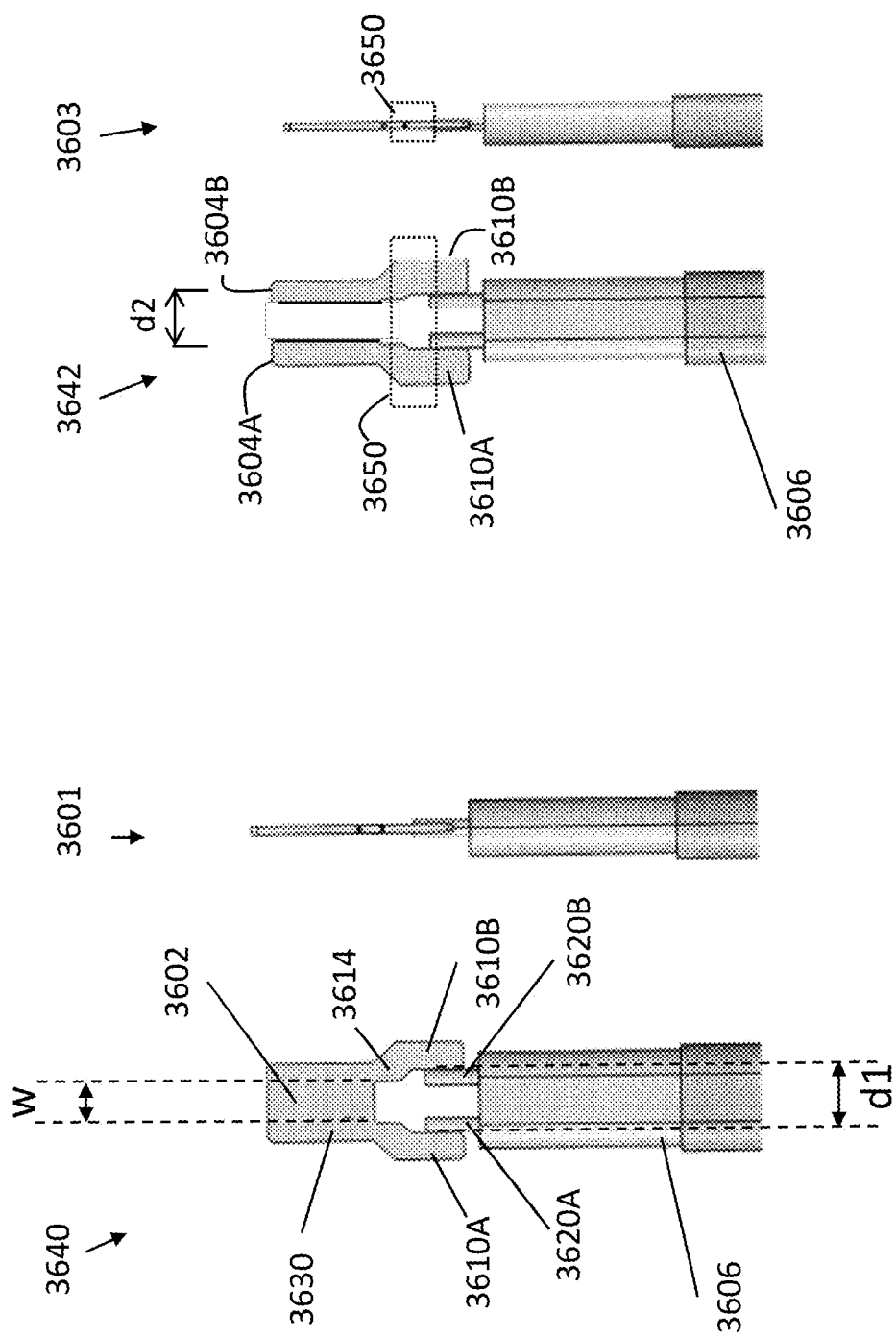

CABLE CONNECTOR FOR HIGH SPEED INTERCONNECTS

CROSS REFERENCE TO RELATED APPLICATIONS

This application claims priority to and the benefit of U.S. Provisional Patent Application Ser. No. 62/541,017, filed on Aug. 3, 2017 and entitled "CONNECTOR FOR LOW LOSS ORTHOGONAL INTERCONNECTION SYSTEM," which is hereby incorporated herein by reference in its entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards ("PCBs"), which may be joined together with electrical connectors. A known arrangement for joining several printed circuit boards is to have one printed circuit board serve as a backplane. Other printed circuit boards, called "daughterboards" or "daughtercards," may be connected through the backplane.

A backplane is a printed circuit board onto which many connectors may be mounted. Conducting traces in the backplane may be electrically connected to signal conductors in the connectors so that signals may be routed between the connectors. Daughtercards may also have connectors mounted thereon. The daughtercard connectors may be plugged into the connectors mounted on the backplane. In this way, signals may be routed among the daughtercards through the backplane. The daughtercards may plug into the backplane at a right angle. The connectors used for these applications may therefore include a right angle bend and are often called "right angle connectors."

Connectors may also be used in other configurations for interconnecting printed circuit boards. Some systems use a midplane configuration. Similar to a backplane, a midplane has connectors mounted on one surface that are interconnected by conductive traces within the midplane. The midplane additionally has connectors mounted on a second side so that daughtercards are inserted into both sides of the midplane.

The daughtercards inserted from opposite sides of the midplane often have orthogonal orientations. This orientation positions one edge of each printed circuit board adjacent the edge of every board inserted into the opposite side of the midplane. The traces within the midplane connecting the boards on one side of the miplane to boards on the other side of the midplane can be short, leading to desirable signal integrity properties.

A variation on the midplane configuration is called "direct attach." In this configuration, daughtercards are inserted from opposite sides of a rack enclosing printed circuit boards of a system. These boards likewise are oriented orthogonally so that the edge of a board inserted from one side of the rack is adjacent to the edges of the boards inserted from the opposite side of the system. These daughtercards also have connectors. However, rather than plugging into connectors on a midplane, the connectors on each daughtercard plug directly into connectors on printed circuit boards inserted from the opposite side of the system.

Connectors for this configuration are sometimes called orthogonal connectors. Examples of orthogonal connectors are shown in U.S. Pat. Nos. 7,354,274, 7,331,830, 8,678,860, 8,057,267 and 8,251,745.

Other connector configurations are also known. For example, a RAM connector is sometimes included in a connector product family in which a daughtercard connector has a mating interface with receptacles. The RAM connector might have conductive elements that bend through a right angel as in a daughtercard connector. However, unlike a conventional daughtercard connector, a RAM may have a mating interface with mating contact elements that are complementary to and mate with receptacles. For example, a RAM might have mating interface with pins or blades or other mating contacts that might be used in a backplane connector. A RAM connector might be mounted near an edge of a daughtercard and receive a daughtercard connector mounted to another daughtercard. Alternatively, a cable connector might be plugged into the RAM connector.

SUMMARY

Aspects of the present disclosure related to a low loss interconnection system.

In another aspect, some embodiments may relate to a cable assembly having a cable and a cable termination component. The cable may include two conductive elements. The cable termination component may include a pair of signal conductors having contact tails. The contact tails may have broadsides and edges joining the broadsides. The signal conductors may be held with the contact tails in an edge-to-edge configuration with a first edge of a first signal conductor of the pair facing a second edge of a second signal conductor of the pair. The two conductive elements of the cable may be each attached to a respective edge of the first and second edges.

In some embodiments, a method of manufacturing a cable assembly is provided. The method may include stamping a conductive piece into a structure. The structure may include first and second signal conductors and a tie bar. The first and second signal conductors may be joined by the tie bar. Each of the first and second signal conductors may include contact tails having broadsides and edges joining the broadsides. Subsequent to stamping the conductive piece into the structure, the two conductive elements of a cable may be fused to opposing edges of the first and second signal conductors of the structure respectively. The method may further include severing the tie bar. In some embodiments, the method may also include molding a housing over the structure.

Some embodiments may relate to a method of manufacturing a cable assembly comprising first and second signal conductors. Each of the first and second signal conductors may include a contact tail having broadsides and edges joining the broadsides. The method may comprise attaching the two conductive elements of the cable to edges of the first and second signal conductors, respectively. The method may further comprise shaping portions of the two conductive elements of the cable so as to reduce impedance discontinuities at the cable attachment.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 12A is an isometric view of a portion of the extender module of FIGS. 11;

FIG. 12B is an isometric view of a portion of the extender module of FIG. 11;

FIG. 12C is an isometric view of a portion of the extender module of FIG. 11;

FIG. 25A is an isometric view of a cable assembly, according to some embodiments;

FIG. 25B is an isometric view, partially cutaway, of the cable assembly in FIG. 25A;

FIG. 25C is an isometric view of a cable assembly module, which can be used to form the cable assembly in FIG. 25A, according to some embodiments;

FIG. 26A is an isometric view of a pair of signal conductors, according to some embodiments;

FIG. 26B is an isometric view of a cable attached to the pair of signal conductors of FIG. 26A, according to some embodiments;

FIG. 27A is a plan view of a mounting interface between a pair of signal conductors and a cable, according to some embodiments;

FIG. 27B is an elevation view of the mounting interface between the pair of signal conductors and the cable of FIG. 27A;

FIG. 27C is a plan view of a mounting interface between a pair of signal conductors and a cable, according to some embodiments; and FIG. 27D is an elevation view of the mounting interface between the pair of signal conductors and the cable of FIG. 27C.

DETAILED DESCRIPTION

Figure 1:
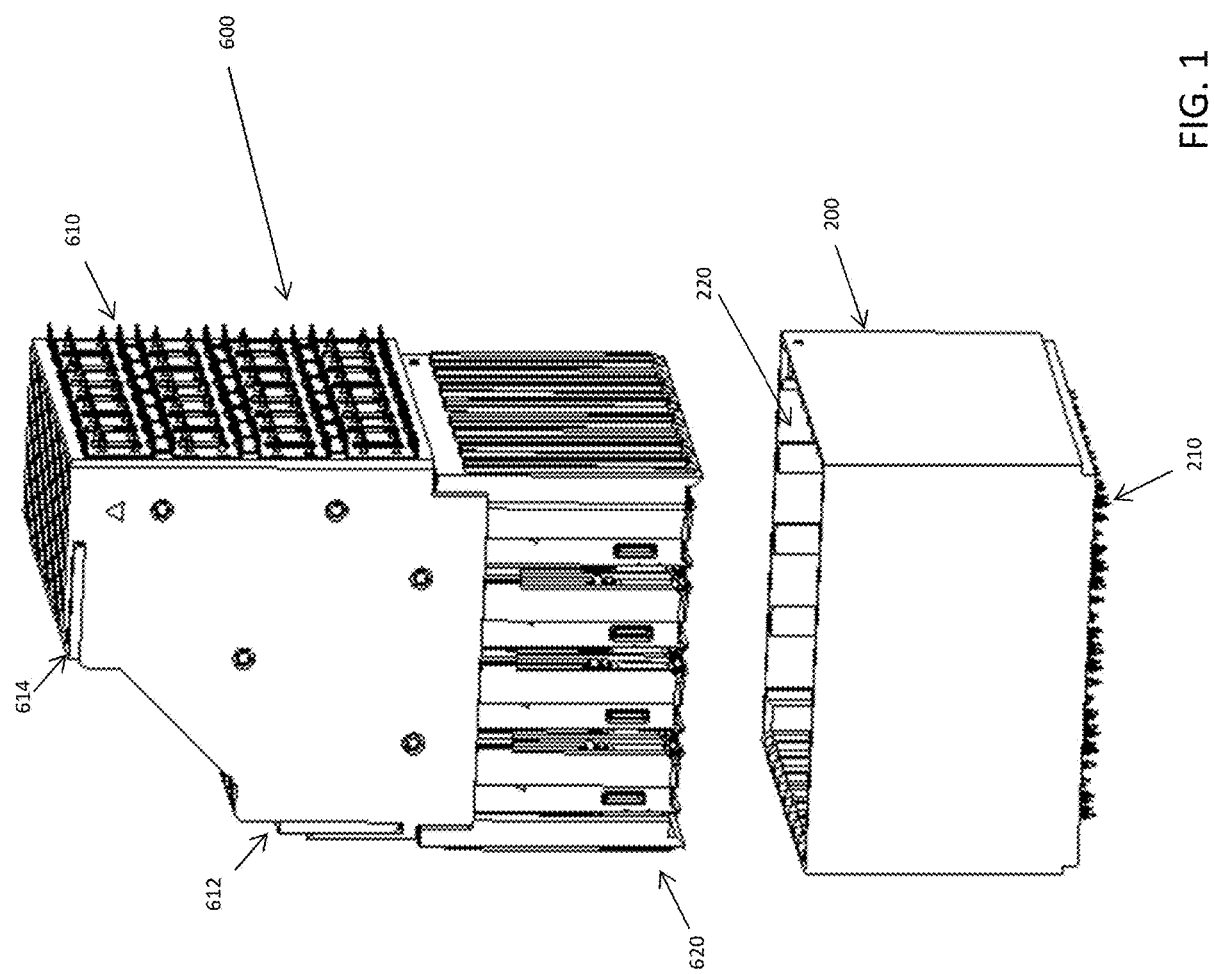
FIG. 1 is an isometric view of an illustrative electrical interconnection system, configured as a right angle backplane connector, in accordance with some embodiments.

The inventors have recognized and appreciated that a low loss interconnection system may be constructed through integrating disparate types of connector units in a connector. For example, traces routed through a printed circuit board may generally be low loss for relatively short distances. One type of connector unit may therefore be configured for attaching to traces in the printed circuit board at the footprint where the connector is mounted to the board. For routing signals to components on a printed circuit board that are separated from the connector by a longer distances, the loss of routing a signal through a trace on the printed circuited may be undesirably large. A second type of connector unit, configured to attach to a cable, may be used to couple to signals to be routed over a longer distance. The cable may then route the signal to a location near the component, providing a lower loss connection than conventional designs in which all connections to components on the printed circuit board are made through traces within the board.

Moreover, the inventors have recognized and appreciated techniques for attaching cables to conductive elements in the second type of connector unit. In some embodiments, the cables may be attached at opposed edges of conductive elements configured to carry a differential pair signal. Such a configuration may orient signal conductors in the cable in the same plane as the mating contact portions of the conductive elements. The edges may be configured such that the conductors of the cables are aligned with the mating contact portions of the conductive elements. With such an arrangement, changes of geometry at the cable attachment interface, which might otherwise cause changes of impedance that could impact signal integrity, may be reduced. Alternatively or additionally, such an attachment interface may reduce the amount of metal at the attachment interface, reducing the change of inductance relative to a convention design in which a cable is soldered on a broadside of a signal conductor, which also reduces changes of impedance.

Further, the inventors have recognized and appreciated connector designs to ease the density of the routing breakouts at a connector footprint on a printed circuit board. In particular, the inventors have recognized and appreciated that the footprints of high density connectors result in increased density of routing breakouts at the board level, a problem which could be exacerbated by the increased circuit density on the boards. The inventors have also recognized and appreciated that retention forces between connectors and boards may need be enhanced by, for example, hold-down screws, which consume extra real estates on the boards.

In some embodiments, a connector may be manufactured with multiple types of connector units held by one or more support members. For example, a connector may include first type connector units and second type connector units. Each connector unit may include at least one column of signal conductors. Each signal conductor may include a contact tail, a mating contact portion, and an intermediate portion that extends between the contact tail and the mating contact portion. The contact tails of the signal conductors of the first type connector units may be configured for attachment to a circuit board while the contact tails of the signal conductors of the second type connector units may be configured for attachment to a cable. In some embodiments, the connector may further include a plurality of cables. Each cable may include one or more wires. Each wire may be attached to a contact tail of a signal conductor of a module of the second type units.

In some embodiments, the connector units may be sub-assemblies formed from a plurality of modules. The plurality of modules may be held in a housing and aligned in a column. In some embodiments, each module may include a pair of signal conductors. At a mating interface, the pair of signal conductors in each module may be separated in a direction perpendicular to the column.

In some embodiments, each of the pair of signal conductors of a second type connector unit may include broadsides and edges joining the broadsides. The pair of signal conductors may be formed by stamping a metal piece, with one or more tie bars connecting two opposing edges of the pair such that the separation between the pair is controlled by the size of the tie bar. The size of the tie bar may be selected based on the size of a wire in a cable to be attached, e.g., AWG 28, AWG 30, etc. The tie bar may set a spacing between opposing edges of the contact tails of the signal conductors such that, when the wire is attached to each edge, the separation between the wires yields a desired impedance, such as an impedance matching that of the cable or other parts of the interconnect.

Either before or after the wires are attached to the signal conductors, a housing may be molded around the pair of signal conductors such that the contact tails of the pair of signal conductors may be held in the housing in an edge-to-edge configuration. The tie bar then may be severed in order to isolate the pair of signal conductors. The inventors have recognized and appreciated that, compared with the conventional method of terminating cable wires on surfaces thus forming big bumps, attaching the cable wires to the edges would allow precisely controlling the spacing between cable wires and reduce impedance mismatch. Impedance control may also be provided by an attachment that has a small impact on inductance at the conductor to wire interface.

In some embodiments, the first type connector units may have signal conductors with right-angled intermediate portions. The first type connector units may be in a direct attach, orthogonal, RAM or other desired configuration. In some embodiments, a connector may have given a desired configuration at the mating interface through attaching extender modules to its mating contact portions. Each extender module may include a signal conducting pair with surrounding shielding. To form an orthogonal connector, the orientation of the signal pair at one end of the extender module may be orthogonal to the orientation at the other end of the module. Both ends of the signal conductors of the pair may be terminated with mating contact portions that are adapted to mate with mating contact portions of another connector. The extender modules may be held in place by a shell or other suitable retention structure mechanically coupled to the connector units.

In some embodiments, each first type connector unit may include two columns of signal conductors. Mating contact portions of two adjacent signal conductors in a same column may define a pair, which is complementary to a signal conducting pair of an extender module. Thus, attaching extender modules to a first type connector unit would result in a mating interface with the orientation of the signal conducting pairs being orthogonal to the orientation of the pairs of the mating contact portions of the first type connector unit.

In some embodiments, mating contact portions of first type connector units may form a first array and mating contact portions of second type units may form a second array. In some embodiments, the first and second arrays may collectively form a mating interface of a connector. In other embodiments, mating contact portions of first type connector units may mate with mating contact portions of extender modules. Mating contact portions at the end of the extender modules opposite the end attached to the first type connector units may form a third array. In this embodiment, the second and third array collectively may form a mating interface of a connector.

The foregoing principles are illustrated with an example, such as the interconnection system shown in FIG. 1. FIG. 1 illustrates an electrical interconnection system of the form that may be used in an electronic system. In this example, the electrical interconnection system includes a right angle connector and may be used, for example, in electrically connecting a daughtercard to a backplane. These figures illustrate two mating connectors. In this example, connector 200 is designed to be attached to a backplane and connector 600 is designed to attach to a daughtercard.

A modular connector, as shown in FIG. 1, may be constructed using any suitable techniques. Additionally, as described herein, the modules used to form connector 600 may be used, in combination with extender modules, to form an orthogonal connector. Such an orthogonal connector may mate with a daughtercard connector, such as connector 600.

As can be seen in FIG. 1, daughtercard connector 600 includes contact tails 610 designed to attach to a daughtercard (not shown). Backplane connector 200 includes contact tails 210, designed to attach to a backplane (not shown). These contact tails form one end of conductive elements that pass through the interconnection system. When the connectors are mounted to printed circuit boards, these contact tails will make electrical connection to conductive structures within the printed circuit board that carry signals or are connected to a reference potential. In the example illustrated the contact tails are press fit, "eye of the needle," contacts that are designed to be pressed into vias in a printed circuit board. However, other forms of contact tails may be used.

Each of the connectors also has a mating interface where that connector can mate—or be separated from—the other connector. Daughtercard connector 600 includes a mating interface 620. Backplane connector 200 includes a mating interface 220. Though not fully visible in the view shown in FIG. 1, mating contact portions of the conductive elements are exposed at the mating interface.

Each of these conductive elements includes an intermediate portion that connects a contact tail to a mating contact portion. The intermediate portions may be held within a connector housing, at least a portion of which may be dielectric so as to provide electrical isolation between conductive elements. Additionally, the connector housings may include conductive or lossy portions, which in some embodiments may provide conductive or partially conductive paths between some of the conductive elements. In some embodiments, the conductive portions may provide shielding. The lossy portions may also provide shielding in some instances and/or may provide desirable electrical properties within the connectors.

In various embodiments, dielectric members may be molded or over-molded from a dielectric material such as plastic or nylon. Examples of suitable materials include, but are not limited to, liquid crystal polymer (LCP), polyphenyline sulfide (PPS), high temperature nylon or polyphenylenoxide (PPO) or polypropylene (PP). Other suitable materials may be employed, as aspects of the present disclosure are not limited in this regard.

All of the above-described materials are suitable for use as binder material in manufacturing connectors. In accordance some embodiments, one or more fillers may be included in some or all of the binder material. As a non-limiting example, thermoplastic PPS filled to 30% by volume with glass fiber may be used to form the entire connector housing or dielectric portions of the housings.

Alternatively or additionally, portions of the housings may be formed of conductive materials, such as machined metal or pressed metal powder. In some embodiments, portions of the housing may be formed of metal or other conductive material with dielectric members spacing signal conductors from the conductive portions. In the embodiment illustrated, for example, a housing of backplane connector 200 may have regions formed of a conductive material with insulative members separating the intermediate portions of signal conductors from the conductive portions of the housing.

The housing of daughtercard connector 600 may also be formed in any suitable way. In the embodiment illustrated, daughtercard connector 600 may be formed from multiple units, which may be subassemblies, which may include one or more "wafers" and, in some embodiments, one or more extender modules, and one or more support members to hold the components together. Each of the wafers (700, FIG. 5) may include a housing portion, which may similarly include dielectric, lossy and/or conductive portions. One or more members may hold the wafers in a desired position. For example, support members 612 and 614 may hold top and rear portions, respectively, of multiple wafers in a side-by-side configuration. Support members 612 and 614 may be formed of any suitable material, such as a sheet of metal stamped with tabs, openings or other features that engage corresponding features on the individual wafers.

Other members that may form a portion of the connector housing may provide mechanical integrity for daughtercard connector 600 and/or hold the wafers in a desired position. For example, a front housing portion 640 (FIG. 4) may receive portions of the wafers forming the mating interface. Any or all of these portions of the connector housing may be dielectric, lossy and/or conductive, to achieve desired electrical properties for the interconnection system.

In some embodiments, each wafer may hold a column of conductive elements forming signal conductors. These signal conductors may be shaped and spaced to form single ended signal conductors. However, in the embodiment illustrated in FIG. 1, the signal conductors are shaped and spaced in pairs to provide differential signal conductors. Each of the columns may include or be bounded by conductive elements serving as ground conductors. It should be appreciated that ground conductors need not be connected to earth ground, but are shaped to carry reference potentials, which may include earth ground, DC voltages or other suitable reference potentials. The "ground" or "reference" conductors may have a shape different than the signal conductors, which are configured to provide suitable signal transmission properties for high frequency signals.

Conductive elements may be made of metal or any other material that is conductive and provides suitable mechanical properties for conductive elements in an electrical connector. Phosphor-bronze, beryllium copper and other copper alloys are non-limiting examples of materials that may be used. The conductive elements may be formed from such materials in any suitable way, including by stamping and/or forming.

The spacing between adjacent columns of conductors may be within a range that provides a desirable density and desirable signal integrity. As a non-limiting example, the conductors may be stamped from 0.4 mm thick copper alloy, and the conductors within each column may be spaced apart by 2.25 mm and the columns of conductors may be spaced apart by 2.4 mm. However, a higher density may be achieved by placing the conductors closer together. In other embodiments, for example, smaller dimensions may be used to provide higher density, such as a thickness between 0.2 and 0.4 mm or spacing of 0.7 to 1.85 mm between columns or between conductors within a column. Moreover, each column may include four pairs of signal conductors, such that a density of 60 or more pairs per linear inch is achieved for the interconnection system illustrated in FIG. 1. However, it should be appreciated that more pairs per column, tighter spacing between pairs within the column and/or smaller distances between columns may be used to achieve a higher density connector.

The wafers may be formed in any suitable way. In some embodiments, the wafers may be formed by stamping columns of conductive elements from a sheet of metal and over molding dielectric portions on the intermediate portions of the conductive elements. In other embodiments, wafers may be assembled from modules each of which includes a single, single-ended signal conductor, a single pair of differential signal conductors or any suitable number of single ended or differential pairs.

The inventors have recognized and appreciated that assembling wafers from modules may aid in reducing "skew" in signal pairs at higher frequencies, such as between about 25 GHz and 40 GHz, or higher. Skew, in this context, refers to the difference in electrical propagation time between signals of a pair that operates as a differential signal. Modular construction that reduces skew is designed described, for example in U.S. Pat. Nos. 9,509,101 and 9,450,344, which are incorporated herein by reference.

In accordance with techniques described in those patents incorporated by reference, in some embodiments, connectors may be formed of modules, each carrying a signal pair. The modules may be individually shielded, such as by attaching shield members to the modules and/or inserting the modules into an organizer or other structure that may provide electrical shielding between pairs and/or ground structures around the conductive elements carrying signals.

In some embodiments, signal conductor pairs within each module may be broadside coupled over substantial portions of their lengths. Broadside coupling enables the signal conductors in a pair to have the same physical length. To facilitate routing of signal traces within the connector footprint of a printed circuit board to which a connector is attached and/or constructing of mating interfaces of the connectors, the signal conductors may be aligned with edge to edge coupling in one or both of these regions. As a result, the signal conductors may include transition regions in which coupling changes from edge-to-edge to broadside or vice versa. As described below, these transition regions may be designed to prevent mode conversion or suppress undesired propagation modes that can interfere with signal integrity of the interconnection system.

The modules may be assembled into wafers or other connector structures. In some embodiments, a different module may be formed for each row position at which a pair is to be assembled into a right angle connector. These modules may be made to be used together to build up a connector with as many rows as desired. For example, a module of one shape may be formed for a pair to be positioned at the shortest rows of the connector, sometimes called the a-b rows. A separate module may be formed for conductive elements in the next longest rows, sometimes called the c-d rows. The inner portion of the module with the c-d rows may be designed to conform to the outer portion of the module with the a-b rows.

Figure 6:
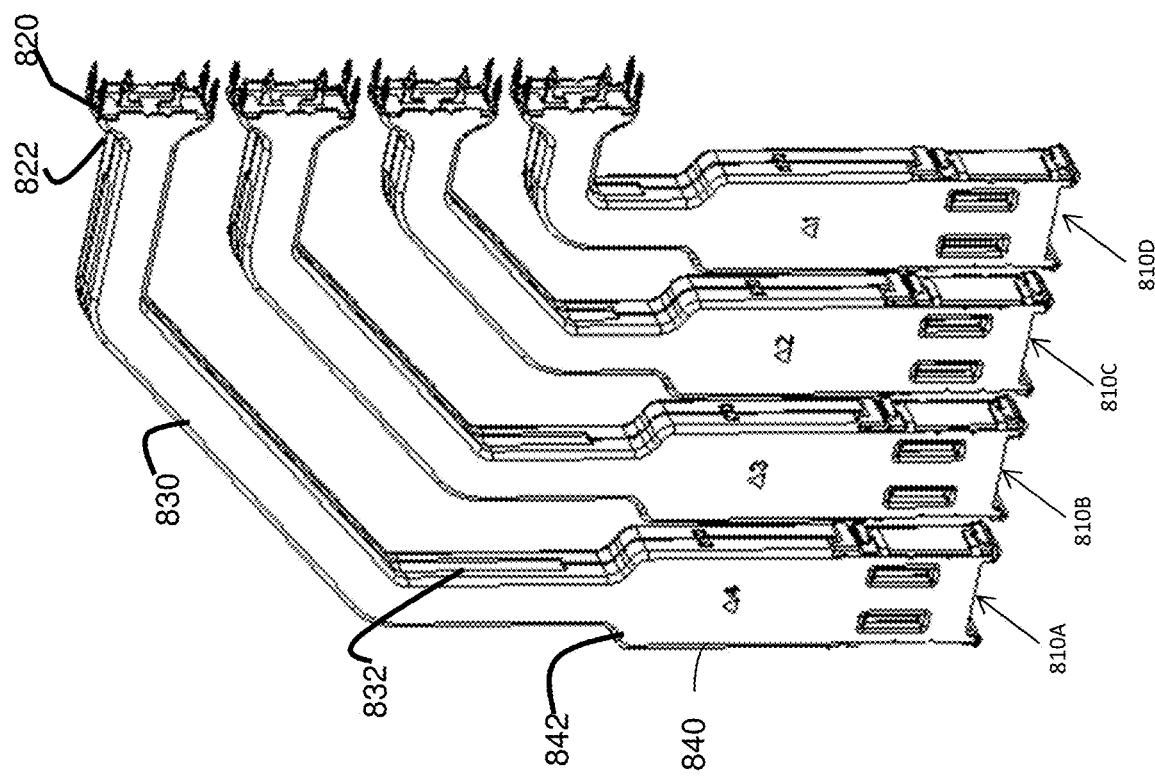
FIG. 6 is an isometric view of wafer modules of the wafer assembly of FIG. 5.

This pattern may be repeated for any number of pairs. Each module may be shaped to be used with modules that carry pairs for shorter and/or longer rows. To make a connector of any suitable size, a connector manufacturer may assemble into a wafer a number of modules to provide a desired number of pairs in the wafer. In this way, a connector manufacturer may introduce a connector family for a widely used connector size—such as 2 pairs. As customer requirements change, the connector manufacturer may procure tools for each additional pair, or, for modules that contain multiple pairs, group of pairs to produce connectors of larger sizes. The tooling used to produce modules for smaller connectors can be used to produce modules for the shorter rows even of the larger connectors. Such a modular connector is illustrated in FIG. 6.

Figure 2:
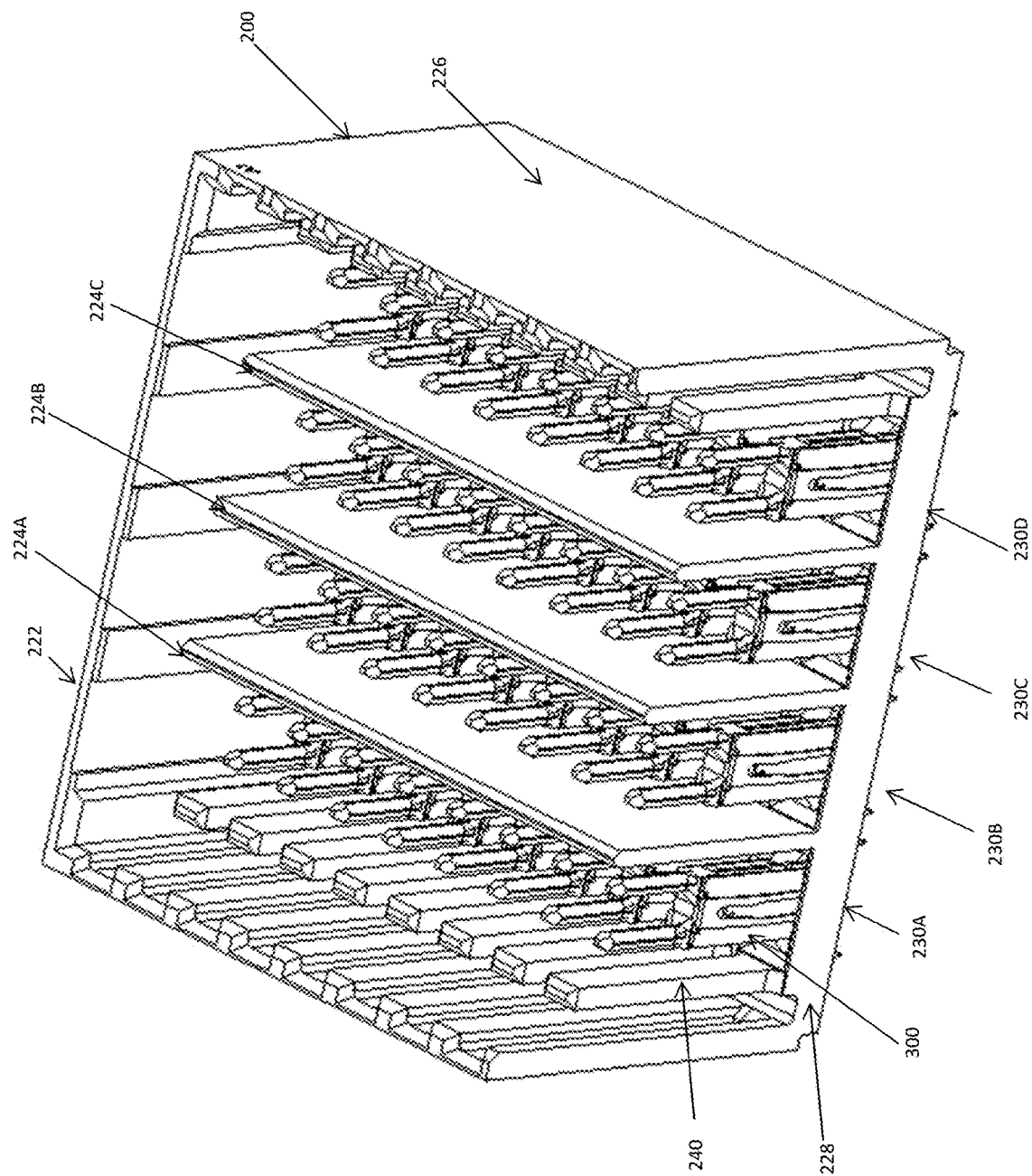
FIG. 2 is an isometric view, partially cutaway, of the backplane connector of FIG. 1.

Further details of the construction of the interconnection system of FIG. 1 are provided in FIG. 2, which shows backplane connector 200 partially cutaway. In the embodiment illustrated in FIG. 2, a forward wall of housing 222 is cut away to reveal the interior portions of mating interface 220.

In the embodiment illustrated, backplane connector 200 also has a modular construction. Multiple pin modules 300 are organized to form an array of conductive elements. Each of the pin modules 300 may be designed to mate with a module of daughtercard connector 600.

In the embodiment illustrated, four rows and eight columns of pin modules 300 are shown. With each pin module having two signal conductors, the four rows 230A, 230B, 230C and 230D of pin modules create columns with four pairs or eight signal conductors, in total. It should be appreciated, however, that the number of signal conductors per row or column is not a limitation of the application. A greater or lesser number of rows of pin modules may be include within housing 222. Likewise, a greater or lesser number of columns may be included within housing 222.

Alternatively or additionally, housing 222 may be regarded as a module of a backplane connector, and multiple such modules may be aligned side to side to extend the length of a backplane connector.

In the embodiment illustrated in FIG. 2, each of the pin modules 300 contains conductive elements serving as signal conductors. Those signal conductors are held within insulative members, which may serve as a portion of the housing of backplane connector 200. The insulative portions of the pin modules 300 may be positioned to separate the signal conductors from other portions of housing 222. In this configuration, other portions of housing 222 may be conductive or partially conductive, such as may result from the use of lossy materials.

In some embodiments, housing 222 may contain both conductive and lossy portions. For example, a shroud including walls 226 and a floor 228 may be pressed from a powdered metal or formed from conductive material in any other suitable way. Pin modules 300 may be inserted into openings within floor 228.

Lossy or conductive members may be positioned adjacent rows 230A, 230B, 230C and 230D of pin modules 300. In the embodiment of FIG. 2, separators 224A, 224B and 224C are shown between adjacent rows of pin modules. Separators 224A, 224B and 224C may be conductive or lossy, and may be formed as part of the same operation or from the same member that forms walls 226 and floor 228. Alternatively, separators 224A, 224B and 224C may be inserted separately into housing 222 after walls 226 and floor 228 are formed. In embodiments in which separators 224A, 224B and 224C formed separately from walls 226 and floor 228 and subsequently inserted into housing 222, separators 224A, 224B and 224C may be formed of a different material than walls 226 and/or floor 228. For example, in some embodiments, walls 226 and floor 228 may be conductive while separators 224A, 224B and 224C may be lossy or partially lossy and partially conductive.

In some embodiments, other lossy or conductive members may extend into mating interface 220, perpendicular to floor 228. Members 240 are shown adjacent to end-most rows 230A and 230D. In contrast to separators 224A, 224B and 224C, which extend across the mating interface 220, separator members 240, approximately the same width as one column, are positioned in rows adjacent row 230A and row 230D. Daughtercard connector 600 may include, in its mating interface 620, slots to receive separators 224A, 224B and 224C. Daughtercard connector 600 may include openings that similarly receive members 240. Members 240 may have a similar electrical effect to separators 224A, 224B and 224C, in that both may suppress resonances, crosstalk or other undesired electrical effects. Members 240, because they fit into smaller openings within daughtercard connector 600 than separators 224A, 224B and 224C, may enable greater mechanical integrity of housing portions of daughtercard connector 600 at the sides where members 240 are received.

Figure 3:
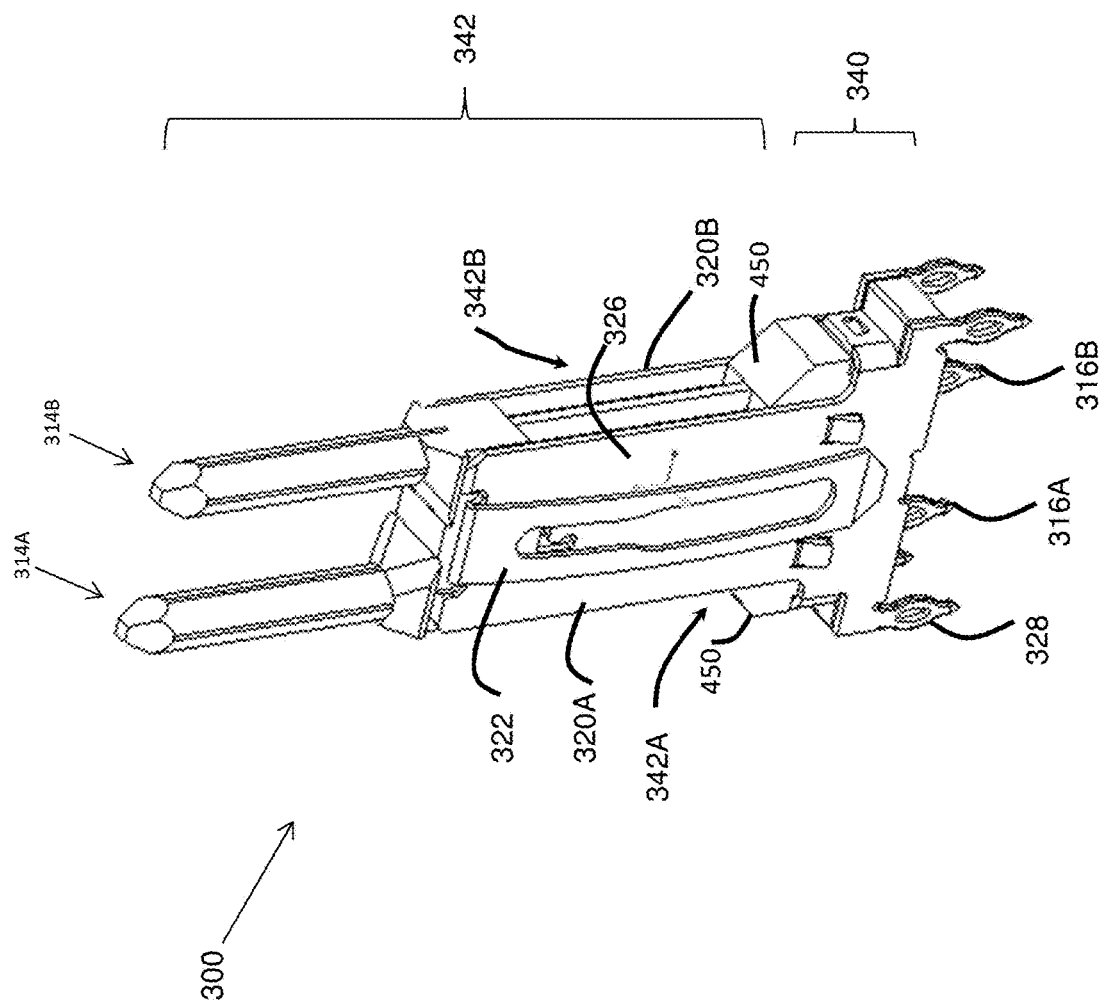
FIG. 3 is an isometric view of a pin assembly of the backplane connector of FIG. 2.

FIG. 3 illustrates a pin module 300 in greater detail. In this embodiment, each pin module includes a pair of conductive elements acting as signal conductors 314A and 314B. Each of the signal conductors has a mating interface portion shaped as a pin. In FIG. 3, that mating interface is on a module configured for use in a backplane connector. However, it should be appreciated that, in embodiments described below, a similar mating interface may be formed at either, or in some embodiments, at both ends of the signal conductors of an extender module.

As shown in FIG. 3, in which that module is configured for use in a backplane connector, opposing ends of the signal conductors have contact tails 316A and 316B. In this embodiment, the contact tails are shaped as press fit compliant sections. Intermediate portions of the signal conductors, connecting the contact tails to the mating contact portions, pass through pin module 300.

Conductive elements serving as reference conductors 320A and 320B are attached at opposing exterior surfaces of pin module 300. Each of the reference conductors has contact tails 328, shaped for making electrical connections to vias within a printed circuit board. The reference conductors also have mating contact portions. In the embodiment illustrated, two types of mating contact portions are illustrated. Compliant member 322 may serve as a mating contact portion, pressing against a reference conductor in daughtercard connector 600. In some embodiments, surfaces 324 and 326 alternatively or additionally may serve as mating contact portions, where reference conductors from the mating conductor may press against reference conductors 320A or 320B. However, in the embodiment illustrated, the reference conductors may be shaped such that electrical contact is made only at compliant member 322.

Figure 4:
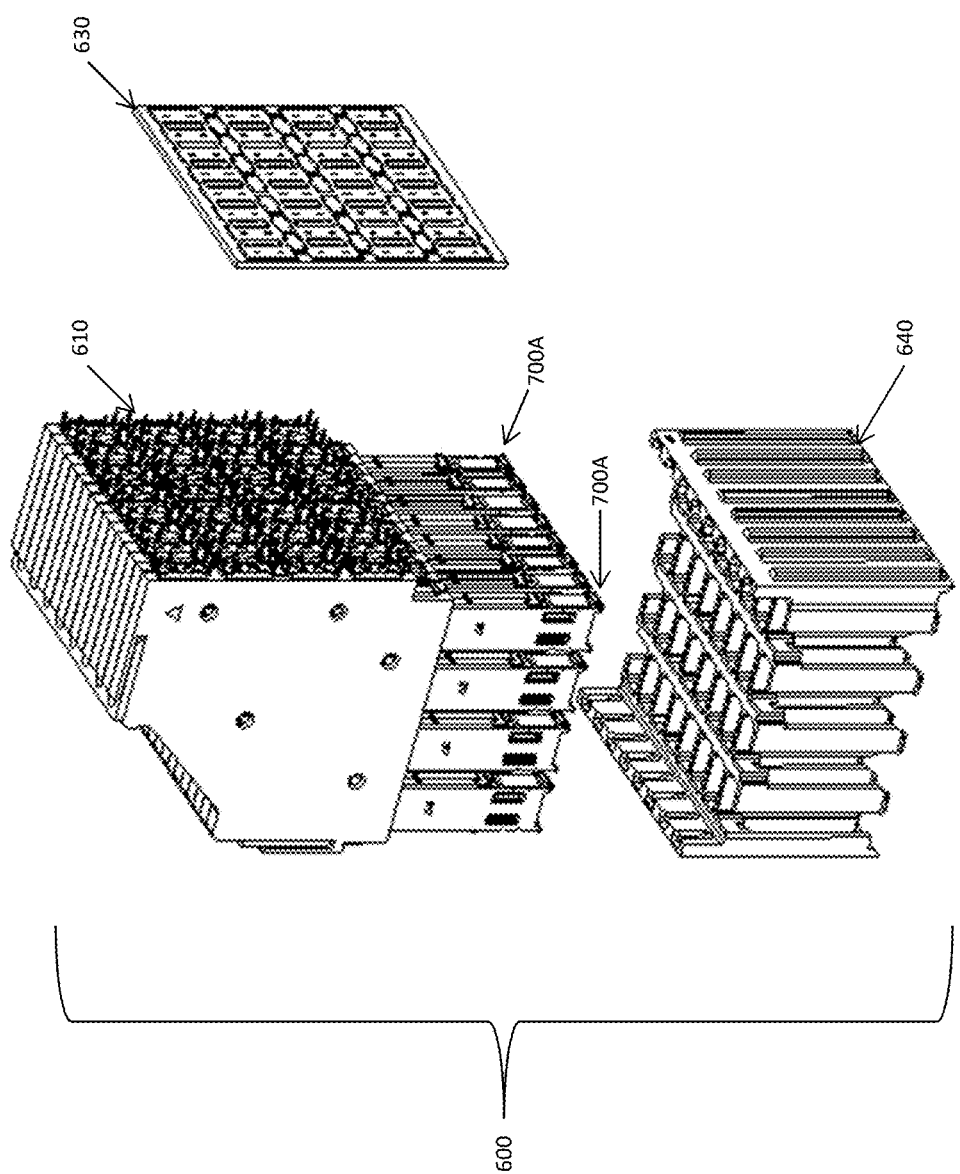
FIG. 4 is an isometric view, partially exploded, of the daughtercard connector of FIG. 1.

Turning to FIG. 4, further details of daughtercard connector 600 are shown in a partially exploded view. Components as illustrated in FIG. 4 may be assembled into a daughtercard connector, configured to mate with backplane connector as described above. Alternatively or additionally, a subset of the connector components shown in FIG. 4 may be, in combination with other components, to form an orthogonal connector. Such an orthogonal connector may mate with a daughtercard connector as shown in FIG. 4.

As shown, connector 600 includes multiple wafers 700A held together in a side-by-side configuration. Here, eight wafers, corresponding to the eight columns of pin modules in backplane connector 200, are shown. However, as with backplane connector 200, the size of the connector assembly may be configured by incorporating more rows per wafer, more wafers per connector or more connectors per interconnection system.

Conductive elements within the wafers 700A may include mating contact portions and contact tails. Contact tails 610 are shown extending from a surface of connector 600 adapted for mounting against a printed circuit board. In some embodiments, contact tails 610 may pass through a member 630. Member 630 may include insulative, lossy and/or conductive portions. In some embodiments, contact tails associated with signal conductors may pass through insulative portions of member 630. Contact tails associated with reference conductors may pass through lossy or conductive portions.

In some embodiments, the conductive or lossy portions may be compliant, such as may result from a conductive elastomer or other material that may be known in the art for forming a gasket. The compliant material may be thicker than the insulative portions of member 630. Such compliant material may be positioned to align with pads on a surface of a daughtercard to which connector 600 is to be attached. Those pads may be connected to reference structures within the printed circuit board such that, when connector 600 is attached to the printed circuit board, the compliant material makes contact with the reference pads on the surface of the printed circuit board.

The conductive or lossy portions of member 630 may be positioned to make electrical connection to reference conductors within connector 600. Such connections may be formed, for example, by contact tails of the reference conductors passing through the lossy of conductive portions. Alternatively or additionally, in embodiments in which the lossy or conductive portions are compliant, those portions may be positioned to press against the mating reference conductors when the connector is attached to a printed circuit board.

Mating contact portions of the wafers 700A are held in a front housing portion 640. The front housing portion may be made of any suitable material, which may be insulative, lossy and/or conductive or may include any suitable combination or such materials. For example the front housing portion may be molded from a filled, lossy material or may be formed from a conductive material, using materials and techniques similar to those described above for the housing walls 226. As shown, the wafers are assembled from modules 810A, 810B, 810C and 810D (FIG. 6), each with a pair of signal conductors surrounded by reference conductors. In the embodiment illustrated, front housing portion 640 has multiple passages, each positioned to receive one such pair of signal conductors and associated reference conductors. However, it should be appreciated that each module might contain a single signal conductor or more than two signal conductors.

Front housing 640, in the embodiment illustrated, is shaped to fit within walls 226 of a backplane connector 200. However, in some embodiments, as described in more detail below, the front housing may be configured to connect to an extender shell.

Figure 5:
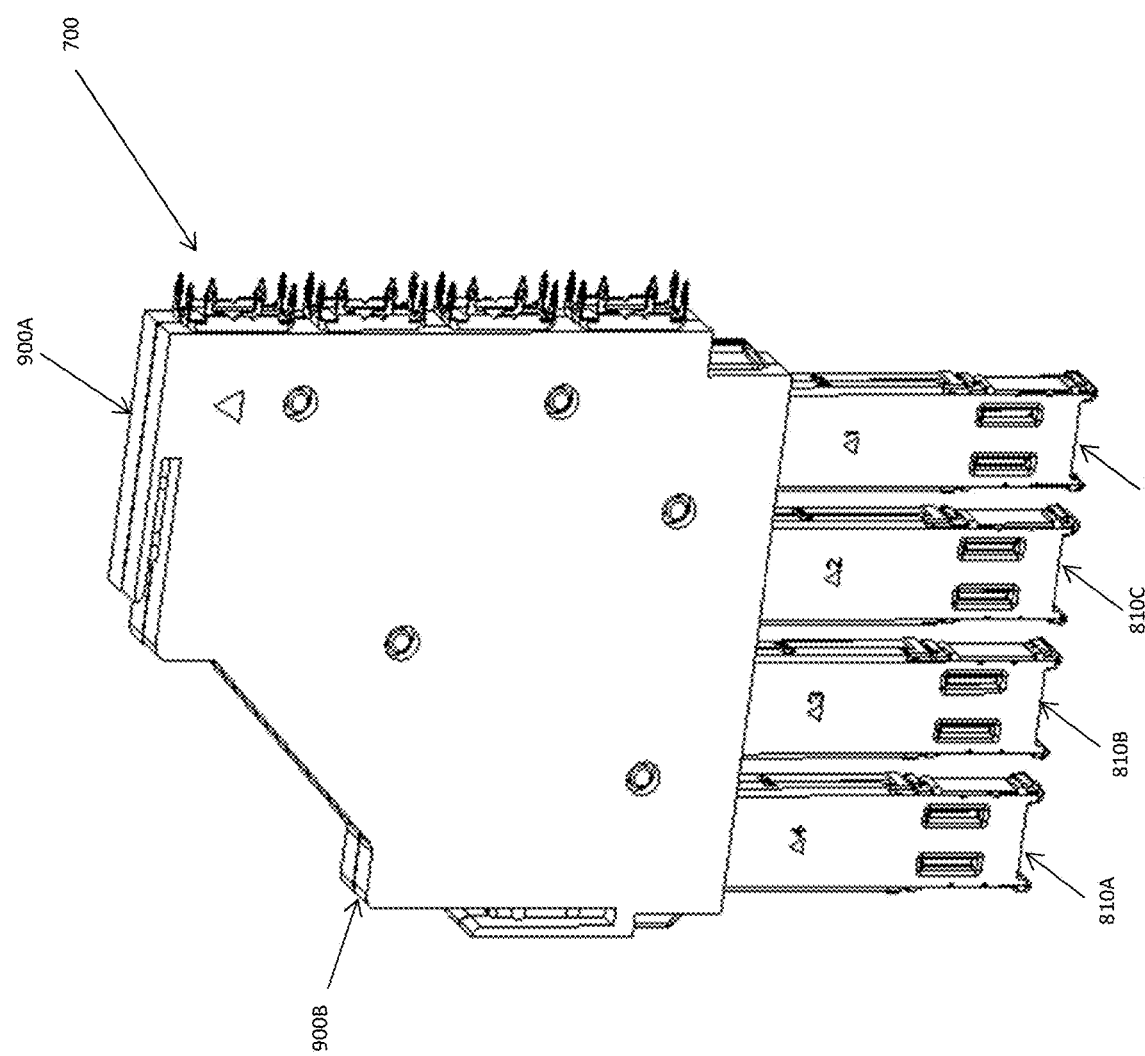
FIG. 5 is an isometric view of a wafer assembly of the daughtercard connector of FIG. 4.

FIG. 5 illustrates a wafer 700. Multiple such wafers may be aligned side-by-side and held together with one or more support members, or in any other suitable way, to form a daughtercard connector or, as described below, an orthogonal connector. In the embodiment illustrated, wafer 700 is a subassembly formed from multiple modules 810A, 810B, 810C and 810D. The modules are aligned to form a column of mating contact portions along one edge of wafer 700 and a column of contact tails along another edge of wafer 700. In the embodiment in which the wafer is designed for use in a right angle connector, as illustrated, those edges are perpendicular.

In the embodiment illustrated, each of the modules includes reference conductors that at least partially enclose the signal conductors. The reference conductors may similarly have mating contact portions and contact tails.

The modules may be held together in any suitable way. For example, the modules may be held within a housing, which in the embodiment illustrated is formed with members 900A and 900B. Members 900A and 900B may be formed separately and then secured together, capturing modules 810A . . . 810D between them. Members 900A and 900B may be held together in any suitable way, such as by attachment members that form an interference fit or a snap fit. Alternatively or additionally, adhesive, welding or other attachment techniques may be used.

Members 900A and 900B may be formed of any suitable material. That material may be an insulative material. Alternatively or additionally, that material may be or may include portions that are lossy or conductive. Members 900A and 900B may be formed, for example, by molding such materials into a desired shape. Alternatively, members 900A and 900B may be formed in place around modules 810A . . . 810D, such as via an insert molding operation. In such an embodiment, it is not necessary that members 900A and 900B be formed separately. Rather, a housing portion to hold modules 810A . . . 810D may be formed in one operation.

FIG. 6 shows modules 810A . . . 810D without members 900A and 900B. In this view, the reference conductors are visible. Signal conductors (not visible in FIG. 6) are enclosed within the reference conductors, forming a waveguide structure. Each waveguide structure includes a contact tail region 820, an intermediate region 830 and a mating contact region 840. Within the mating contact region 840 and the contact tail region 820, the signal conductors are positioned edge to edge. Within the intermediate region 830, the signal conductors are positioned for broadside coupling. Transition regions 822 and 842 are provided to transition between the edge coupled orientation and the broadside coupled orientation.

The transition regions 822 and 842 in the reference conductors may correspond to transition regions in signal conductors, as described below. In the illustrated embodiment, reference conductors form an enclosure around the signal conductors. A transition region in the reference conductors, in some embodiments, may keep the spacing between the signal conductors and reference conductors generally uniform over the length of the signal conductors. Thus, the enclosure formed by the reference conductors may have different widths in different regions.

The reference conductors provide shielding coverage along the length of the signal conductors. As shown, coverage is provided over substantially all of the length of the signal conductors, including coverage in the mating contact portion and the intermediate portions of the signal conductors. The contact tails are shown exposed so that they can make contact with the printed circuit board. However, in use, these mating contact portions will be adjacent ground structures within a printed circuit board such that being exposed as shown in FIG. 6 does not detract from shielding coverage along substantially all of the length of the signal conductor. In some embodiments, mating contact portions might also be exposed for mating to another connector. Accordingly, in some embodiments, shielding coverage may be provided over more than 80%, 85%, 90% or 95% of the intermediate portion of the signal conductors. Similarly, shielding coverage may also be provided in the transition regions, such that shielding coverage may be provided over more than 80%, 85%, 90% or 95% of the combined length of the intermediate portion and transition regions of the signal conductors. In some embodiments, as illustrated, the mating contact regions and some or all of the contact tails may also be shielded, such that shielding coverage may be, in various embodiments, over more than 80%, 85%, 90% or 95% of the length of the signal conductors.

In the embodiment illustrated, a waveguide-like structure formed by the reference conductors has a wider dimension in the column direction of the connector in the contact tail regions 820 and the mating contact region 840 to accommodate for the wider dimension of the signal conductors being side-by-side in the column direction in these regions. In the embodiment illustrated, contact tail regions 820 and the mating contact region 840 of the signal conductors are separated by a distance that aligns them with the mating contacts of a mating connector or contact structures on a printed circuit board to which the connector is to be attached.

These spacing requirements mean that the waveguide will be wider in the column dimension than it is in the transverse direction, providing an aspect ratio of the waveguide in these regions that may be at least 2:1, and in some embodiments may be on the order of at least 3:1. Conversely, in the intermediate region 830, the signal conductors are oriented with the wide dimension of the signal conductors overlaid in the column dimension, leading to an aspect ratio of the waveguide that may be less than 2:1, and in some embodiments may be less than 1.5:1 or on the order of 1:1.

With this smaller aspect ratio, the largest dimension of the waveguide in the intermediate region 830 will be smaller than the largest dimension of the waveguide in regions 830 and 840. Because the lowest frequency propagated by a waveguide is inversely proportional to the length of its shortest dimension, the lowest frequency mode of propagation that can be excited in intermediate region 830 is higher than can be excited in contact tail regions 820 and the mating contact region 840. The lowest frequency mode that can be excited in the transition regions will be intermediate between the two. Because the transition from edge coupled to broadside coupling has the potential to excite undesired modes in the waveguides, signal integrity may be improved if these modes are at higher frequencies than the intended operating range of the connector, or at least are as high as possible.

These regions may be configured to avoid mode conversion upon transition between coupling orientations, which would excite propagation of undesired signals through the waveguides. For example, as shown below, the signal conductors may be shaped such that the transition occurs in the intermediate region 830 or the transition regions 822 and 842, or partially within both. Additionally or alternatively, the modules may be structured to suppress undesired modes excited in the waveguide formed by the reference conductors, as described in greater detail below.

Though the reference conductors may substantially enclose each pair, it is not a requirement that the enclosure be without openings. Accordingly, in embodiments shaped to provide rectangular shielding, the reference conductors in the intermediate regions may be aligned with at least portions of all four sides of the signal conductors. The reference conductors may combine for example to provide 360 degree coverage around the pair of signal conductors. Such coverage may be provided, for example, by overlapping or physically contact reference conductors. In the illustrated embodiment, the reference conductors are U-shaped shells and come together to form an enclosure.

Three hundred sixty degree coverage may be provided regardless of the shape of the reference conductors. For example, such coverage may be provided with circular, elliptical or reference conductors of any other suitable shape. However, it is not a requirement that the coverage be complete. The coverage, for example, may have an angular extent in the range between about 270 and 365 degrees. In some embodiments, the coverage may be in the range of about 340 to 360 degrees. Such coverage may be achieved for example, by slots or other openings in the reference conductors.

In some embodiments, the shielding coverage may be different in different regions. In the transition regions, the shielding coverage may be greater than in the intermediate regions. In some embodiments, the shielding coverage may have an angular extent of greater than 355 degrees, or even in some embodiments 360 degrees, resulting from direct contact, or even overlap, in reference conductors in the transition regions even if less shielding coverage is provided in the transition regions.

The inventors have recognized and appreciated that, in some sense, fully enclosing a signal pair in reference conductors in the intermediate regions may create effects that undesirably impact signal integrity, particularly when used in connection with a transition between edge coupling and broadside coupling within a module. The reference conductors surrounding the signal pair may form a waveguide.

Signals on the pair, and particularly within a transition region between edge coupling and broadside coupling, may cause energy from the differential mode of propagation between the edges to excite signals that can propagate within the waveguide. In accordance with some embodiments, one or more techniques to avoid exciting these undesired modes, or to suppress them if they are excited, may be used.

Some techniques that may be used increase the frequency that will excite the undesired modes. In the embodiment illustrated, the reference conductors may be shaped to leave openings 832. These openings may be in the narrower wall of the enclosure. However, in embodiments in which there is a wider wall, the openings may be in the wider wall. In the embodiment illustrated, openings 832 run parallel to the intermediate portions of the signal conductors and are between the signal conductors that form a pair. These slots lower the angular extent of the shielding, such that, adjacent the broadside coupled intermediate portions of the signal conductors, the angular extent of the shielding may be less than 360 degrees. It may, for example, be in the range of 355 of less. In embodiments in which members 900A and 900B are formed by over molding lossy material on the modules, lossy material may be allowed to fill openings 832, with or without extending into the inside of the waveguide, which may suppress propagation of undesired modes of signal propagation, that can decrease signal integrity.

In the embodiment illustrated in FIG. 6, openings 832 are slot shaped, effectively dividing the shielding in half in intermediate region 830. The lowest frequency that can be excited in a structure serving as a waveguide—as is the effect of the reference conductors that substantially surround the signal conductors as illustrated in FIG. 6—is inversely proportional to the dimensions of the sides. In some embodiments, the lowest frequency waveguide mode that can be excited is a TEM mode. Effectively shortening a side by incorporating slot-shaped opening 832, raises the frequency of the TEM mode that can be excited. A higher resonant frequency can mean that less energy within the operating frequency range of the connector is coupled into undesired propagation within the waveguide formed by the reference conductors, which improves signal integrity.

In region 830, the signal conductors of a pair are broadside coupled and the openings 832, with or without lossy material in them, may suppress TEM common modes of propagation. While not being bound by any particular theory of operation, the inventors theorize that openings 832, in combination with an edge coupled to broadside coupled transition, aids in providing a balanced connector suitable for high frequency operation.

Figure 7:
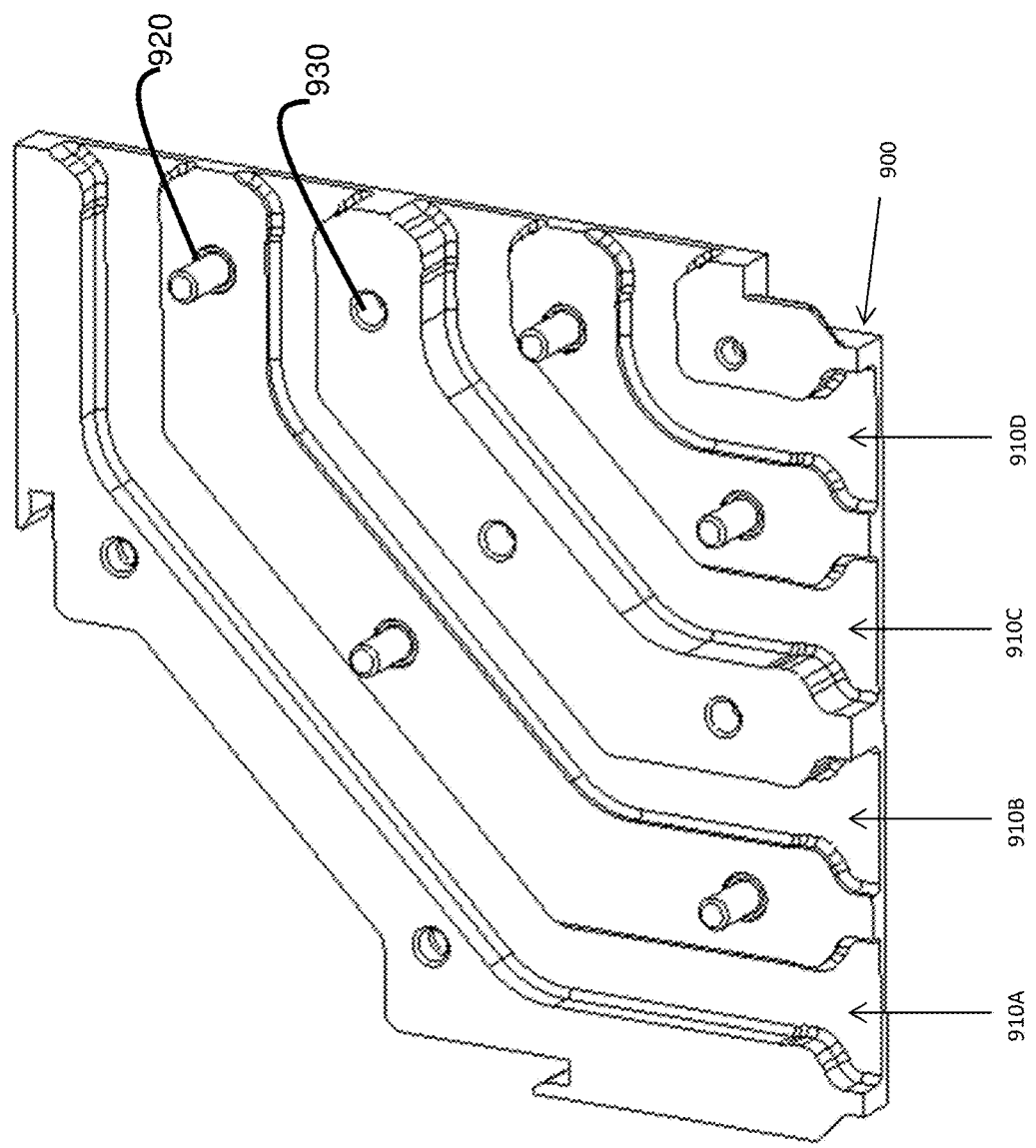
FIG. 7 is an isometric view of a portion of the insulative housing of the wafer assembly of FIG. 5.

FIG. 7 illustrates a member 900, which may be a representation of member 900A or 900B. As can be seen, member 900 is formed with channels 910A . . . 910D shaped to receive modules 810A . . . 810D shown in FIG. 6. With the modules in the channels, member 900A may be secured to member 900B. In the illustrated embodiment, attachment of members 900A and 900B may be achieved by posts, such as post 920, in one member, passing through a hole, such as hole 930, in the other member. The post may be welded or otherwise secured in the hole. However, any suitable attachment mechanism may be used.

Members 900A and 900B may be molded from or include a lossy material. Any suitable lossy material may be used for these and other structures that are "lossy." Materials that conduct, but with some loss, or material which by another physical mechanism absorbs electromagnetic energy over the frequency range of interest are referred to herein generally as "lossy" materials. Electrically lossy materials can be formed from lossy dielectric and/or poorly conductive and/or lossy magnetic materials. Magnetically lossy material can be formed, for example, from materials traditionally regarded as ferromagnetic materials, such as those that have a magnetic loss tangent greater than approximately 0.05 in the frequency range of interest. The "magnetic loss tangent" is the ratio of the imaginary part to the real part of the complex electrical permeability of the material. Practical lossy magnetic materials or mixtures containing lossy magnetic materials may also exhibit useful amounts of dielectric loss or conductive loss effects over portions of the frequency range of interest. Electrically lossy material can be formed from material traditionally regarded as dielectric materials, such as those that have an electric loss tangent greater than approximately 0.05 in the frequency range of interest. The "electric loss tangent" is the ratio of the imaginary part to the real part of the complex electrical permittivity of the material. Electrically lossy materials can also be formed from materials that are generally thought of as conductors, but are either relatively poor conductors over the frequency range of interest, contain conductive particles or regions that are sufficiently dispersed that they do not provide high conductivity or otherwise are prepared with properties that lead to a relatively weak bulk conductivity compared to a good conductor such as copper over the frequency range of interest.

Electrically lossy materials typically have a bulk conductivity of about 1 siemen/meter to about 100,000 siemens/meter and preferably about 1 siemen/meter to about 10,000 siemens/meter. In some embodiments material with a bulk conductivity of between about 10 siemens/meter and about 200 siemens/meter may be used. As a specific example, material with a conductivity of about 50 siemens/meter may be used. However, it should be appreciated that the conductivity of the material may be selected empirically or through electrical simulation using known simulation tools to determine a suitable conductivity that provides both a suitably low crosstalk with a suitably low signal path attenuation or insertion loss.

Electrically lossy materials may be partially conductive materials, such as those that have a surface resistivity between 1 Ω/square and 100,000 Ω/square. In some embodiments, the electrically lossy material has a surface resistivity between 10 Ω/square and 1000 Ω/square. As a specific example, the material may have a surface resistivity of between about 20 Ω/square and 80 Ω/square.

In some embodiments, electrically lossy material is formed by adding to a binder a filler that contains conductive particles. In such an embodiment, a lossy member may be formed by molding or otherwise shaping the binder with filler into a desired form. Examples of conductive particles that may be used as a filler to form an electrically lossy material include carbon or graphite formed as fibers, flakes, nanoparticles, or other types of particles. Metal in the form of powder, flakes, fibers or other particles may also be used to provide suitable electrically lossy properties. Alternatively, combinations of fillers may be used. For example, metal plated carbon particles may be used. Silver and nickel are suitable metal plating for fibers. Coated particles may be used alone or in combination with other fillers, such as carbon flake. The binder or matrix may be any material that will set, cure, or can otherwise be used to position the filler material. In some embodiments, the binder may be a thermoplastic material traditionally used in the manufacture of electrical connectors to facilitate the molding of the electrically lossy material into the desired shapes and locations as part of the manufacture of the electrical connector. Examples of such materials include liquid crystal polymer (LCP) and nylon. However, many alternative forms of binder materials may be used. Curable materials, such as epoxies, may serve as a binder. Alternatively, materials such as thermosetting resins or adhesives may be used.

Also, while the above described binder materials may be used to create an electrically lossy material by forming a binder around conducting particle fillers, the application is not so limited. For example, conducting particles may be impregnated into a formed matrix material or may be coated onto a formed matrix material, such as by applying a conductive coating to a plastic component or a metal component. As used herein, the term "binder" encompasses a material that encapsulates the filler, is impregnated with the filler or otherwise serves as a substrate to hold the filler.

Preferably, the fillers will be present in a sufficient volume percentage to allow conducting paths to be created from particle to particle. For example, when metal fiber is used, the fiber may be present in about 3% to 40% by volume. The amount of filler may impact the conducting properties of the material.

Filled materials may be purchased commercially, such as materials sold under the trade name Celestran® by Celanese Corporation which can be filled with carbon fibers or stainless steel filaments. A lossy material, such as lossy conductive carbon filled adhesive preform, such as those sold by Techfilm of Billerica, Mass., US may also be used. This preform can include an epoxy binder filled with carbon fibers and/or other carbon particles. The binder surrounds carbon particles, which act as a reinforcement for the preform. Such a preform may be inserted in a connector wafer to form all or part of the housing. In some embodiments, the preform may adhere through the adhesive in the preform, which may be cured in a heat treating process. In some embodiments, the adhesive may take the form of a separate conductive or non-conductive adhesive layer. In some embodiments, the adhesive in the preform alternatively or additionally may be used to secure one or more conductive elements, such as foil strips, to the lossy material.

Various forms of reinforcing fiber, in woven or non-woven form, coated or non-coated may be used. Non-woven carbon fiber is one suitable material. Other suitable materials, such as custom blends as sold by RTP Company, can be employed, as the present invention is not limited in this respect.

In some embodiments, a lossy member may be manufactured by stamping a preform or sheet of lossy material. For example, an insert may be formed by stamping a preform as described above with an appropriate pattern of openings. However, other materials may be used instead of or in addition to such a preform. A sheet of ferromagnetic material, for example, may be used.

However, lossy members also may be formed in other ways. In some embodiments, a lossy member may be formed by interleaving layers of lossy and conductive material such as metal foil. These layers may be rigidly attached to one another, such as through the use of epoxy or other adhesive, or may be held together in any other suitable way. The layers may be of the desired shape before being secured to one another or may be stamped or otherwise shaped after they are held together.

Figure 8:
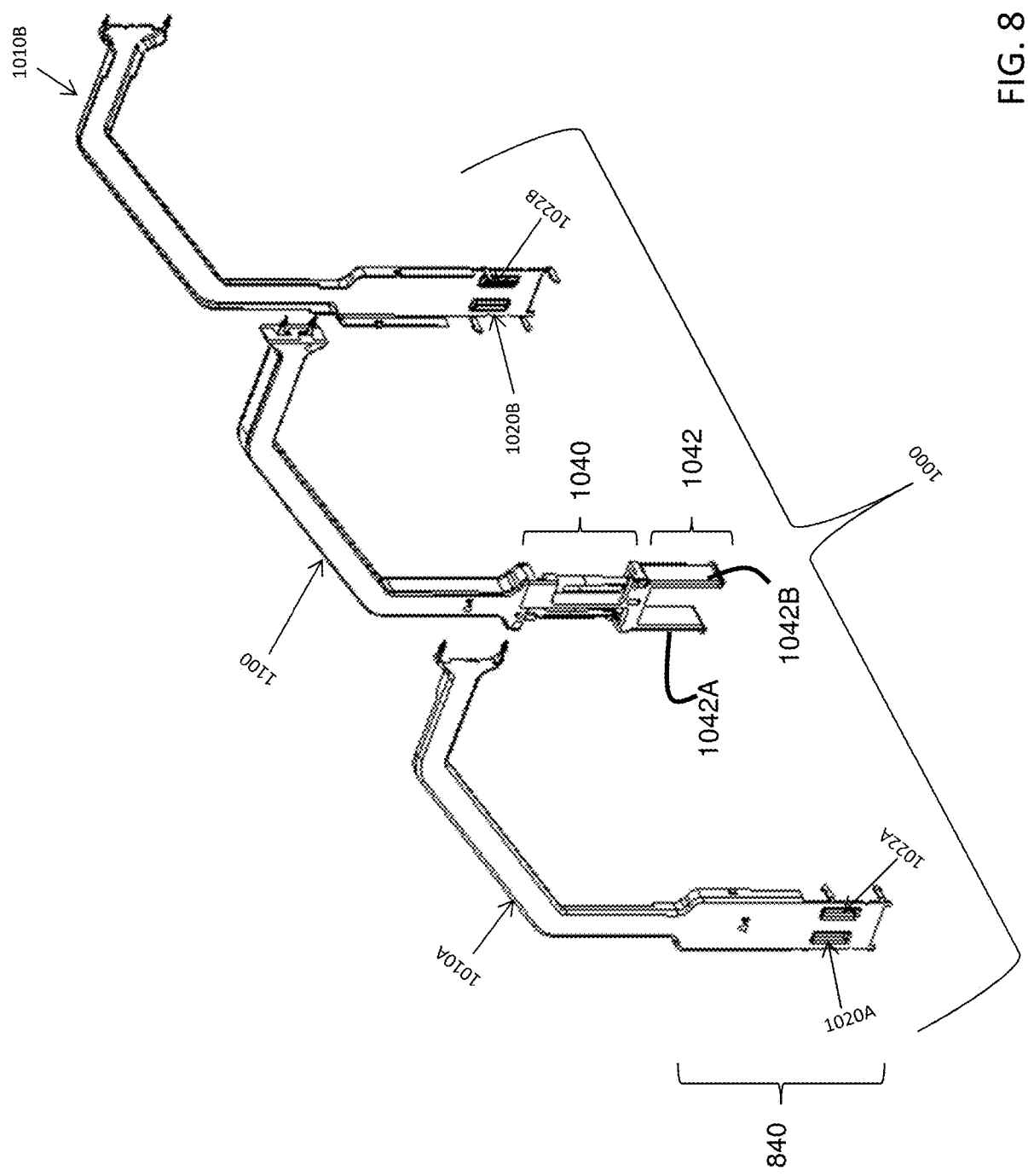
FIG. 8 is an isometric view, partially exploded, of a wafer module of the wafer assembly of FIG. 5.

FIG. 8 shows further details of construction of a wafer module 1000. Module 1000 may be representative of any of the modules in a connector, such as any of the modules 810A . . . 810D shown in FIGS. 5-6. Each of the modules 810A . . . 810D may have the same general construction, and some portions may be the same for all modules. For example, the contact tail regions 820 and mating contact regions 840 may be the same for all modules. Each module may include an intermediate portion region 830, but the length and shape of the intermediate portion region 830 may vary depending on the location of the module within the wafer.

In the embodiment illustrated, module 100 includes a pair of signal conductors 1310A and 1310B (FIG. 9) held within an insulative housing portion 1100. Insulative housing portion 1100 is enclosed, at least partially, by reference conductors 1010A and 1010B. This subassembly may be held together in any suitable way. For example, reference conductors 1010A and 1010B may have features that engage one another. Alternatively or additionally, reference conductors 1010A and 1010B may have features that engage insulative housing portion 1100. As yet another example, the reference conductors may be held in place once members 900A and 900B are secured together as shown in FIG. 5.

In the embodiments illustrated in FIG. 3 and FIG. 8, subregion 1042 is designed to overlap pin module 300 when module 1000 is pressed fully against pin module 300. Projecting insulative members 1042A and 1042B are sized to fit within spaces 342A and 342B, respectively. With the modules pressed together, the distal ends of insulative members 1042A and 1042B press against surfaces 450 (FIG. 3). Those distal ends may have a shape complementary to the taper of surfaces 450 such that insulative members 1042A and 1042B fill spaces 342A and 342B, respectively. That overlap creates a relative position of signal conductors, dielectric, and reference conductors that may approximate the structure within subregion 340. These components may be sized to provide the same impedance as in subregion 340 when modules 300 and 1000 are fully pressed together. When the modules are fully pressed together, which in this example is the nominal mating position, the signal conductors will have the same impedance across the mating region made up by subregions 340, 1040 and where subregions 342 and 1042 overlap.

These components also may be sized and may have material properties that provide impedance control as a function of separation of modules 300 and 1000. Impedance control may be achieved by providing approximately the same impedance through subregions 342 and 1042, even if those subregions do not fully overlap, or by providing gradual impedance transitions, regardless of separation of the modules.

In the illustrated embodiment, this impedance control is provided in part by projecting insulative members 1042A and 1042B, which fully or partially overlap module 300, depending on separation between modules 300 and 1000. These projecting insulative members can reduce the magnitude of changes in relative dielectric constant of material surrounding pins from pin module 300. Impedance control is also provided by projections 1020A and 1022A and 1020B and 1022B in the reference conductors 1010A and 1010B. These projections impact the separation, in a direction perpendicular to the axis of the signal conductor pair, between portions of the signal conductor pair and the reference conductors 1010A and 1010B. This separation, in combination with other characteristics, such as the width of the signal conductors in those portions, may control the impedance in those portions such that it approximates the nominal impedance of the connector or does not change abruptly in a way that may cause signal reflections. Other parameters of either or both mating modules may be configured for such impedance control.

Figure 9:
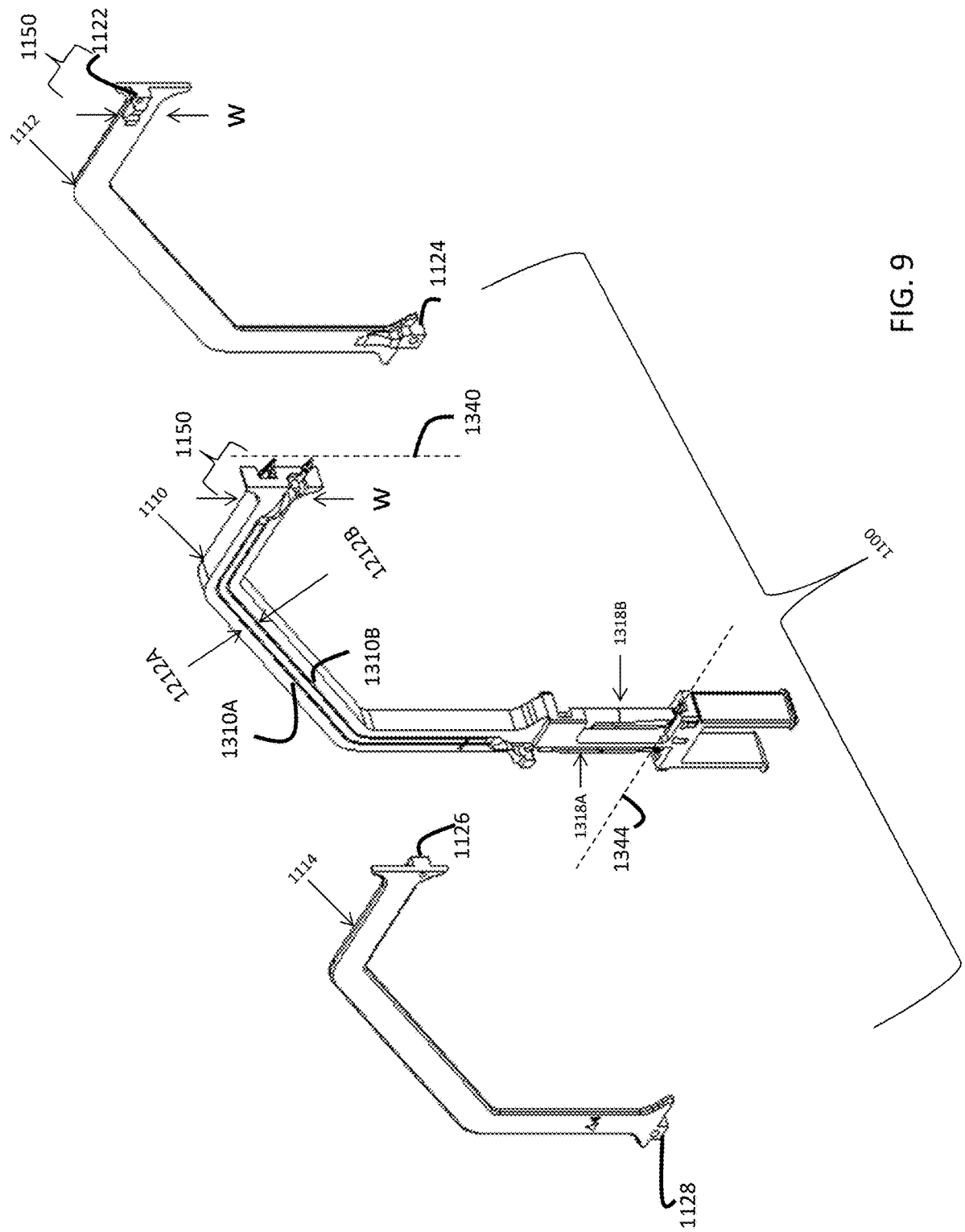
FIG. 9 is an isometric view, partially exploded, of a portion of a wafer module of the wafer assembly of FIG. 5.

Turning to FIG. 9, further details of exemplary components of a module 1000 are illustrated. FIG. 9 is an exploded view of module 1000, without reference conductors 1010A and 1010B shown. Insulative housing portion 1100 is, in the illustrated embodiment, made of multiple components. Central member 1110 may be molded from insulative material. Central member 1110 includes two grooves 1212A and 1212B into which conductive elements 1310A and 1310B, which in the illustrated embodiment form a pair of signal conductors, may be inserted.

Covers 1112 and 1114 may be attached to opposing sides of central member 1110. Covers 1112 and 1114 may aid in holding conductive elements 1310A and 1310B within grooves 1212A and 1212B and with a controlled separation from reference conductors 1010A and 1010B. In the embodiment illustrated, covers 1112 and 1114 may be formed of the same material as central member 1110. However, it is not a requirement that the materials be the same, and in some embodiments, different materials may be used, such as to provide different relative dielectric constants in different regions to provide a desired impedance of the signal conductors.

In the embodiment illustrated, grooves 1212A and 1212B are configured to hold a pair of signal conductors for edge coupling at the contact tails and mating contact portions. Over a substantial portion of the intermediate portions of the signal conductors, the pair is held for broadside coupling. To transition between edge coupling at the ends of the signal conductors to broadside coupling in the intermediate portions, a transition region may be included in the signal conductors. Grooves in central member 1110 may be shaped to provide the transition region in the signal conductors. Projections 1122, 1124, 1126 and 1128 on covers 1112 and 1114 may press the conductive elements against central portion 1110 in these transition regions.

In the embodiment illustrated in FIG. 9, it can be seen that the transition between broadside and edge coupling occurs over a region 1150. At one end of this region, the signal conductors are aligned edge-to-edge in the column direction in a plane parallel to the column direction. Traversing region 1150 in towards the intermediate portion, the signal conductors jog in opposition direction perpendicular to that plane and jog towards each other. As a result, at the end of region 1150, the signal conductors are in separate planes parallel to the column direction. The intermediate portions of the signal conductors are aligned in a direction perpendicular to those planes.

Region 1150 includes the transition region, such as 822 or 842 where the waveguide formed by the reference conductor transitions from its widest dimension to the narrower dimension of the intermediate portion, plus a portion of the narrower intermediate region 830. As a result, at least a portion of the waveguide formed by the reference conductors in this region 1150 has a widest dimension of W, the same as in the intermediate region 830. Having at least a portion of the physical transition in a narrower part of the waveguide reduces undesired coupling of energy into waveguide modes of propagation.

Having full 360 degree shielding of the signal conductors in region 1150 may also reduce coupling of energy into undesired waveguide modes of propagation. Accordingly, openings 832 do not extend into region 1150 in the embodiment illustrated.

In the embodiment illustrated, conductive members 1310A and 1310B each have edges and broader sides between those edges. Contact tails 1330A and 1330B are aligned in a column 1340. With this alignment, edges of conductive elements 1310A and 1310B face each other at the contact tails 1330A and 1330B. Other modules in the same wafer will similarly have contact tails aligned along column 1340. Contact tails from adjacent wafers will be aligned in parallel columns. The space between the parallel columns creates routing channels on the printed circuit board to which the connector is attached. Mating contact portions 1318A and 1318B are aligned along column 1344.

In the example of FIG. 9, conductive elements for a right angle connector are illustrated, as reflected by the right angle between column 1340, representing points of attachment to a daughtercard, and column 1344, representing locations for mating pins attached to a backplane connector.

Figure 10:
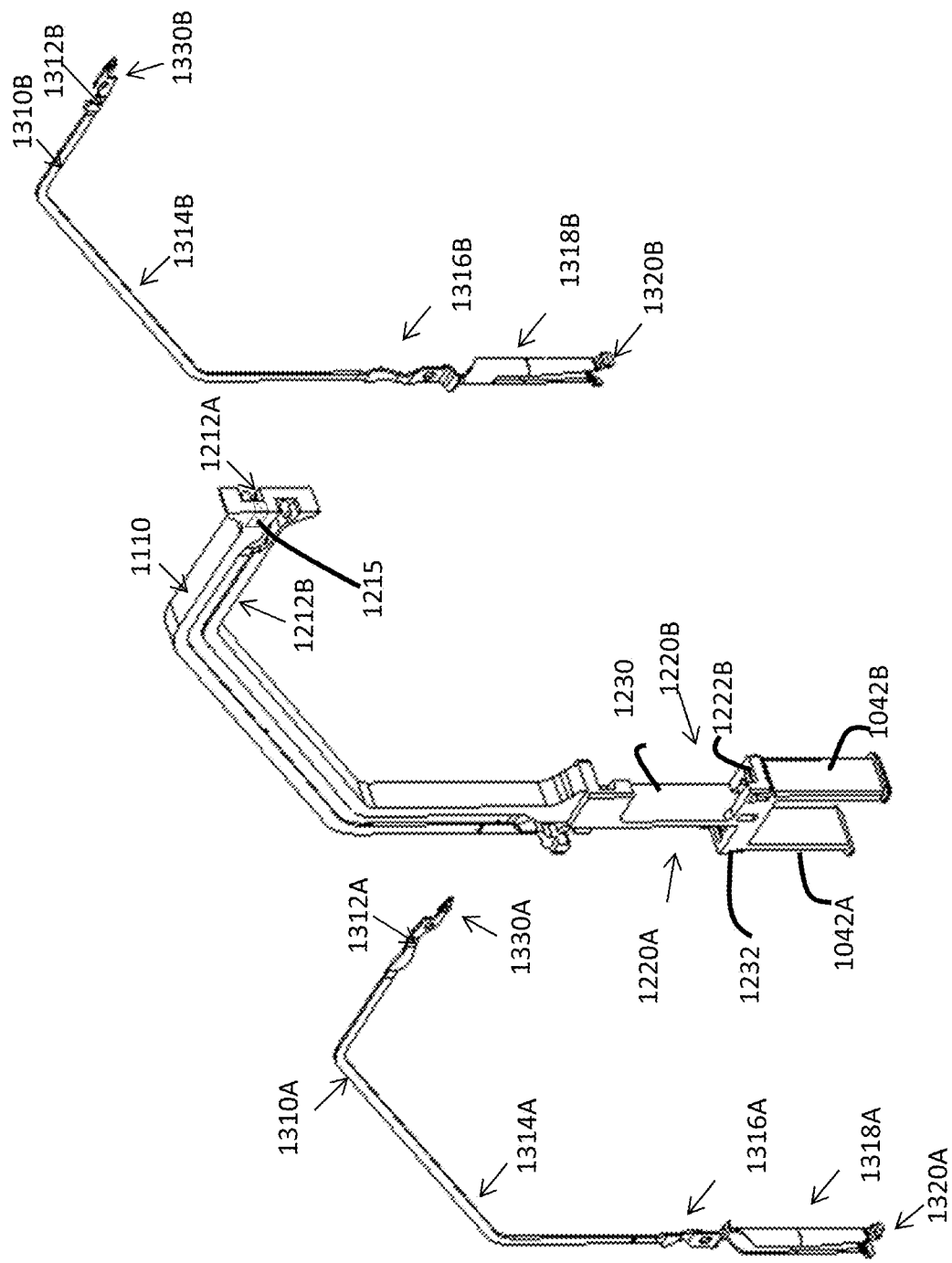
FIG. 10 is an isometric view, partially exploded, of a portion of a wafer module of the wafer assembly of FIG. 5.

FIG. 10 shows further detail of a module 1000. In this view, conductive elements 1310A and 1310B are shown separated from central member 1110. For clarity, covers 1112 and 1114 are not shown. Transition region 1312A between contact tail 1330A and intermediate portion 1314A is visible in this view. Similarly, transition region 1316A between intermediate portion 1314A and mating contact portion 1318A is also visible. Similar transition regions 1312B and 1316B are visible for conductive element 1310B, allowing for edge coupling at contact tails 1330B and mating contact portions 1318B and broadside coupling at intermediate portion 1314B.

The mating contact portions 1318A and 1318B may be formed from the same sheet of metal as the conductive elements. However, it should be appreciated that, in some embodiments, conductive elements may be formed by attaching separate mating contact portions to other conductors to form the intermediate portions. For example, in some embodiments, intermediate portions may be cables such that the conductive elements are formed by terminating the cables with mating contact portions.

In the embodiment illustrated, the mating contact portions are tubular. Such a shape may be formed by stamping the conductive element from a sheet of metal and then forming to roll the mating contact portions into a tubular shape. The circumference of the tube may be large enough to accommodate a pin from a mating pin module, but may conform to the pin. The tube may be split into two or more segments, forming compliant beams. Two such beams are shown in FIG. 10. Bumps or other projections may be formed in distal portions of the beams, creating contact surfaces. Those contact surfaces may be coated with gold or other conductive, ductile material to enhance reliability of an electrical contact.

When conductive elements 1310A and 1310B are mounted in central member 1110, mating contact portions 1318A and 1318B fit within openings 1220A 1220B. The mating contact portions are separated by wall 1230. The distal ends 1320A and 1320B of mating contact portions 1318A and 1318B may be aligned with openings, such as opening 1222B, in platform 1232. These openings may be positioned to receive pins from the mating pin module 300. Wall 1230, platform 1232 and insulative projecting members 1042A and 1042B may be formed as part of portion 1110, such as in one molding operation. However, any suitable technique may be used to form these members.

FIG. 10 shows a further technique that may be used, instead of or in addition to techniques described above, for reducing energy in undesired modes of propagation within the waveguides formed by the reference conductors in transition regions 1150. Conductive or lossy material may be integrated into each module so as to reduce excitation of undesired modes or to damp undesired modes. FIG. 10, for example, shows lossy region 1215. Lossy region 1215 may be configured to fall along the center line between signal conductors 1310A and 1310B in some or all of region 1150. Because signal conductors 1310A and 1310B jog in different directions through that region to implement the edge to broadside transition, lossy region 1215 may not be bounded by surfaces that are parallel or perpendicular to the walls of the waveguide formed by the reference conductors. Rather, it may be contoured to provide surfaces equidistant from the edges of the signal conductors 1310A and 1310B as they twist through region 1150. Lossy region 1215 may be electrically connected to the reference conductors in some embodiments. However, in other embodiments, the lossy region 1215 may be floating.

Though illustrated as a lossy region 1215, a similarly positioned conductive region may also reduce coupling of energy into undesired waveguide modes that reduce signal integrity. Such a conductive region, with surfaces that twist through region 1150, may be connected to the reference conductors in some embodiments. While not being bound by any particular theory of operation, a conductor, acting as a wall separating the signal conductors and as such twists to follow the twists of the signal conductors in the transition region, may couple ground current to the waveguide in such a way as to reduce undesired modes. For example, the current may be coupled to flow in a differential mode through the walls of the reference conductors parallel to the broadside coupled signal conductors, rather than excite common modes.

Figure 11:
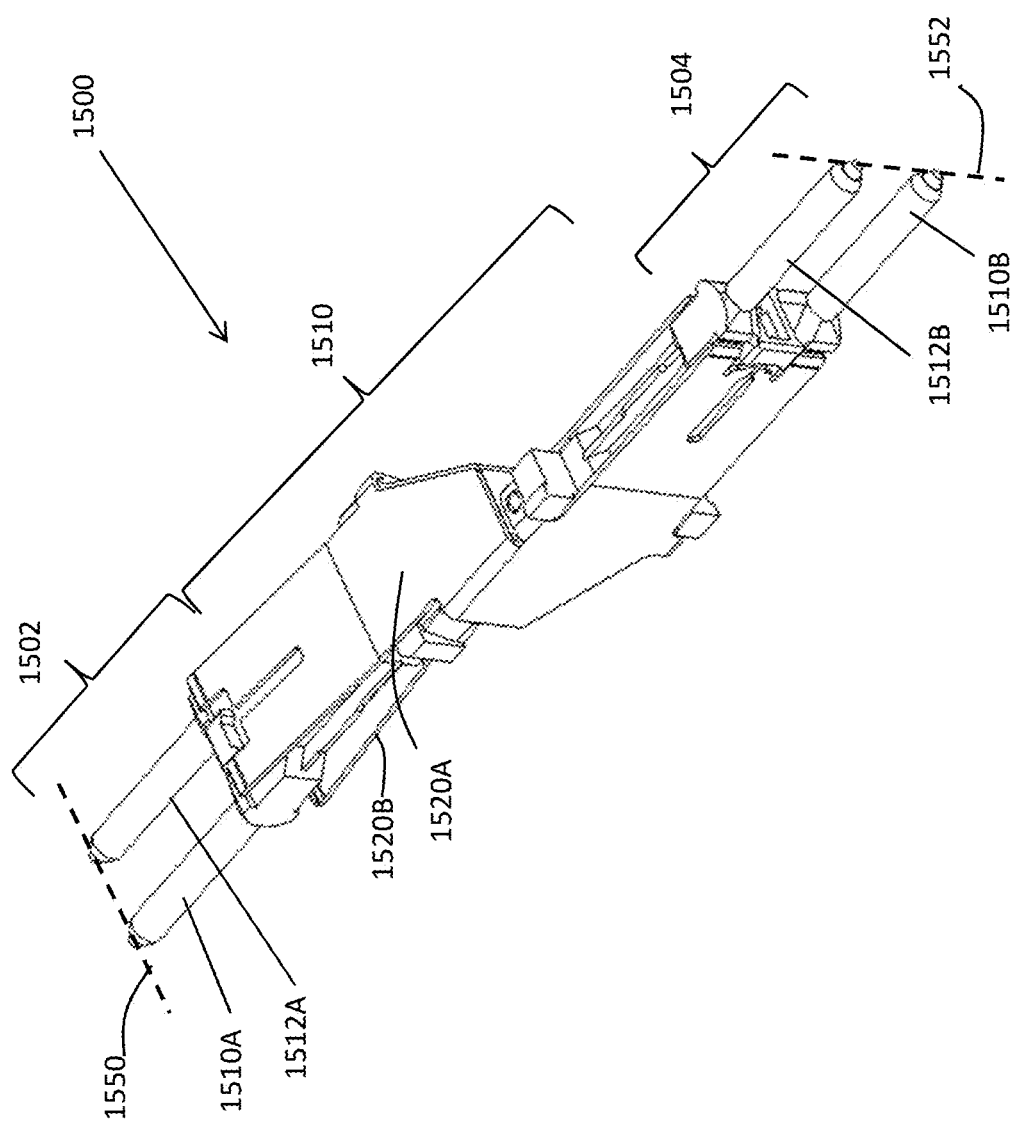
FIG. 11 is an isometric view of an extender module, according to some embodiments.

FIG. 11 illustrates one embodiment of an extender module 1500 that may be used in an orthogonal connector. The extender module includes a pair of signal conductors that have first mating contact portions 1510A and 1512A, and second mating contact portions 1510B and 1512B. The first and second mating contact portions are positioned at a first end 1502 and a second end 1504 of the extender module, respectively. As illustrated, the first mating contact portions are positioned along a first line 1550 that is orthogonal to a second line 1552 along which the second mating contact portions are positioned. In the depicted embodiment, the mating contact portions are shaped as pins and are configured to mate with a corresponding mating contact portion of a connector module 810; however, it should be understood that other mating interfaces, such as beams, blades, or any other suitable structure also may be used for the mating contact portions as the current disclosure is not so limited. As described in more detail below, conductive shield elements 1520A and 1520B are attached to opposing sides of the extender module 1500 in an intermediate portion 1510 between the first end 1502 and the second end 1504. The shield elements surround the intermediate portion such that the signal conductors within the extender module are fully shielded.

FIGS. 12A-12C illustrate further details of the signal conductors 1506 and 1508 disposed within the extender module 1500. Insulative portions of the extender module are also visible, as the shield elements 1520A and 1520B are not visible in these views. As shown in in FIG. 12A, the first and second signal conductors are each formed as a single piece of conducting material with mating contact portions 1510 and 1512 connected by intermediate portions 1514 and 1516. The intermediate portions include a 90° bend such that the first mating portions are orthogonal to the second mating portions, as discussed above. Further, as illustrated, the bends in the first and second signal conductors are offset such that the lengths of the two signal conductors are substantially the same; such a construction may be advantageous to reduce and/or eliminate skew in a differential signal carried by the first and second signal conductors.

Referring now to FIGS. 12B and 12C, the intermediate portions 1514 and 1516 of signal conductors 1506 and 1508 are disposed within insulating material 1518. First and second portions of insulating material 1518A and 1518B are formed adjacent to the mating contact portions 1510 and 1512, and a third insulating portion 1522 is formed between the first and second portions around the intermediate portion of the signal conductors. Although in the depicted embodiment, the insulating material is formed as three separate portions, it should be understood that in other embodiments the insulating may be formed as a single portion, two portions, or as more than three portions, as the current disclosure is not so limited. The insulated portions 1518 and 1522 define orthogonal planar regions 1526 and 1528 on each side of the extender module to which the conductive elements 1520A and 1520B attach. Moreover, it is not a requirement that an extender module be formed using operations in the sequence illustrated in FIGS. 12A-12C. For example, the insulated portions 1518A and 1518B might be molded around signal conductors 1506 and 1508 prior to those conductive elements being bent at a right angle.

Figure 13:
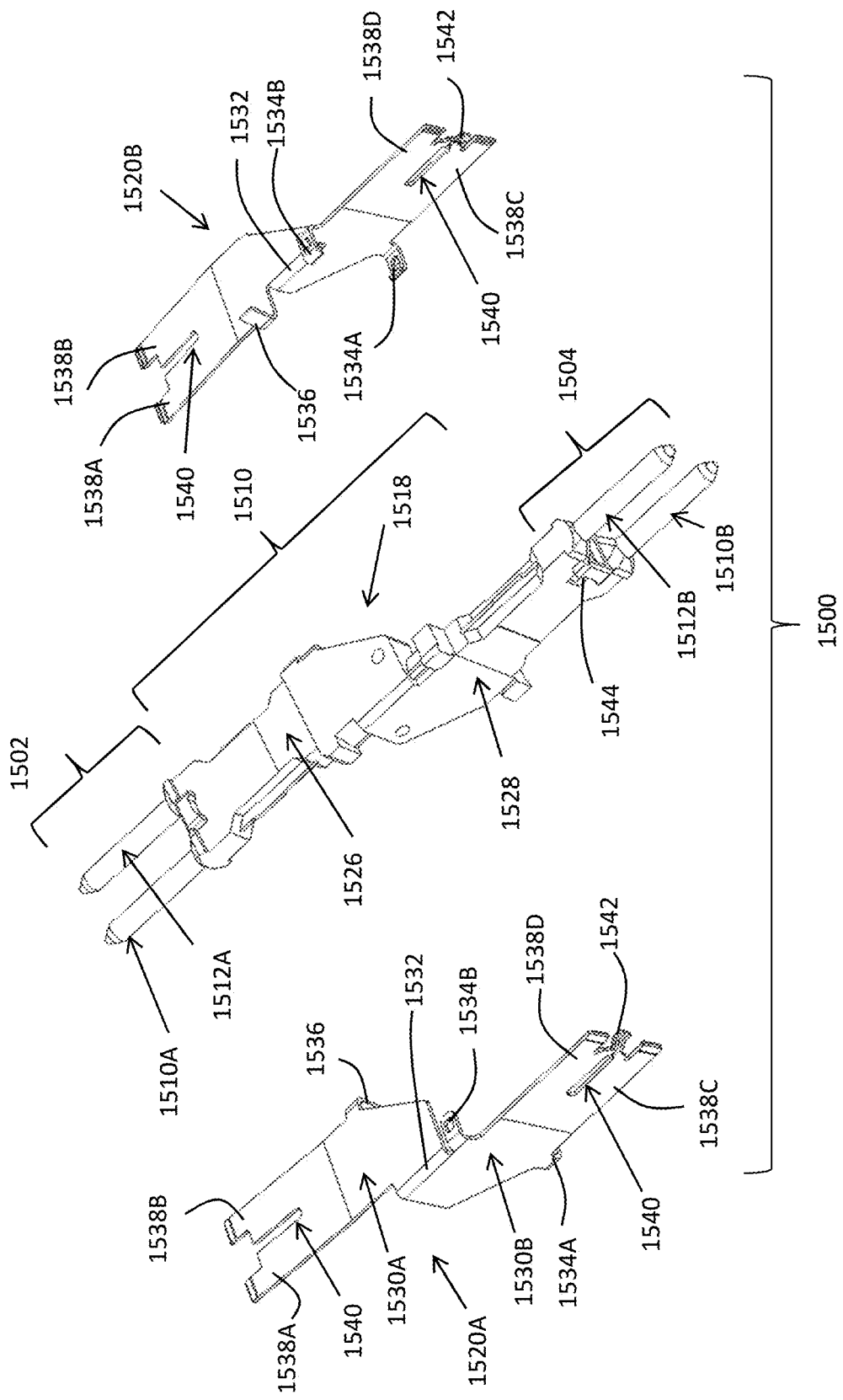
FIG. 13 is an isometric view, partially exploded, of the extender module of FIG. 11.

FIG. 13 shows an exploded view of an extender module 1500 and illustrates further details of the conductive shield elements 1520A and 1520B. The shield elements are shaped to conform to the insulating material 1518. As illustrated, the first shield element 1520A is configured to cover an outer surface of the extender module, and the second shield element 1520B is configured to cover an inner surface. In particular, the shield elements include first and second planar portions 1530A and 1530B shaped to attach to planar regions 1526 and 1528, respectively, and the planar portions are separated by a 90° bend 1532 such that the planar portions are orthogonal. The shield elements further include retention clips 1534A and 1534B, and tabs 1536, each of which attach to a corresponding feature on the insulating material 1518 or an opposing shield element to secure the shield elements to the extender module.

In the illustrated embodiment, the conductive shield elements 1520A and 1520B include mating contact portions formed as four compliant beams 1538A . . . 1538D. When assembled (FIG. 11), two of the compliant beams 1538A and 1538B are adjacent the first end 1502 of the extender module 1500; the other two compliant beams 1538C and 1538D are adjacent the second end 1504. Each pair of compliant beams is separated by an elongated notch 1540.

In some embodiments, the conductive shield elements 1520A and 1520B may have the same construction at each end, such that shield elements 1520A and 1520B may have the same shape, but a different orientation. However, in the embodiment illustrated shield elements 1520A and 1520B have a different construction at the first end 1502 and second end , respectively, such that shield elements 1520A and 1520B have different shapes. For example, as illustrated in FIG. 13, the compliant beams 1538C and 1538D adjacent the second end include fingers 1542 which are received in a corresponding pocket 1544. The fingers and pocket are constructed and arranged to introduce a pre-loading in the compliant beams which may aid in providing a reliable mating interface. For example, the pre-loading may cause the compliant beams to curve or bow outward from the extender module to promote mating contact as the second end of the extender module is received in a corresponding connector module.

Figure 14:
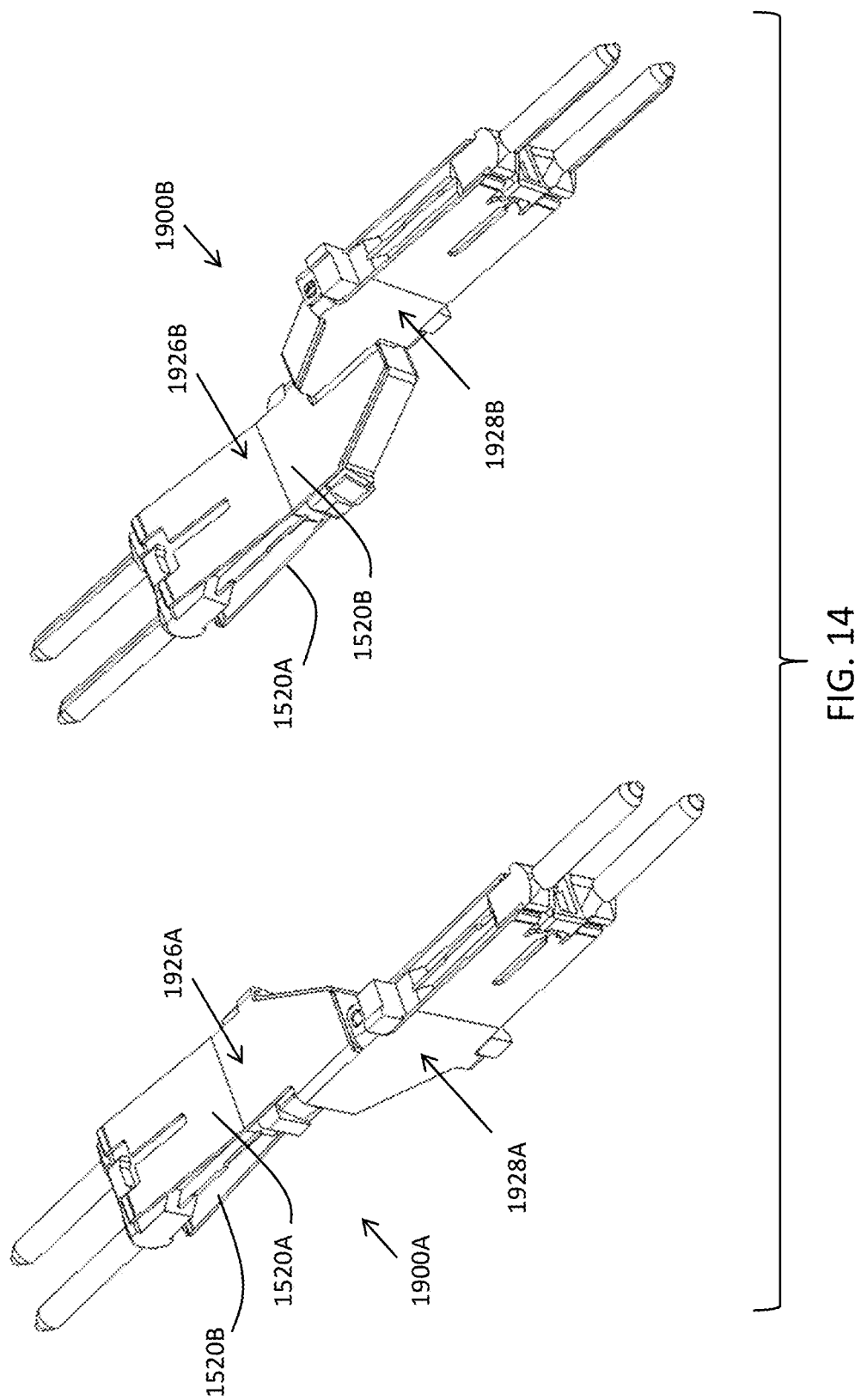
FIG. 14 is an isometric view of two extender modules, oriented with 180 degree rotation.
Figure 15B:
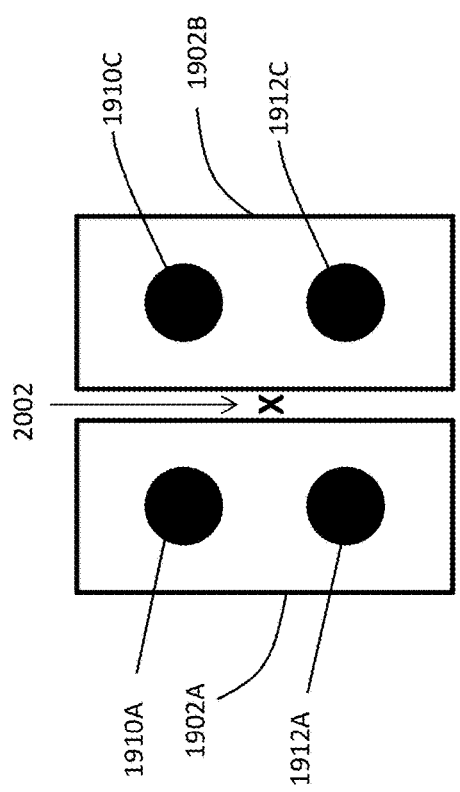
FIG. 15B is a schematic representation of one end of the assembly of FIG. 15A taken along line B-B.
Figure 15C:
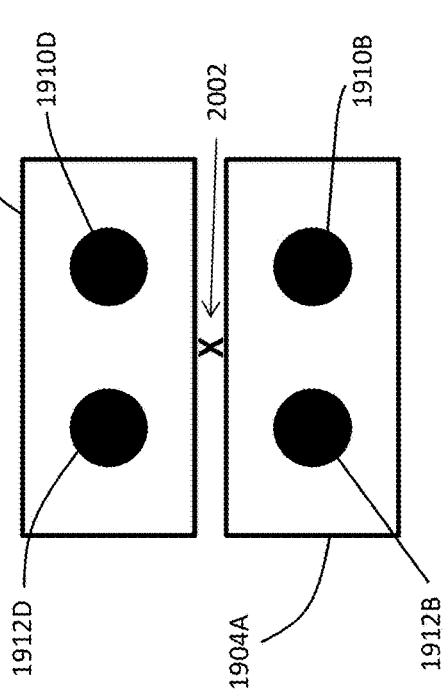
FIG. 15C is a schematic representation of one end of the assembly of FIG. 15A taken along line C-C.
Figure 15A:
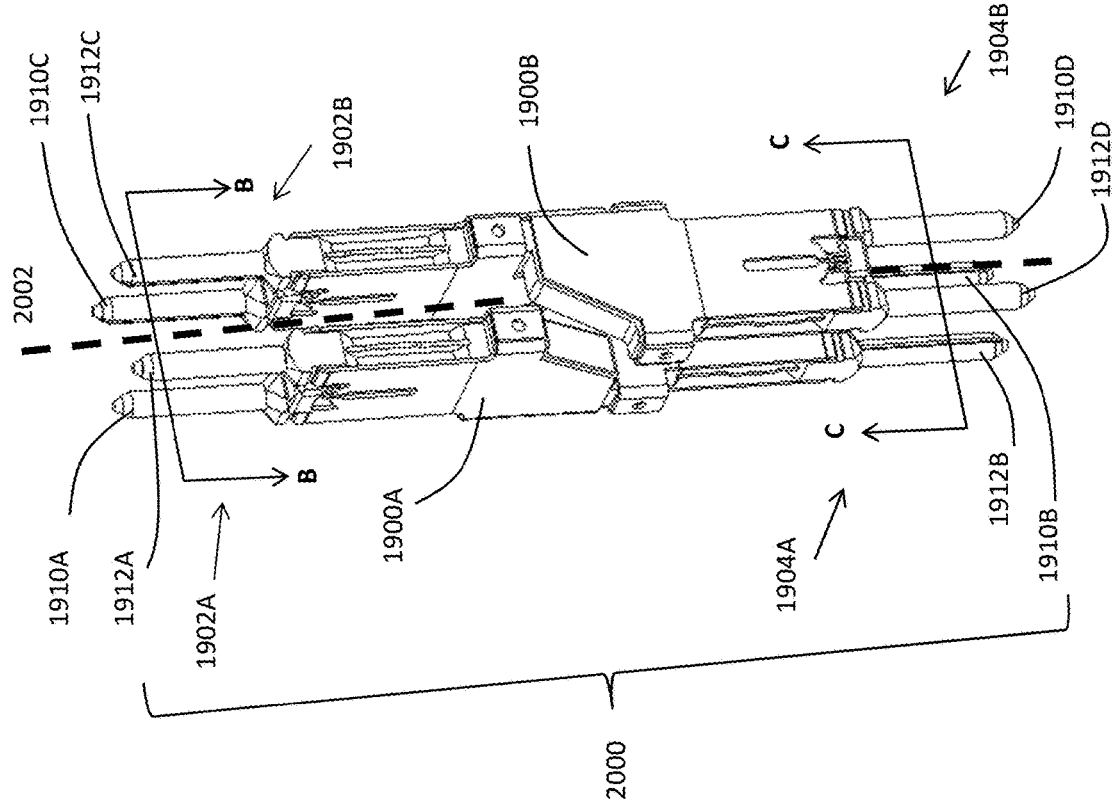
FIG. 15A is an isometric view of an assembly of the two extender modules of FIG. 14.

Referring now to FIG. 14, two identical extender modules 1900A and 1900B are illustrated rotated 180° with respect to each other along a longitudinal axis of each module. As described in more detail below, the extender modules are shaped such that two modules may interlock when rotated in this manner to form a an extender module assembly 2000 (FIG. 15A). When interlocked in this manner, the first and second planar portions 1926A and 1928A on the first module are adjacent and parallel to the first and second planar portions 1926B and 1928B, respectively, on the second module.

FIG. 15A shows an extender module assembly including the two extender modules 1900A and 1900B of FIG. 14. As illustrated, the mating portions of the signal conductors 1910A . . . 1910D and 1912A . . . 1912D form two square arrays of mating contacts at the ends of the assembly. FIGS. 15B-15C illustrate schematic top and bottom views of the square arrays, respectively, and show the relative orientations of the mating portions of each signal conductor in the extender modules. In the depicted embodiment, the assembly has a center line 2002 parallel to a longitudinal axis of each extender module, and the center of each of the square arrays is aligned with the center line.

Figure 16:
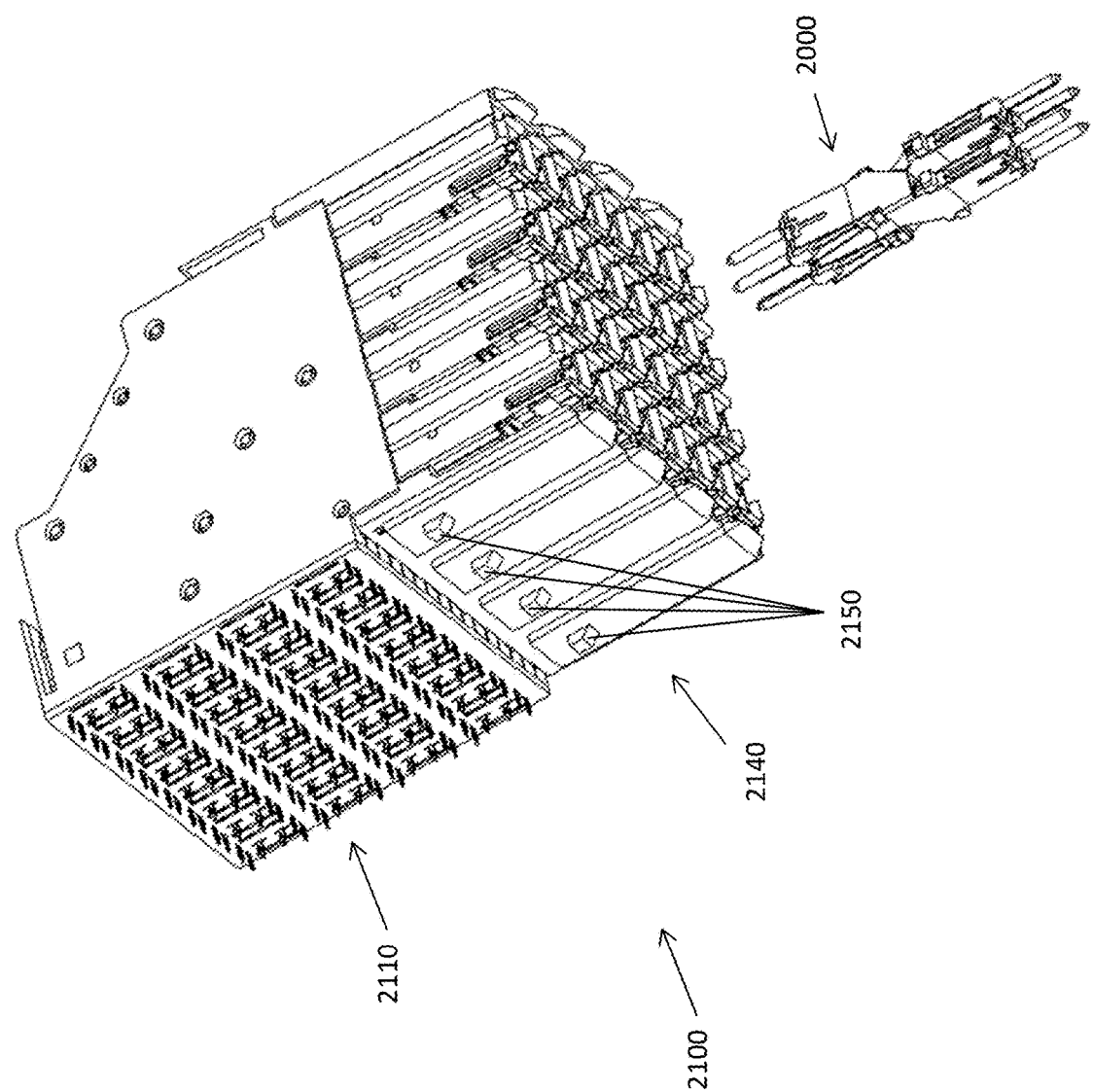
FIG. 16 is an isometric view of a connector and the assembly of extender modules of FIG. 15A.

FIG. 16 illustrates one embodiment of an orthogonal connector 2100 during a stage of manufacture. Similar to daughtercard connector 600, the orthogonal connector is assembled from connector modules and includes contact tails 2110 extending from a surface of the connector adapted for mounting to a printed circuit board. However, the connector 2100 further includes a front housing 2140 adapted to receive a plurality of extender modules. The front housing also includes retaining features 2150 to engage with corresponding features on an extender shell 2300, as described below. As shown, assemblies 2000 of extender modules may be simply slid into the front housing to facilitate simple assembly of a connector 2100.

FIG. 16 shows two, interlocked extender modules being inserter into the connector components. Inserting a pair of extender modules already interlocked avoids complexities of interlocking the extender modules after one is already inserted, but it should be appreciated that other techniques may be used to assemble the extender modules to the connector components. As an example of another variation, multiple pairs of extender modules may be inserted in one operation.

Figure 17B:
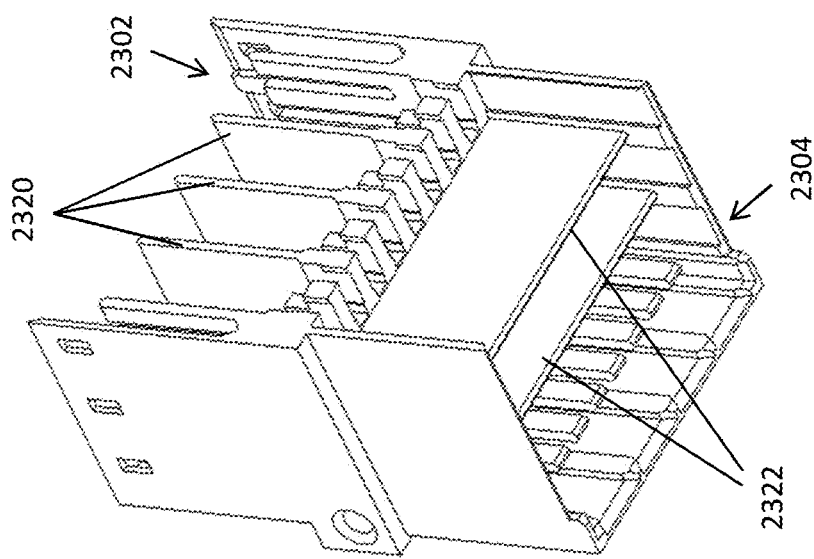
FIG. 17B is a perspective view, partially cut away, of the extender shell of FIG. 17A.
Figure 17A:
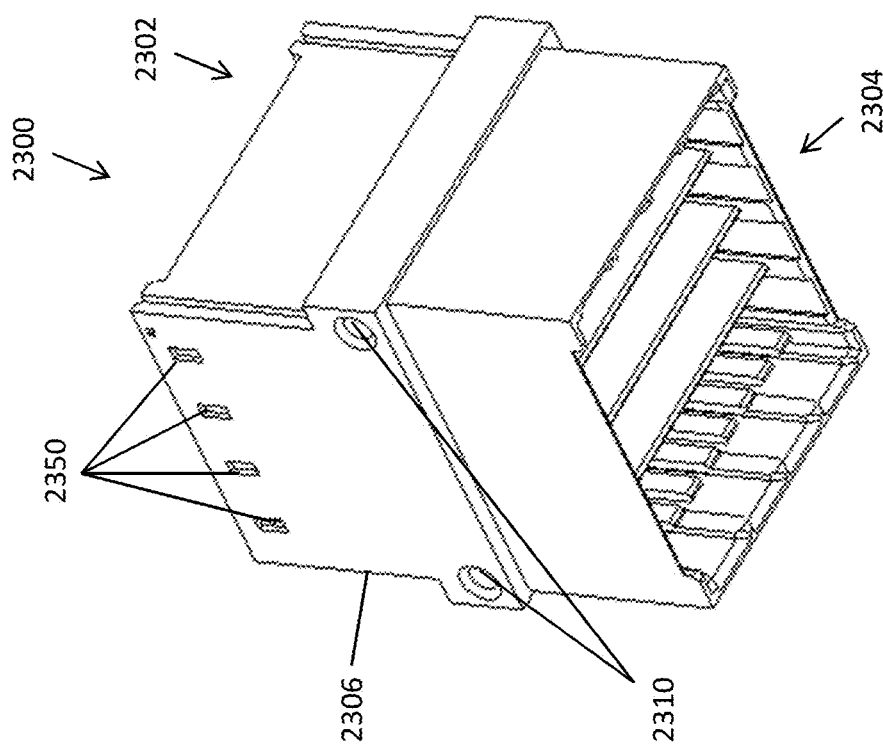
FIG. 17A is an isometric view of an extender shell.

FIG. 17A depicts one embodiment of an extender shell 2300 for use with a direct attach orthogonal connector. The extender shell has a first side 2302 adapted to attach to the front housing 2140 of an orthogonal connector 2100. As shown, the first side includes cutouts 2350 in the outer wall 2306 adapted to engage with the retaining features 2150 on front housing 2140. As discussed below, the second side 2304 of the extender shell is configured for separable mating with a daughtercard connector (e.g., a RAF connector). Further, the extender shell includes mounting holes 2310 which may be used to attach the extender shell to additional components of an interconnection system, such as a printed circuit board. A cross-sectional view of the extender shell is shown in FIG. 17B. Similar to the backplane connector 200, the extender shell includes lossy or conductive dividers 2320 and 2322 disposed in the first and second side of the extender shell, respectively.

Figure 18B:
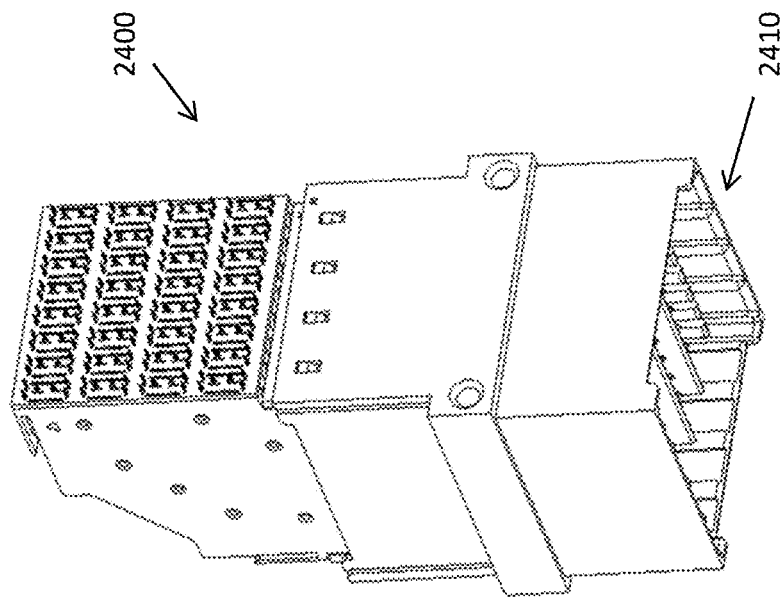
FIG. 18B is an isometric view of an assembled orthogonal connector.
Figure 18A:
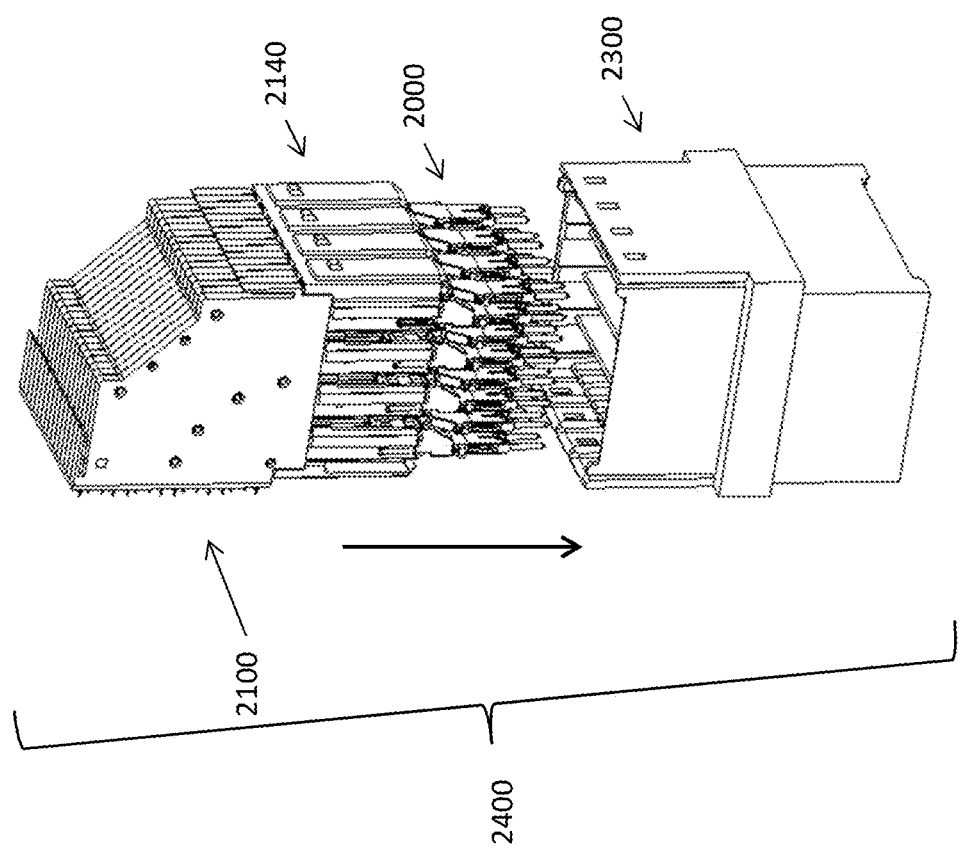
FIG. 18A is an isometric view, partially exploded, of an orthogonal connector.

Referring now to FIGS. 18A-18B, a direct attach connector 2400 includes an orthogonal connector 2100 having a front housing 2140 adapted to engage with an extender shell 2300. A plurality of extender modules are arranged as assemblies 2000 with shielded signal contacts positioned in square arrays, and the first ends of the extender modules are received in the front housing. As illustrated, the extender shell is placed over the extender modules and then secured to form connector 2400; the connector includes a mating end 2410 which may attach and mate with a connector such as daughtercard connector 600 on an orthogonal printed circuit board, as discussed below.

Figure 19:
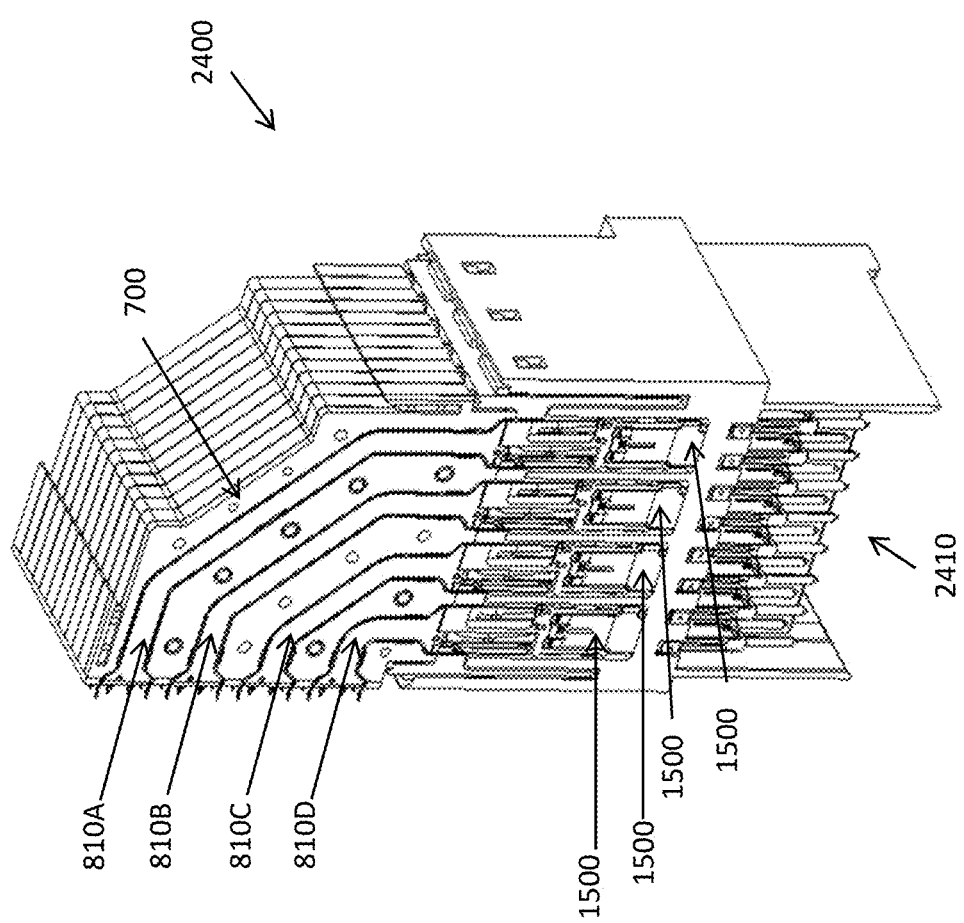
FIG. 19 is a cross-sectional view of the orthogonal connector of FIG. 18B.

FIG. 19 is a cross-sectional view of the assembled connector 2400. The mating ends of the extender modules 1500 are received in corresponding connector modules 810A . . . 810D on wafers 700. In the depicted embodiment, the extender modules are disposed within the extender shell. Further, the mating contact portions of the extender modules that are mated with the connector modules are orthogonal to the mating contact portions that extend into the mating end 2410 of the connector such that the connector may be used as a direct attach orthogonal connector.

Figure 20:
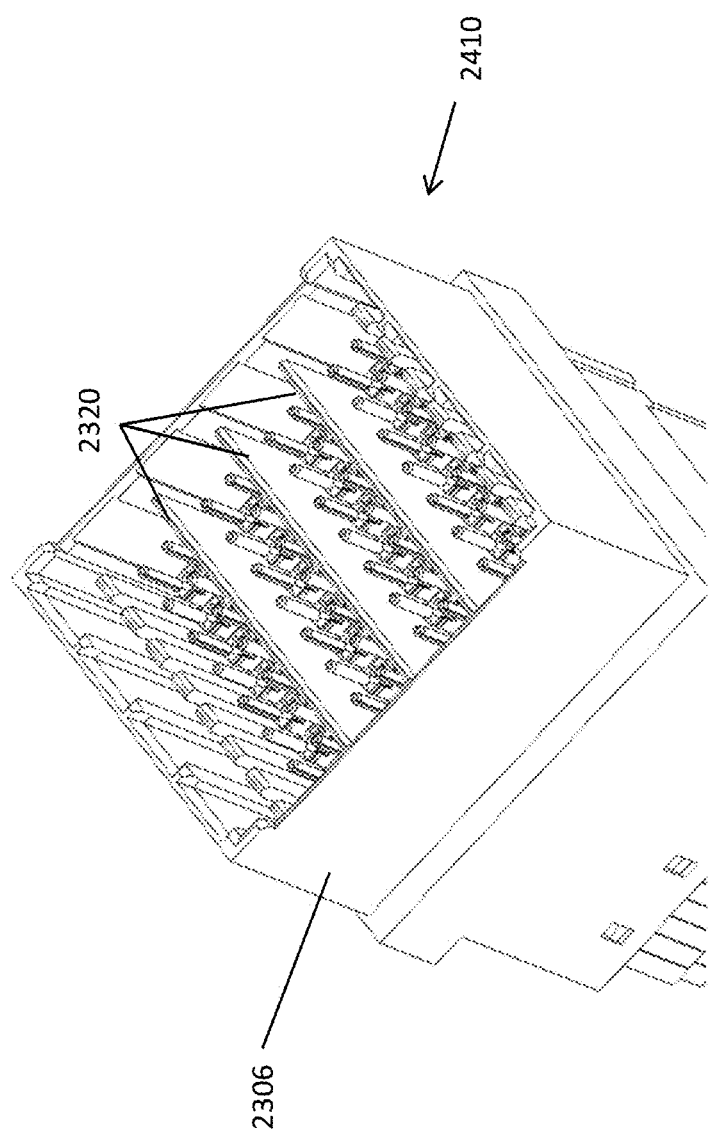
FIG. 20 is an isometric view of a portion of the orthogonal connector of FIG. 18B.

FIG. 20 is a detailed view of the mating end 2410 of the connector 2400. The pins forming the mating contact portions of the extender modules are organized in an array of differential signal pairs, forming a mating interface. As discussed above, lossy or conductive dividers 2320 separate rows of signal pins.

Figure 21:
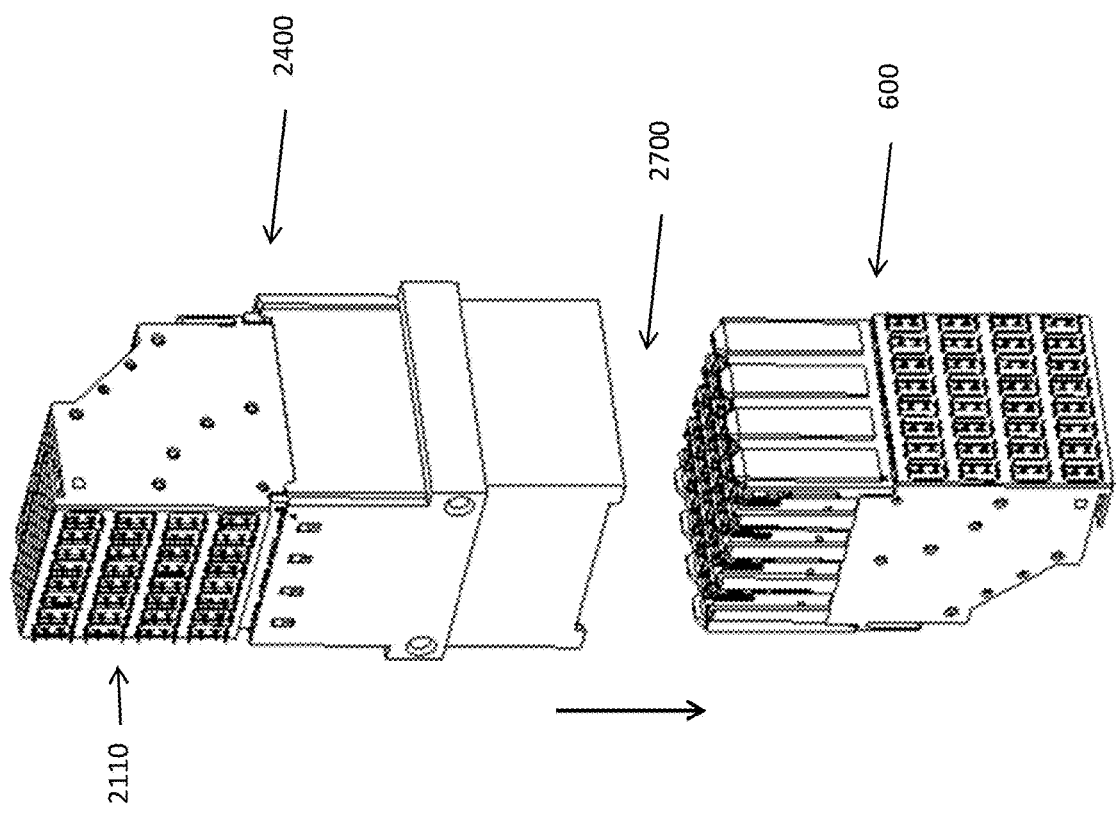
FIG. 21 is an isometric view, partially exploded, of an electronic system including the orthogonal connector of FIG. 18B and the daughtercard connector of FIG. 4.

FIG. 21 depicts one embodiment of an assembled orthogonal connector 2400 that may directly attach to a RAF connector such as daughtercard connector 600 via a separable interface 2700. As shown, the contact tails 2210 of the connector 2400 are oriented orthogonally to the contact tails 610 of the daughtercard connector 600. In this manner, printed circuit boards (not shown for simplicity) to which the connectors may be attached by their contact tails may be oriented orthogonally. It should be understood that although one orthogonal configuration for the connectors 2400 and 600 is depicted, in other embodiments, the daughtercard connector may be rotated 180° to form a second orthogonal configuration. For example, the depicted configuration may correspond to a 90° rotation of connector 600 relative to connector 2400, and a second orthogonal configuration (not depicted) may correspond to a 270° rotation.

Figure 22:
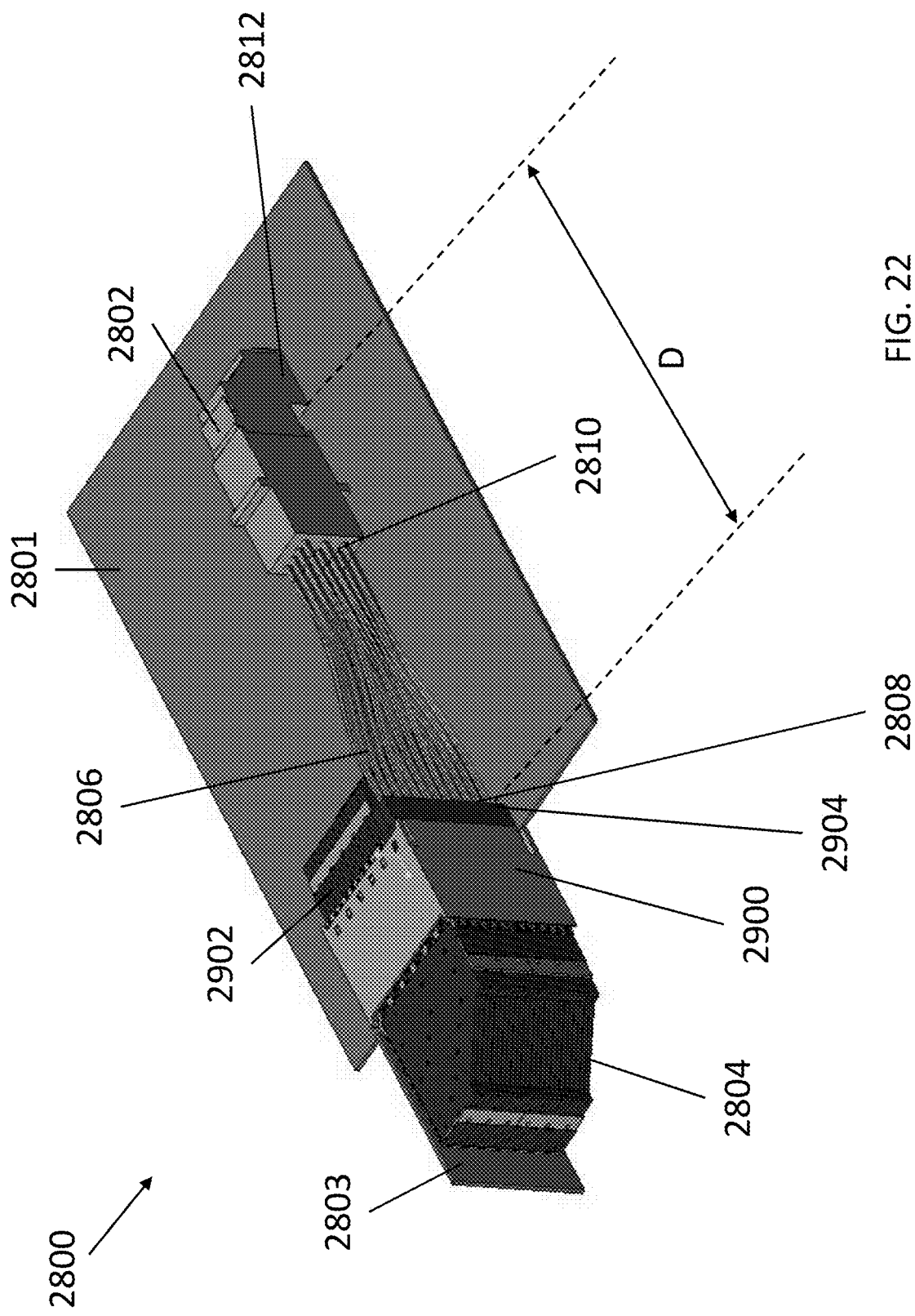
FIG. 22 is an isometric view of an illustrative electrical interconnection system, according to some embodiments.

An orthogonal configuration, as illustrated in FIG. 21, creates signal paths to a printed circuit board through a connector attached to an edge of a board. That connector is attached to the board at a footprint. Traces "breakout" of that footprint and are routed to other points on the board where they connect to other components. In this way, signals may be routed through a connector to a component anywhere on the board. However, in some scenarios, the board will be large enough that the distance between the connector and the component that receives a signal is long, such as greater than six inches. These long traces may undesirably degrade a signal carried on such a trace. FIG. 22 illustrates a configuration in which long traces are avoided, by facilitating integration of cables to carry signal over long distances.

FIG. 22 illustrates an electrical interconnection system 2800 including connectors 2802, 2804, 2900, cables 2806, and printed circuit boards (PCBs) 2801, 2803. Connector 2900 may include first type connector units 2902 and second type connector units 2904. The first type connector units may be directly mounted to PCB 2801. The second type connector units may be coupled to PCB 2801 through cables 2806. In the embodiment illustrated, cables 2806 connect to connector 2802, which in turn makes connections to PCB 2801. In the illustrated example, connector 2900 includes two types of connector units, which, in this example, are a plurality of first type connector units and one second type connector unit. However, the present invention is not limited in this regard. In some embodiments, a connector may include more than two types of connector units, for example, three types, four types, or more. It should also be appreciated that a connector may include any suitable number of any type connector units. Connector 2804 may be mounted to PCB 2803 at one end and mate with connector 2900 on the other end such that PCB 2803 is orthogonal to PCB 2801.

Cables 2806 may have first ends 2808 attached to the second type connector units 2904 and second ends 2810 attached to connector 2802, through which the cables are coupled to PCB 2801. The second ends of the cables may be coupled to PCB 2801 at a location spaced from the first ends of the cables with a distance D. Any suitable value may be selected for the distance D. In some embodiments, D may be at least 6 inches, in the range of 1 to 20 inches, or any value within the range, such as between 6 and 20 inches. However, the upper limit of the range may depend on the size of PCB 2801, and the distance from connector 2900 that components (not shown) are mounted to PCB 2801, as connector 2802 may be mounted near components that receive or generate signals that pass through cables 2806. As a specific example, connector 2802 may be mounted within 6 inches of those components, and in some embodiments, will be mounted within 4 inches of those components or within 2 inches of those components.

The inventors also have recognized and appreciated that the footprint of connector 2900 on PCB 2801 is a combination of the footprint of the first type connector units and the footprint of the second type connector units. At the mounting location of the first type connector units, the connector footprint occupies less real estate on the board than the combined footprint, which frees layout areas for circuit traces and/or placing hold-down screws to enhance the retention forces. Alternatively or additionally, PCB 2801 may have fewer layers than would be required for routing out of the connector footprint all of the signals passing through the first type and the second type units. Further, there may be fewer restrictions on traces routed out of the footprint from the second type connector units. The footprint of the second type connector units on PCB 2801 is defined by the mounting end 2812 of connector 2802. The mounting end of connector 2802 may be configured for ease of routing with high signal integrity. For example, the footprint associated with mounting end 2812 may be spaced from the edge of the PCB 2801 such that traces may be routed out of that portion of the footprint in all directions. Further, the illustrative second connector unit 2904 in FIG. 22 is attached with 12 cables aligned in a column at the first ends. The column of cables are arranged to a 3×4 array at the second ends attached to the connector 2802. Such a configuration, or other configuration selected for mounting end 2812, may result in relatively short breakout regions that maintain signal integrity in connecting to an adjacent component in comparison to routing patterns that might be required were those same 12 signals routed out of a larger footprint formed by first type and second type units together.

Connector 2900 may be mated to any suitable type of connector. In some embodiments, mating connector 2804 may be an orthogonal connector, configured similarly to connector 600 illustrated in FIG. 4. In such an embodiment, connector 2900 may be a direct attach orthogonal connector. However, the present invention is not limited in this regard and connector 2900 may be used in a midplane configuration or any other suitable configuration. Moreover, a connector, such as connector 2900, with multiple types of units may be used in other configurations, such as a RAM or RAF configuration.

Figure 23B:
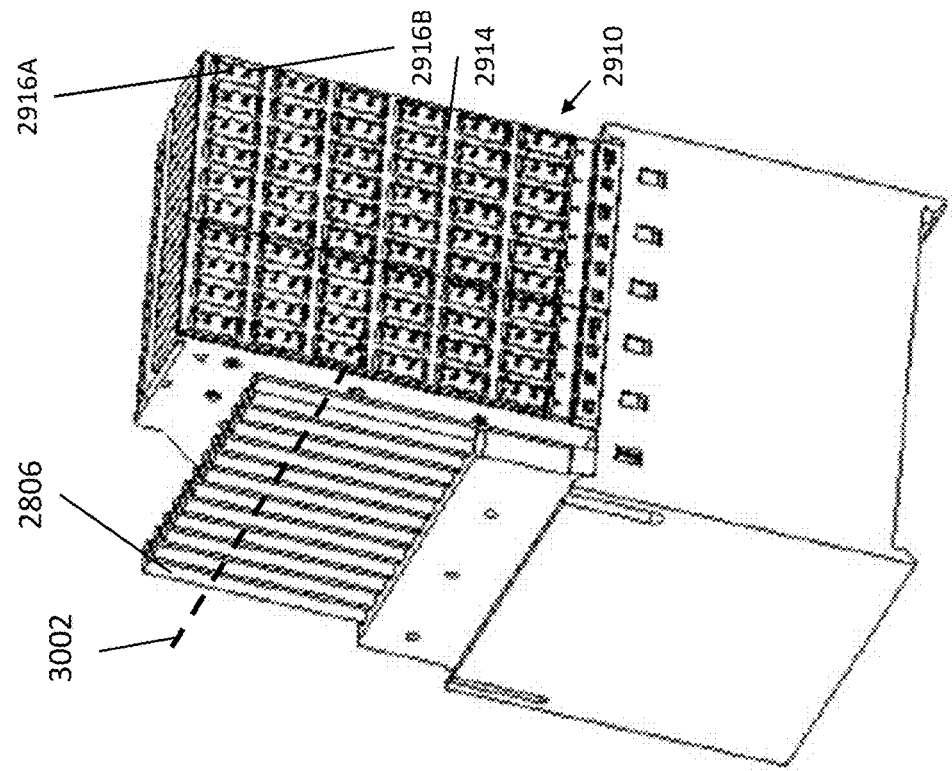
FIG. 23B is an isometric view of the connector of FIG. 23A, showing a mounting interface of the connector.
Figure 23A:
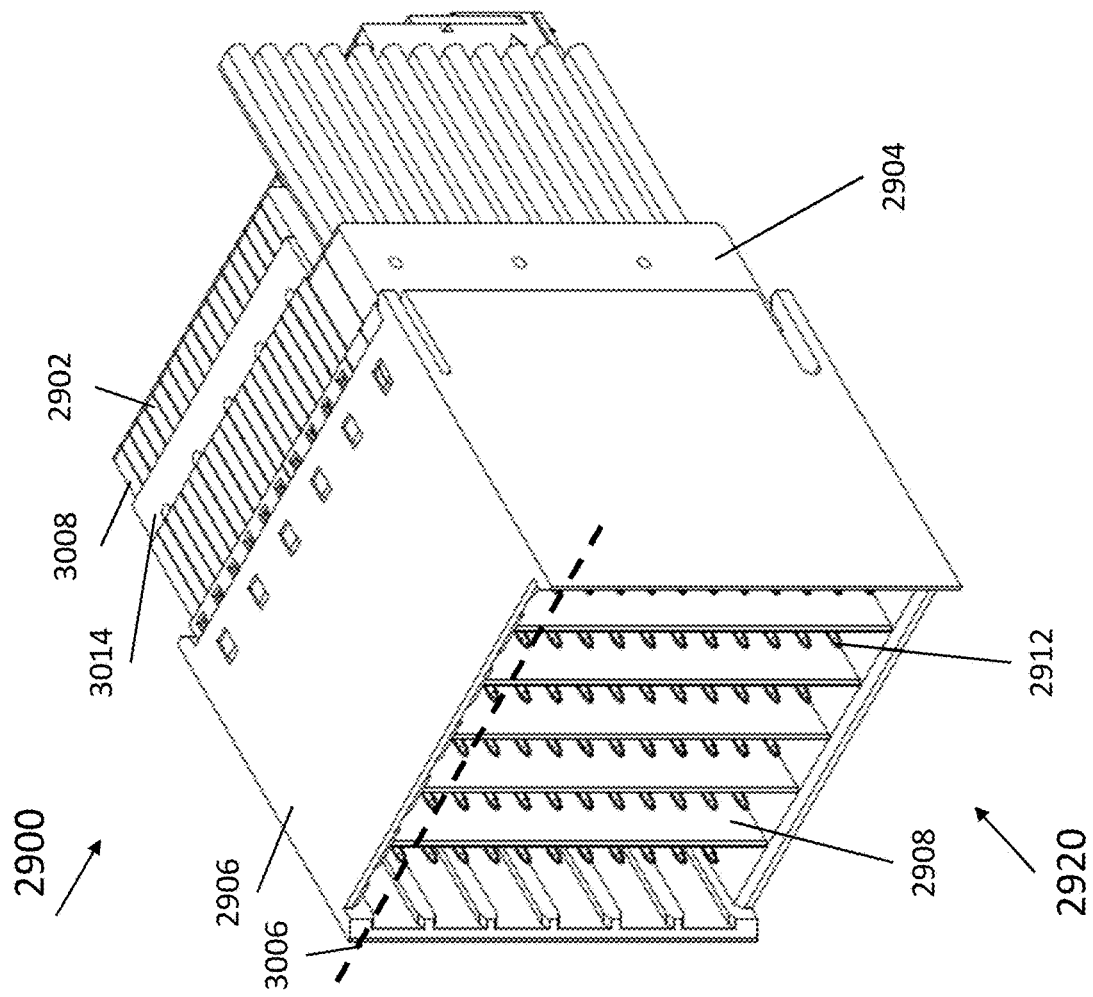
FIG. 23A is an isometric view of a connector of the electrical interconnection system of FIG. 22, showing a mating interface of the connector.

FIG. 23A-23B illustrate isometric views of connector 2900, looking from a mating interface 2920 and a mounting interface 2910 respectively. Connector 2900 may include an extender shell 2906 holding both the first type connector units 2902 and the second type connector unit 2904. The connector units may include signal conductors having mating contact portions 2912, contact tails 2914, and intermediate portions (not shown) that extend between the contact tails and the mating contact portions. The mating contact portions are shaped as pins in the illustrated embodiment. The pins are arranged to form pairs, with each pair extending parallel to direction 3006, and pairs aligned in column direction 3002, forming an array of pairs. The extender shell may include dividers 2908. The pairs of mating contact portions in each column may be separated by a divider.

In this example, the first type connector units 2902 include wafers 3008, which may be configured similar to a wafer 700 illustrated in FIG. 5. Rear portions of the wafers may be held by a support member 3014. In the illustrated embodiment, connector 2900 includes 10 wafers 3008. A wafer 3008 includes 6 wafer modules held by a housing made by two halves 3018A and 3018B. Each module includes a pair of differential signal conductors 2916A, 2916B.

As illustrated, for example in FIG. 16, the pairs of signal conductors within each of wafers 3008 may be aligned in column direction 3002. To achieve the orientation of pins at the mating interface illustrated in FIG. 24A, orthogonal extender modules, such as extender modules 2000 (FIG. 16) may be attached to the mating interfaces of the wafers 3008. FIGS. 24A-24E illustrate that connector 2900 may further include a plurality of extender modules 3010 attached to the mating ends of wafers 3008. The extender modules 3010 may be configured similar to the extender modules 1500 illustrated in FIGS. 11-13. Two identical extender modules 3010 may also form an extender module assembly 3012 similar to the extender module 2000 illustrated in FIGS. 15A-15B.

A plurality of wafers and a plurality of extender modules may be held by one or more support members 3004. In the embodiment illustrated, support members 3004 are implemented as at least two separate components 2902A and 2902B. However, any suitable number and shape of components may be used to form a support member. Additional components, for example, may hold the wafers at an opposing surface and/or at the sides of the structure shown. Alternatively or additionally, support member 3004 may be a housing, having an opening receiving and securing the wafers.

Figure 24A:
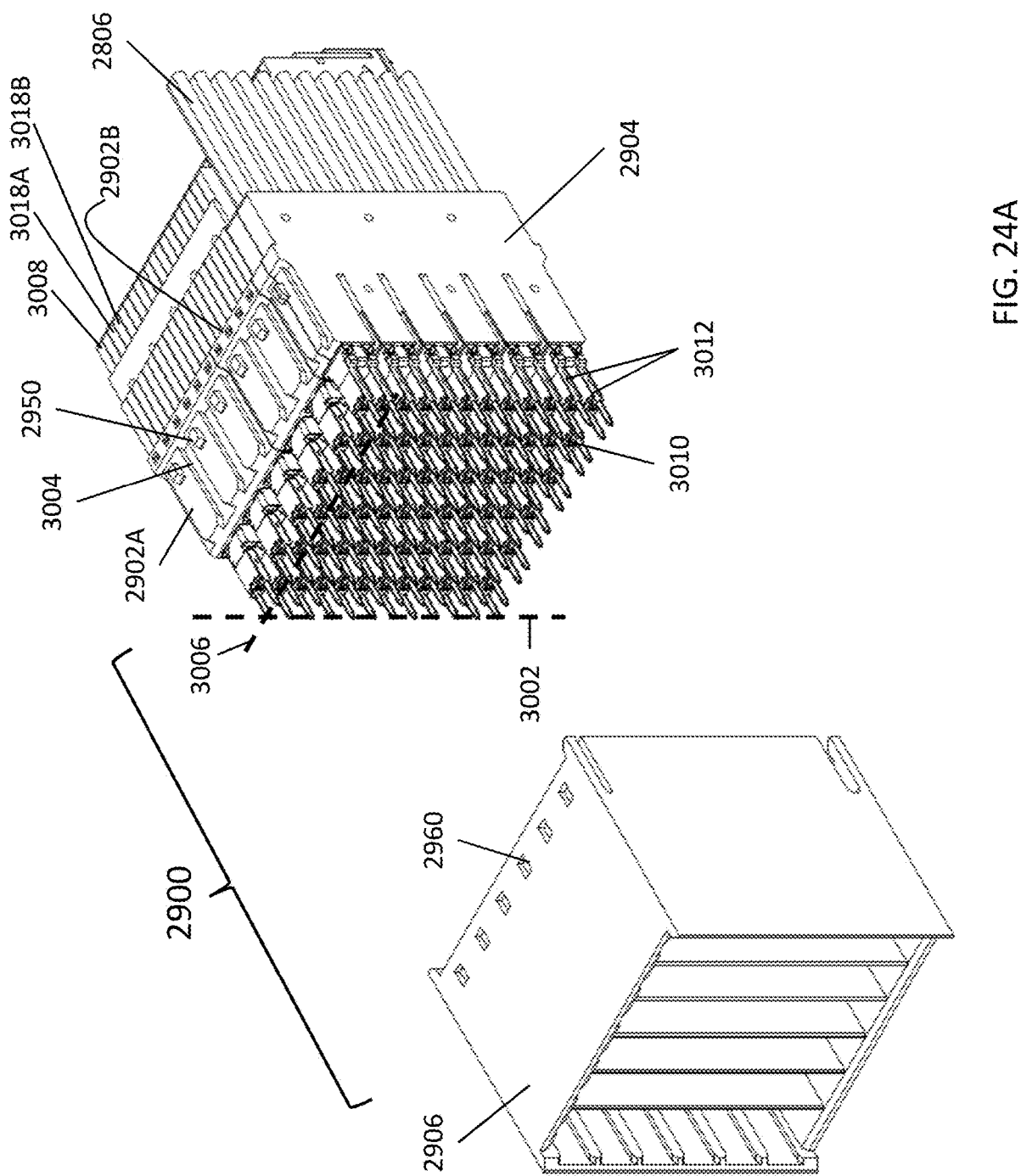
FIGS. 24A-24C are isometric views, partially exploded, of the connector of FIG. 23A.
Figure 24B:
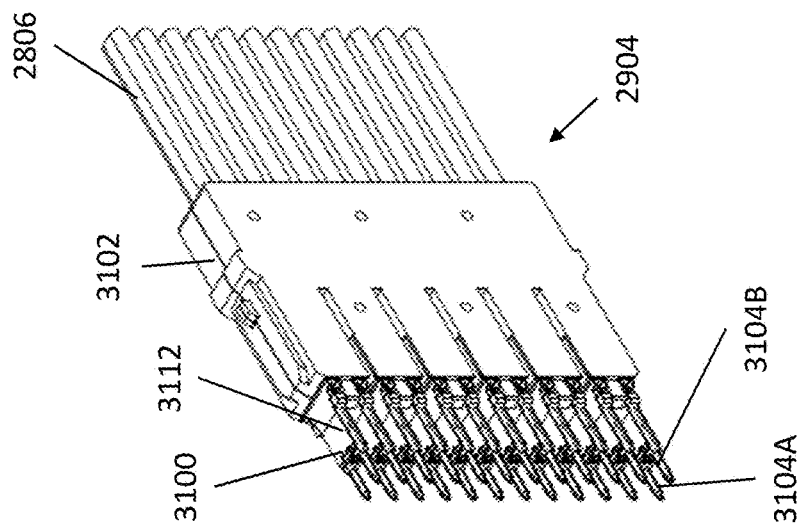
Figure 24B:
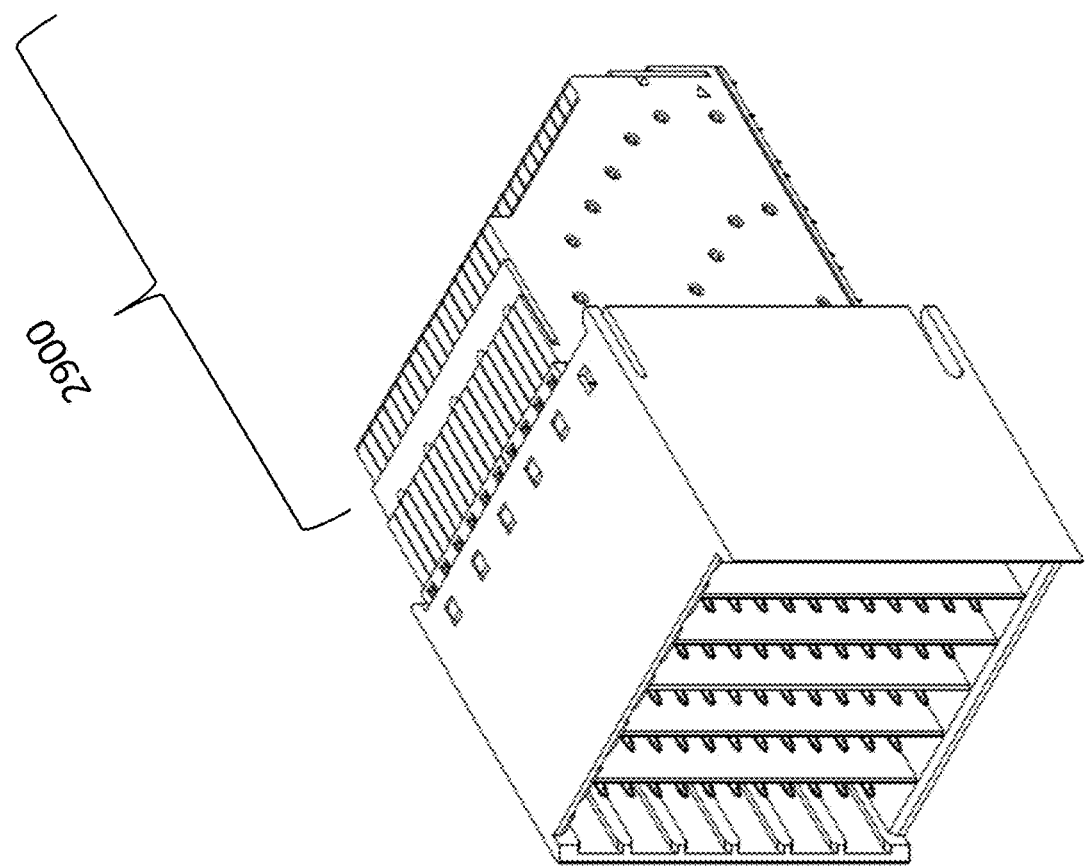
Figure 24C:
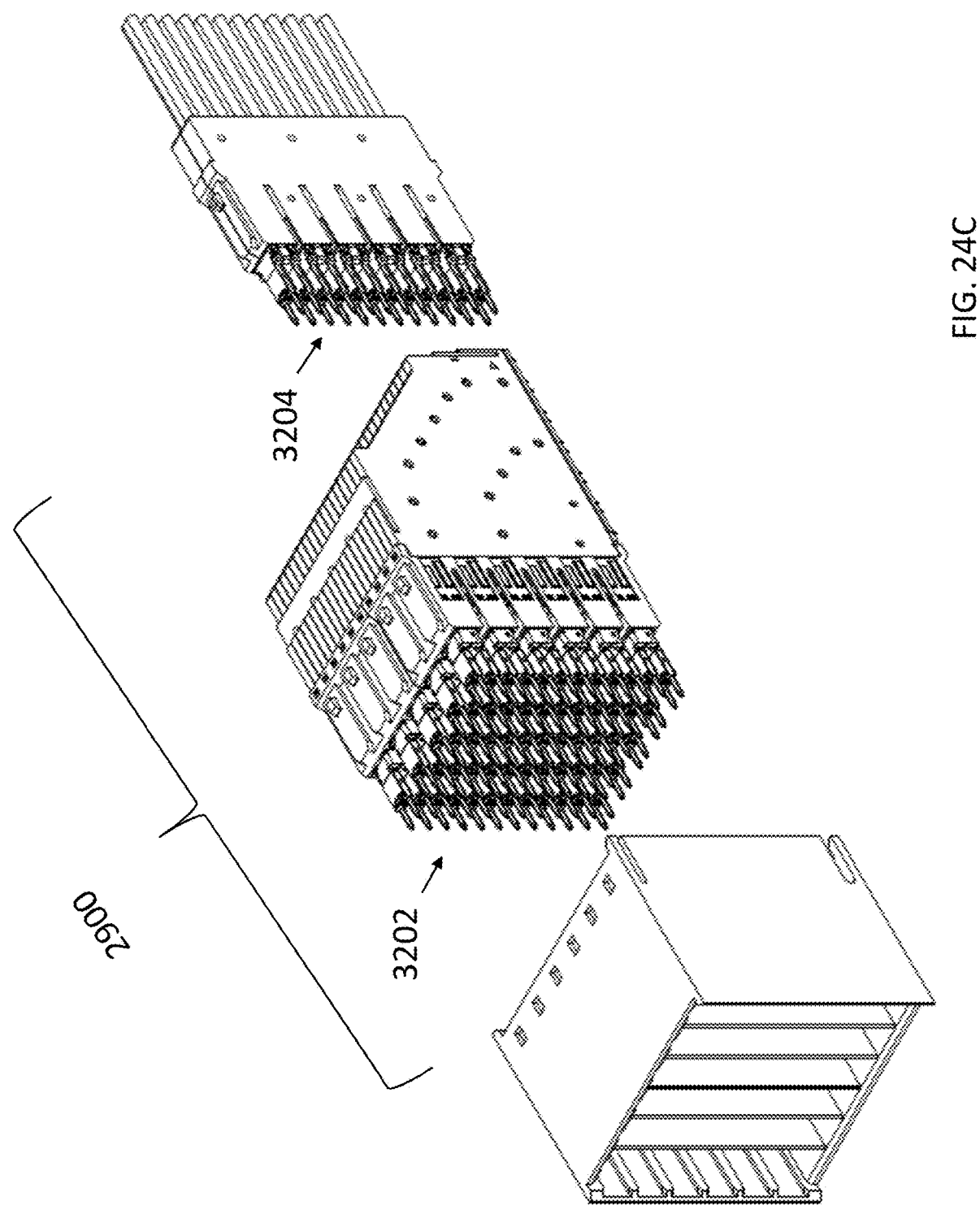
Figure 24E:
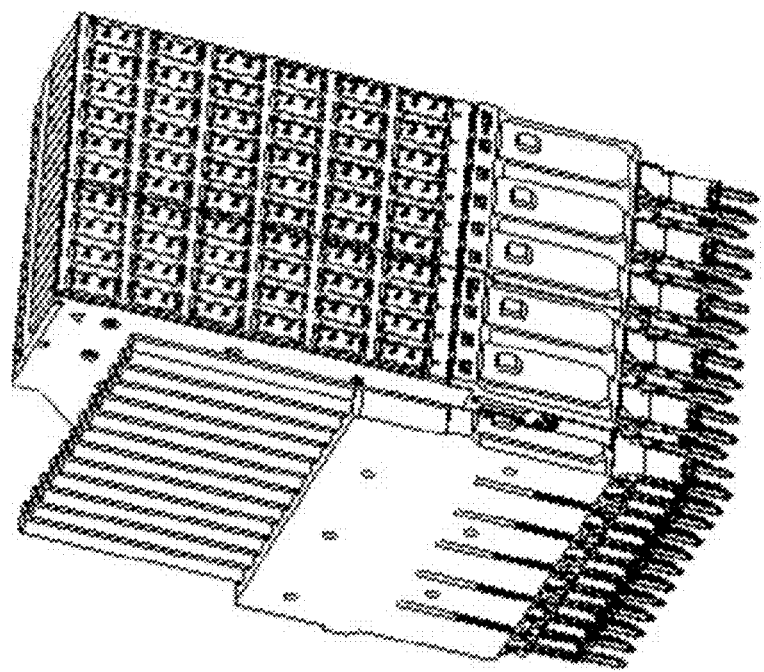
FIG. 24E is an isometric view of connector units of the connector of FIG. 23B.
Figure 24D:
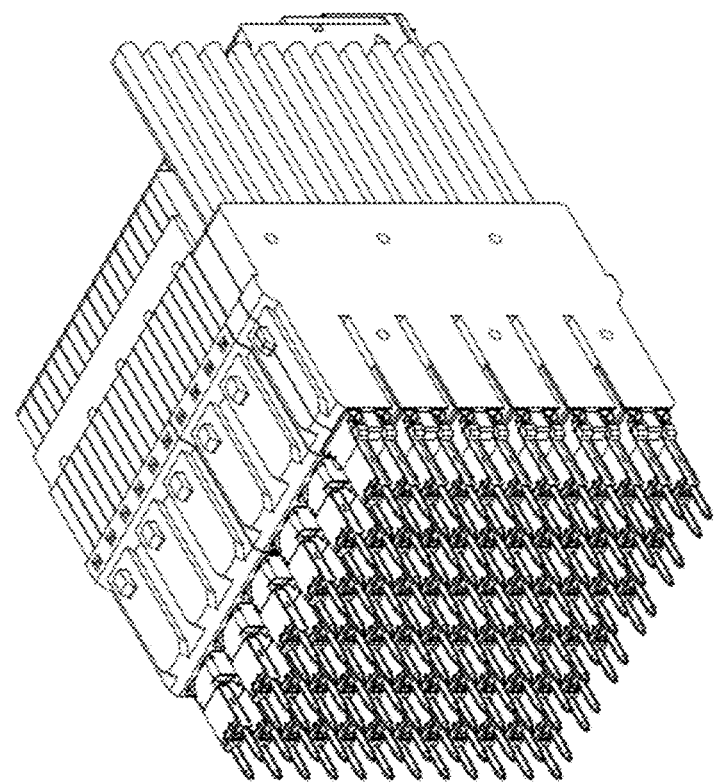
FIG. 24D is an isometric view of connector units of the connector of FIG. 23A.

In the embodiment of FIG. 24A, member 2902A holds six wafers and member 2902B holds four wafers. The wafers held by 2902A are collectively attached to 24 extender modules 3010, and the wafers attached to member 2902B are collectively attached to 36 extender modules 3010. As each column of extender modules attaches to two wafers, those two wafers, and attached extender modules, may be regarded as a first type "unit," and a connector may be formed with any suitable number of such units.

However, it should be appreciated that each first type connector unit may be a subassembly of any suitable number of components to implement any suitable number of columns of conductive elements or may be implemented as a single component or in any other suitable way. Using wafers and extender modules as illustrated, each first type connector unit may be formed from a multiple of two wafers, such as two, four, six or eight wafers and a multiple of that number of extender modules, the multiple being equal to the number of signal conductors in one wafer, but the application is not limited in this regard If multiple units are used, the connector units may be held together by a support member. In the embodiment illustrated, extender shell 2906 acts as a support member. The support member 3004 may include retaining features 2950 to engage with corresponding features 2960 on the extender shell 2906. It should be appreciated, however, that support members 3004 may, in some embodiments, may be omitted, if wafers are attached directly to extender shell 2906 or, if other supporting structures are used to hold the components of the connector together.

In FIGS. 24A-24E, the mating contact portions of the wafers 3008 are covered by the support members 3004 and not shown. However, the mating contact portions may be configured similar to the mating contact portions of wafers 700 illustrated in FIG. 5. Each wafer module of a wafer 3008 may include a pair of differential signal conductors. The mating contact portions of the wafer modules may be configured as receptacles adapted to receive the first mating contact portions of the extender modules, which may be configured as pins. The mating contact portions of the wafer modules in a wafer may be aligned in the direction of column 3002. Adjacent wafer modules, each from one of the two wafers 3008 in a first type connector unit 2902, may receive first mating contact portions of an extender module assembly 3012. As a result, second mating contact portions of the extender module assemblies may form an array 3202, in which pairs of differential signal conductors may be aligned in a direction of column 3006 perpendicular to the direction of column 3002.

In the illustrated example, there is one second type unit 2904. To be complementary with the first type units, the illustrative second type unit 2904 includes 12 cables 2806 aligned in a direction of column 3002. Each second type unit 2904 may include a plurality of modules 3100 held by a unit housing 3102. The plurality of modules in a second type unit may be aligned in the direction of column 3002. Each module 3100 may include a module housing 3112 holding a pair of signal conductors 3104A, 3104B. The pair of signal conductors are separated in the direction of column 3006. The mating contact portions of the second type units may form an array 3204. The arrays 3202 and 3204 together may form the mating interface 2920 of the connector 2900.

The mating contact portions of the signal conductors are illustrated as pins. However, other configurations may be adopted, e.g., receptacles. The contact tails (not shown) of the signal conductors are attached with cables 2806. The attachment interface between the contact tails and the cables are protected by at least the unit housing. Each cable may include a pair of wires, each of which is attached to a respective contact tail of a pair of signal conductors of a module. In some embodiments, the cables may be twin-ax cables. A shield surrounding the conductors of the twin-ax cable may be attached to a shield surrounding the conductive elements in a respective module 3100. The unit housing 3102 may extend farther in the direction of cable length than support members 3004 such that the attachment interface between the modules 3100 and the cables 2806 are covered.

FIGS. 25A-25B illustrate isometric views of a second type connector unit with cables attached to form a cable assembly 3400. A cable assembly 3400 may include an assembly housing 3402 holding a plurality of cable assembly modules 3420. Here, housing 3402 is made from two halves 3402A and 3402B that are secured together, capturing modules 3420 between them. These components may be held together through the use of adhesive, interference fit, heat staking or other suitable way.

The housing 3402 and the modules 3420 may form a second type connector unit. In the embodiment illustrated, each of the modules 3420 has a pair of signal conductors, and the modules 3420 are arranged such that the second type connector unit has two columns of signal conductors.

FIG. 25C illustrates an isometric view of a cable assembly module 3420, which may include a module 3408 of a second type connector unit 3404 and a cable 3406. The module 3408 may include a pair of signal conductors 3410A, 3410B held by a module housing 3412. Module 3408 may provide a mating interface matching the mating interface provided by each extender module used in forming the first type connector units.

Conductors of the cables may be attached to signal conductors within modules 3408 in any suitable way. However, in accordance with some embodiments, the cable conductors may be attached to edges of the signal conductors so as to provide a conducting structure of substantially uniform thickness and/or substantially uniform spacing between the conductive elements. For example, the thickness, including both the thickness of the conductor of the cable, the signal conductor and any weld, solder or other material to fuse the two may be no more than 10% greater than the thickness of the stock used to form the signal conductor. In some embodiments, the variation in thickness between the cable attachment and the stock thickness may be less than 25% or less than 50%. More generally, the variation in thickness may be less than the variation that might result from a conventional approach of attaching the cable conductor at the broadside to connector signal conductor, which might increase the thickness of the conducting path by 100% or more. Likewise, the separation at the attachment location may be relatively small, such as differing from the separation at the mating interface by no more than 10%, or in some embodiments, no more than 5%.

Such a connection is illustrated in FIGS. 26A and 26B. FIG. 26A illustrates an isometric view of the pair of signal conductors 3410A, 3410B. Signal conductors 3410A, 3410B may represent signal conductors within a module 3408 or in any other cable connector. The signal conductors may include contact tails 3510, mating contact portions 3520, and intermediate portions 3530 that extend between the contact tails and the mating contact potions. The signal conductors may jog towards opposite directions in transition regions 3514, resulting a space s1 between the contact tails different from a space s2 between the intermediate portions and, in the embodiment illustrated, between the mating contact portions. In some embodiments, s1 may be larger than s2. The contact tails 3510 may include broadsides 3502 and edges 3504 joining the broadsides. The pair of signal conductors may be held with the contact tails in an edge-to-edge configuration, with an edge 3504A of signal conductor 3410A facing an edge 3504B of signal conductor 3410B. The mating contact portions 3520 may be configured as pins. In some embodiments, the pins may be made by rolling metal sheets.

FIG. 26B illustrates an isometric view of a cable 3406 attached to the pair of signal conductors 3410A, 3410B. The cable 3406 may include a pair of conductive elements 3510A, 3510B insulated by a dielectric portion 3512. Cable 3406 may additionally include a shield surrounding conductive elements 3510A, 3510B, which is not shown for simplicity. However, the shield may be attached to a shield or ground conductive in the cable connector.

Portions of the pair of conductive elements may be exposed out of the dielectric portion. The exposed portion of the conductive element 3510A may be attached to the edge 3504A of the signal conductor 3410A. The exposed portion of the conductive element 3510B may be attached to the edge 3504B of the signal conductor 3410B. The attachment may be made in any suitable way, such as by welding or brazing. For example, laser welding may be used. For example, a laser welding operation may be performed in which a laser is aimed in a path along the edge of the conductive element, fusing the wire in the cable to the edge of the conductive element as the laser's point of focus changes.

In some embodiments, the laser may be controlled to form a running fillet joint between each conductive element of the cable and the edge of the signal conductor in the connector. The inventors have found that such a joint may be more reliable and more repeatable than a weld through a wire. A suitable weld may be formed with a commercially available green laser, but any suitable welding equipment may be used.

Operations such as welding or brazing resulting in directly fusing the conductive elements of the cable to the conductive elements of the connector may avoid the bulk of conductive material that might be present if other attachment techniques, such as soldering, were used. Reducing the bulk of conductive material used for attachment may reduce changes in impedance, which can contribute to desirable electrical properties. However, in some embodiments, solder or other fusible material may be added to facilitate attachment.

Cable conductors may be attached to edges of conductive elements of any suitable shape in a connector. FIGS. 27A ... 27D illustrate a method of making a cable connector. FIG. 27A illustrates a plan view of a mounting interface 3640 between a structure 3630 and a cable 3606. FIG. 27B is an elevation view of the mounting interface 3640, illustrating the relatively small additional thickness at the attachment location. The structure 3630 may include a pair of signal conductors 3610A and 3610B joined by a tie bar 3602. The contact tails of the signal conductors may jog in opposite directions and away from the tie bar through transition regions 3614. The structure 3630 may be stamped from a sheet of metal, such that the dimensions of that structure may be accurately controlled by a stamping die.

The cable 3606 may include a pair of conductive elements 3620A, 3620B, each of which is attached to one of opposing edges of the signal conductors 3610A, 3610B. The pair of signal conductors 3610A and 3610B is spaced from each other by a distance dl to accommodate the cable 3606. The distance dl may be controlled by a width W of the tie bar 3602 and/or the degree of slopes in the transition regions 3614. This distance may be accurately controlled by the stamping.

FIG. 27C illustrates a plan view of a mounting interface 3642 between a structure 3630 and a cable 3606. FIG. 27C illustrates that an insulative housing 3650 has been molded over structure 3630. Housing 3650 may be molded using an insert molding operating or molded in any other suitable way. Tie bar 3602 has then been severed. In this configuration, conductive elements 3610A and 3610B have been separated. Spacing between conductive elements 3610A and 3610B is nonetheless maintained as both are embedded in housing 3650.

With tie bar 3602 severed, mating contacts 3604A and 3604B on conductive elements 3610A and 3610B may be formed to provide any suitable shape. Any suitable metal forming technique may be used. For example, the edges may be coined to provide mating contacts that are blades. Alternatively or additionally, the mating contacts may be rolled to provide mating contacts that are pins. As yet a further variation, the mating contacts may be shaped as single beam contacts, dual-beam contacts or multi-beam contacts. As a further alternative, separate components may be attached to conductive elements 3610A and 3610B, such as to form a multi-beam structure or to provide a receptacle.

The forming operations may leave mating contacts 3604A and 3604B spaced from each other by a distance d2, measured edge-to-edge. In the embodiment illustrated, d2 may approximate d1. For example, d2 may differ from d1 by 10% or less, or in some embodiments, 25% or 50% or less.

However, it is not a requirement that the separation between edges be uniform over the entire length of the contacts. The edges of the contacts at the attachment region may taper towards each other or may taper away from each other in a direction along the elongated axis of mating contacts 3604A and 3604B. Such a configuration may provide a gradual impedance transition from the cable the mating interface of the connector. Alternatively or additionally, the shape of the conductive elements 3610A and 3610B may vary over the length, such as to provide a wider or narrower width inside the housing relative to outside. As an example of a further variation, even if the opposing edges of conductive elements 3610A and 3610B are shaped to provide a uniform spacing d2 along the length of the conductive elements, the width of the conductive elements in the attachment may be controlled, even varying along the length of the conductive elements, by changing in the profile of the outer edges of conductive elements 3610A and 3610B. The outer edges, for example, may taper toward or away from each other.

Having thus described several embodiments, it is to be appreciated various alterations, modifications, and improvements may readily occur to those skilled in the art. Such alterations, modifications, and improvements are intended to be within the spirit and scope of the application.

Accordingly, the foregoing description and drawings are by way of example only. Various changes may be made to the illustrative structures shown and described herein. For example, a method of manufacturing a module for a cable connector was described in connection with FIGS. 27A ... 27D. Steps of the method may be performed in an order other than as described. Cable conductors may be attached after a housing a formed and/or after a time bar is severed.

As another example, conductive elements in a cable, such as conductive elements 3620A and 3620B, may be shaped before or after attachment to signal conductors, such as signal conductors 3610A and 3610B, respectively. In some embodiments, the conductive elements within the cable may be mechanically deformed by pressing them against the signal conductors. Such an operation may strengthen the joint between the conductive elements and the signal conductors once those components are fused. Alternatively or additionally, the conductive elements from the cable may be flattened, to form opposing surfaces parallel to the broadsides of the signal conductors. Such a flattening operation may improve electrical performance by reducing variation in thickness of the conducting path. Alternatively or additionally, the conductive elements from the cable may be flattened, to form one or more planar surfaces perpendicular to the broadsides of the signal conductors. Such a shape may aid in attachment of the conductive elements to the signal conductors and/or provide more precise control of the separate between the signal paths.

As another example, techniques are described for improving signal quality at the mating interface of an electrical interconnection system. These techniques may be used alone or in any suitable combination. Furthermore, the size of a connector may be increased or decreased from what is shown. Also, it is possible that materials other than those expressly mentioned may be used to construct the connector. As another example, connectors with four differential signal pairs in a column are used for illustrative purposes only. Any desired number of signal conductors may be used in a connector.

As another example, an embodiment was described in which a different front housing portion is used to hold connector modules in a daughtercard connector configuration versus an orthogonal configuration. It should be appreciated that, in some embodiments, a front housing portion may be configured to support either use.

Manufacturing techniques may also be varied. For example, embodiments are described in which the daughtercard connector 600 is formed by organizing a plurality of wafers onto a stiffener. It may be possible that an equivalent structure may be formed by inserting a plurality of shield pieces and signal receptacles into a molded housing.

As another example, connectors are described that are formed of modules, each of which contains one pair of signal conductors. It is not necessary that each module contain exactly one pair or that the number of signal pairs be the same in all modules in a connector. For example, a 2-pair or 3-pair module may be formed. Moreover, in some embodiments, a core module may be formed that has two, three, four, five, six, or some greater number of rows in a single-ended or differential pair configuration. Each connector, or each wafer in embodiments in which the connector is waferized, may include such a core module. To make a connector with more rows than are included in the base module, additional modules (e.g., each with a smaller number of pairs such as a single pair per module) may be coupled to the core module.

Furthermore, although many inventive aspects are shown and described with reference to a orthogonal connector having a right angle configuration, it should be appreciated that aspects of the present disclosure is not limited in this regard, as any of the inventive concepts, whether alone or in combination with one or more other inventive concepts, may be used in other types of electrical connectors, such as backplane connectors, daughterboard connectors, midplane connectors, cable connectors, stacking connectors, mezzanine connectors, I/O connectors, chip sockets, etc.

In some embodiments, contact tails were illustrated as press fit "eye of the needle" compliant sections that are designed to fit within vias of printed circuit boards. However, other configurations may also be used, such as surface mount elements, spring contacts, solderable pins, etc., as aspects of the present disclosure are not limited to the use of any particular mechanism for attaching connectors to printed circuit boards.

Further, signal and ground conductors are illustrated as having specific shapes. In the embodiments above, the signal conductors were routed in pairs, with each conductive element of the pair having approximately the same shape so as to provide a balanced signal path. The signal conductors of the pair are positioned closer to each other than to other conductive structures. One of skill in the art will understand that other shapes may be used, and that a signal conductor or a ground conductor may be recognized by its shape or measurable characteristics. A signal conductor in many embodiments may be narrow relative to other conductive elements that may serve as reference conductors to provide low inductance. Alternatively or additionally, the signal conductor may have a shape and position relative to a broader conductive element that can serve as a reference to provide a characteristic impedance suitable for use in an electronic system, such as in the range of 50-120 Ohms. Alternatively or additionally, in some embodiments, the signal conductors may be recognized based on the relative positioning of conductive structures that serve as shielding. The signal conductors, for example, may be substantially surrounded by conductive structures that can serve as shield members.

Further, the configuration of connector modules and extender modules as described above provides shielding of signal paths through the interconnection system formed by connector modules and extender modules in a first connector and connector modules in a second connector. In some embodiments, minor gaps in shield members or spacing between shield members may be present without materially impacting the effectiveness of this shielding. It may be impractical, for example, in some embodiments, to extend shielding to the surface of a printed circuit board such that there is a gap on the order of 1 mm. Despite such separation or gaps, these configurations may nonetheless be regarded as fully shielded.

Moreover, examples of an extender are module are pictured with an orthogonal configuration. It should be appreciated that, without a 90 degree twist, the extender modules may be used to form a RAM, if the extender module has pins or blades at its second end. Other types of connectors may alternatively be formed with modules with receptacles or mating contacts of other configurations at the second end.

Moreover, the extender modules are illustrated as forming a separable interface with connector modules. Such an interface may include gold plating or plating with some other metal or other material that may prevent oxide formation. Such a configuration, for example, may enable modules identical to those used in a daughtercard connector to be used with the extender modules. However, it is not a requirement that the interface between the connector modules and the extender modules be separable. In some embodiments, for example, mating contacts of either the connector module or extender module may generate sufficient force to scrape oxide from the mating contact and form a hermetic seal when mated. In such an embodiment, gold and other platings might be omitted.

Connectors configured as described herein may provide desirable signal integrity properties across a frequency range of interest. The frequency range of interest may depend on the operating parameters of the system in which such a connector is used, but may generally have an upper limit between about 15 GHz and 50 GHz, such as 25 GHz, 30 or 40 GHz, although higher frequencies or lower frequencies may be of interest in some applications. Some connector designs may have frequency ranges of interest that span only a portion of this range, such as 1 to 10 GHz or 3 to 15 GHz or 5 to 35 GHz.

The operating frequency range for an interconnection system may be determined based on the range of frequencies that can pass through the interconnection with acceptable signal integrity. Signal integrity may be measured in terms of a number of criteria that depend on the application for which an interconnection system is designed. Some of these criteria may relate to the propagation of the signal along a single-ended signal path, a differential signal path, a hollow waveguide, or any other type of signal path. Two examples of such criteria are the attenuation of a signal along a signal path or the reflection of a signal from a signal path.

Other criteria may relate to interaction of multiple distinct signal paths. Such criteria may include, for example, near end cross talk, defined as the portion of a signal injected on one signal path at one end of the interconnection system that is measurable at any other signal path on the same end of the interconnection system. Another such criterion may be far end cross talk, defined as the portion of a signal injected on one signal path at one end of the interconnection system that is measurable at any other signal path on the other end of the interconnection system.

As specific examples, it could be required that signal path attenuation be no more than 3 dB power loss, reflected power ratio be no greater than −20 dB, and individual signal path to signal path crosstalk contributions be no greater than −50 dB. Because these characteristics are frequency dependent, the operating range of an interconnection system is defined as the range of frequencies over which the specified criteria are met.

Designs of an electrical connector are described herein that may provide desirable signal integrity for high frequency signals, such as at frequencies in the GHz range, including up to about 25 GHz or up to about 40 GHz or higher, while maintaining high density, such as with a spacing between adjacent mating contacts on the order of 3 mm or less, including center-to-center spacing between adjacent contacts in a column of between 1 mm and 2.5 mm or between 2 mm and 2.5 mm, for example. Spacing between columns of mating contact portions may be similar, although there is no requirement that the spacing between all mating contacts in a connector be the same.

Accordingly, the present disclosure is not limited to the details of construction or the arrangements of components set forth in the following description and/or the drawings. Various embodiments are provided solely for purposes of illustration, and the concepts described herein are capable of being practiced or carried out in other ways. Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. A cable assembly, comprising:
  a cable comprising two conductive elements; and
  a cable termination component, comprising:
    a pair of signal conductors, the signal conductors having flat contact tails comprising broadsides and edges joining the broadsides, wherein:
      the signal conductors are held with the flat contact tails in an edge-to-edge configuration, with a first edge of a first signal conductor of the pair facing a second edge of a second signal conductor of the pair, and
      the two conductive elements of the cable are each attached to a respective edge of the first and second edges.

2. The cable assembly of claim 1, wherein the two conductive elements of the cable are attached to the first and second edges by welding.

3. The cable assembly of claim 1, wherein an edge of a contact tail of a signal conductor with a conductive element of the cable attached has a termination thickness, the termination thickness being no more than 10% greater than a thickness of the edge of the contact tail of the signal conductor without the conductive element of the cable attached.

4. The cable assembly of claim 1, wherein:
  each of the pair of signal conductors has a mating contact portion and an intermediate portion extending between the contact tail and the mating contact portion;
  the contact tails of the pair of signal conductors are separated by a first distance; and
  the mating contact portions of the pair of signal conductors are separated by a second distance, the second distance being smaller than the first distance such that a separation at an attachment location differs from the first distance by no more than 10%.

5. The cable assembly of claim 1, wherein a separation between attachment locations of the two conductive elements of the cable to the pair of signal conductors is configured to yield an impedance matching an impedance of the cable.

6. The cable assembly of claim 1, wherein:
  the two conductive elements of the cable are joined with the first and second edges, respectively, at fillet joints.

7. The cable assembly of claim 6, wherein:
  the fillet joints are formed by running a laser along the edges.

8. The cable assembly of claim 1, wherein:
  the pair of signal conductors of the cable termination component comprises mating contact portions opposite the contact tails.

9. The cable assembly of claim 8, wherein:
  the mating contact portions of the pair of signal conductors of the cable termination component are shaped as pins.

10. The cable assembly of claim 9, wherein:
  the mating contact portions of the pair of signal conductors of the cable termination component are formed by rolling metal sheets.

11. The cable assembly of claim 8, wherein:
  the mating contact portions of the pair of signal conductors of the cable termination component comprise receptacles.

12. The cable assembly of claim 1, comprising:
  a shield surrounding the cable termination component, wherein:
  the cable is a twin-ax cable comprising a shield surrounding the two conductive elements, and
  the shield of the cable is coupled to the shield surrounding the cable termination component.

13. A cable assembly in an electronic system, wherein:
  the electronic system comprises:
    a printed circuit board comprising an edge and a second location spaced from the edge;
    the cable assembly, comprising:
      a plurality of cables, each of the plurality of cables comprising two conductive elements, and each of the two conductive elements comprising a first end extending to a second end; and
      a connector, wherein:
        the connector is mounted to the printed circuit board adjacent the edge,
        the connector comprises a plurality of pairs of signal conductors spaced from each other, the signal conductors of the plurality of pairs having contact tails in an edge-to-edge configuration comprising a flat portion with broadsides and edges joining the broadsides
        the first ends of the two conductive elements of each of the plurality of cables are each selectively attached to an edge of a respective contact tail of a pair of signal conductors of the plurality of pairs of signal conductors, and the second ends of the two conductive elements of each of the plurality of cables are coupled to the printed circuit board at the second location.

14. The cable assembly of claim 13, wherein the two conductive elements of the plurality of cables are attached to the respective edges of the contact tails at welds.

15. The cable assembly of claim 13, comprising:
a plurality of contact tails configured for mounting to the printed circuit board.

16. The cable assembly of claim 15, wherein:
the plurality of contact tails are disposed in columns,
the contact tails in a same column are spaced from each other between 1 mm and 2.5 mmm, and
the connector operates over frequencies between at least 15 GHz and 50 GHz.

17. The cable assembly of claim 13, wherein:
the contact tails of a pair of signal conductors of the plurality of pairs of signal conductors are aligned edge-to-edge.

18. The cable assembly of claim 17, wherein:
the printed circuit board is a first printed circuit board;
the electronic system further comprises:
a second printed circuit board; and
a second connector mated with the first connector and mounted to the second printed circuit board, wherein the second printed circuit board is orthogonal to the first printed circuit board.

19. The cable assembly of claim 13, wherein:
the connector is a first connector;
the electronic system further comprises a second connector mounted to the printed circuit at the second location; and
the second ends of the two conductive elements of each of the plurality of cables are coupled to the printed circuit board via the second connector.

20. The cable assembly of claim 19, wherein:
the second connector is separated from the first connector by at least 6 inches.

* * * * *

UNITED STATES PATENT AND TRADEMARK OFFICE
CERTIFICATE OF CORRECTION

| | | |
|---|---|---|
| PATENT NO. | : 10,944,214 B2 | Page 1 of 1 |
| APPLICATION NO. | : 16/054831 | |
| DATED | : March 9, 2021 | |
| INVENTOR(S) | : Mark W. Gailus et al. | |

It is certified that error appears in the above-identified patent and that said Letters Patent is hereby corrected as shown below:

In the Claims

At Column 34, Claim 13, Line 62:
"and edges joining the broadsides"
Should read:
"and edges joining the broadsides,"

At Column 35, Claim 16, Line 13:
"other between 1 mm and 2.5 mmm, and"
Should read:
"other between 1 mm and 2.5 mm, and"

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*